United States Patent [19]

Wilson

[11] 4,194,185
[45] Mar. 18, 1980

[54] DIGITIZING A RECURRING ANALOG SIGNAL

[75] Inventor: David W. Wilson, San Jose, Calif.

[73] Assignee: Gould, Inc., Cleveland, Ohio

[21] Appl. No.: 881,060

[22] Filed: Feb. 24, 1978

[51] Int. Cl.² .......................................... H03K 13/04
[52] U.S. Cl. .............................. 340/347 AD; 364/487
[58] Field of Search ............ 340/347 AD, 146.3 MA; 364/487

[56] References Cited

U.S. PATENT DOCUMENTS 3,634,856  1/1972  Karisson ...................... 340/347 AD
3,936,800  2/1976  Ejiri et al. .................. 340/146.3 MA
4,091,379  5/1978  Wu et al. ..................... 364/487

Primary Examiner—Errol A. Krass
Attorney, Agent, or Firm—Limbach, Limbach & Sutton

[57] ABSTRACT

A recurring analog signal is digitized by repeatedly comparing it to a reference level, or to several reference levels, during each signal occurrence to determine where the signal has a value related to each reference level. The reference level, or levels, are changed between signal occurrences but remain constant during each occurrence. Digitization is completed after several occurrences of the signal have been analyzed in this manner.

13 Claims, 6 Drawing Figures

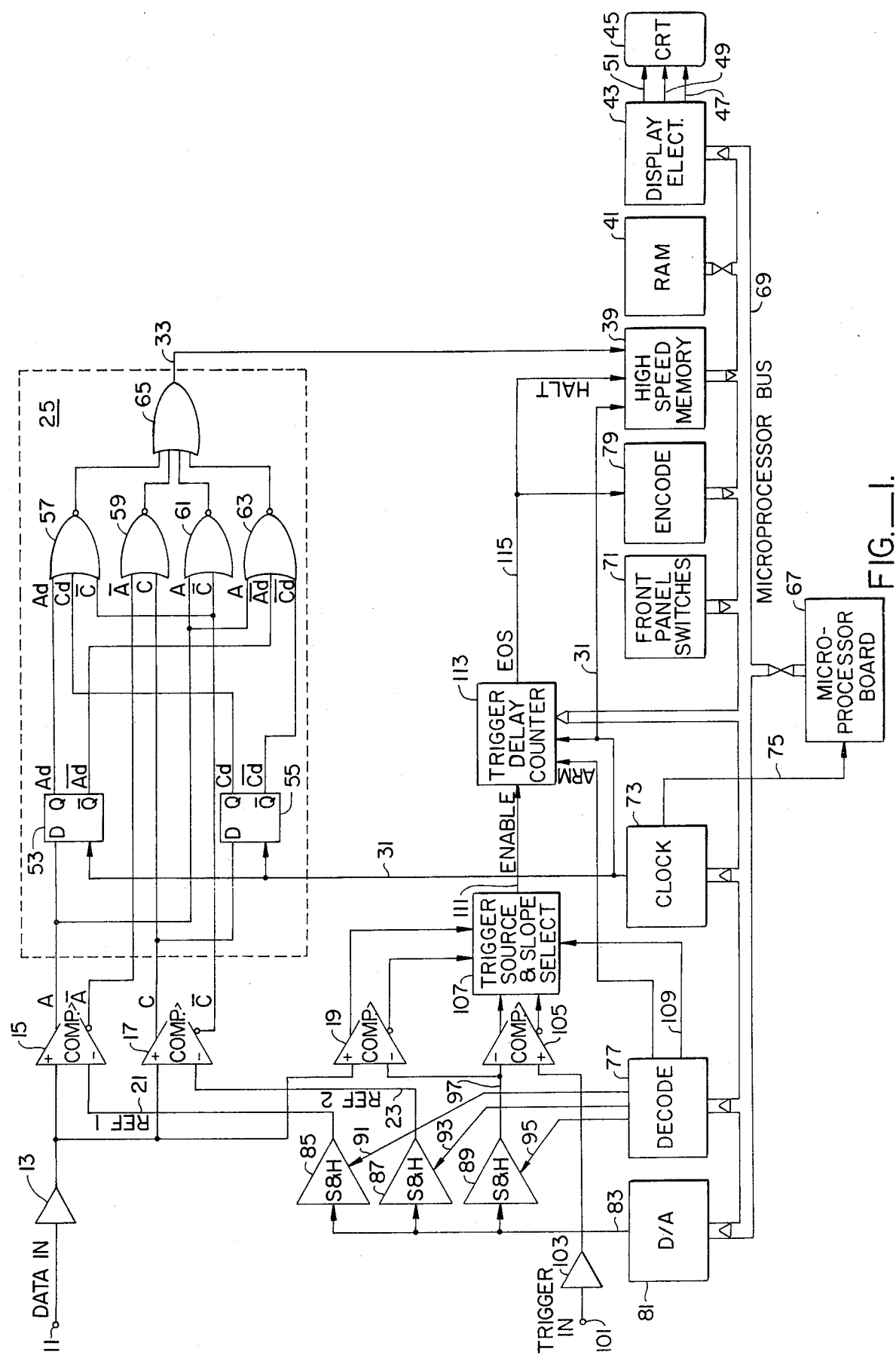
FIG.—1.

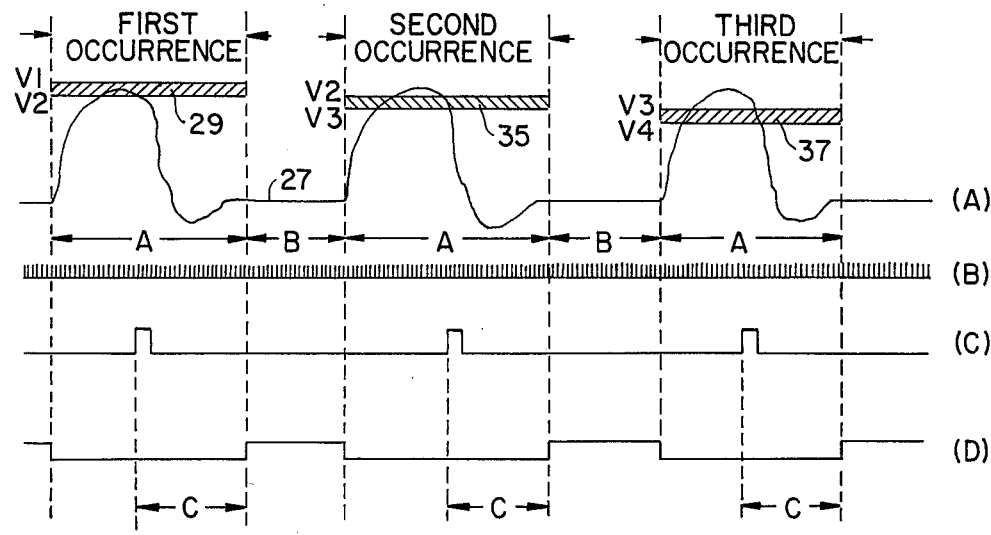
FIG._2.
FIG._3.
FIG._4.

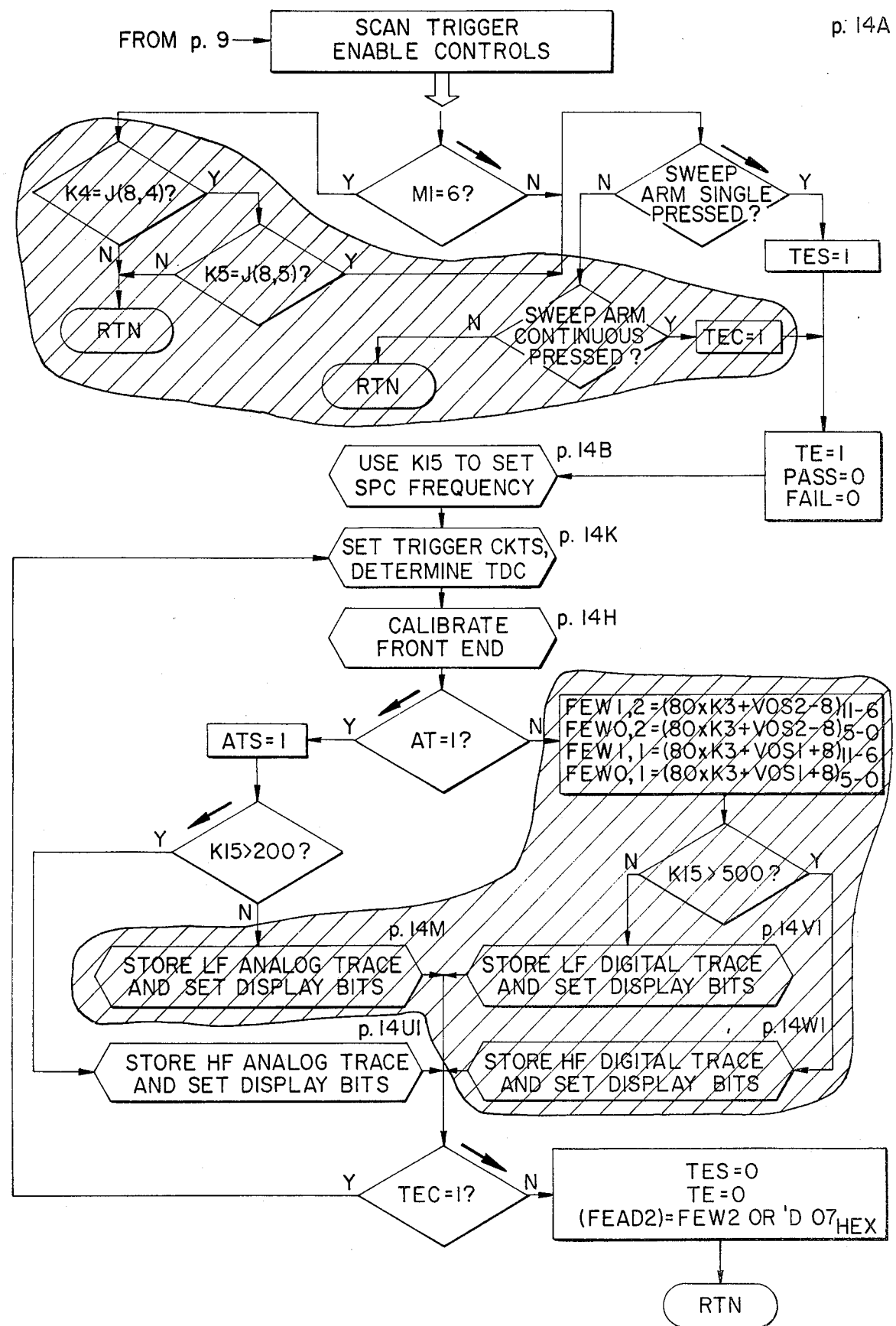
FIG._5.

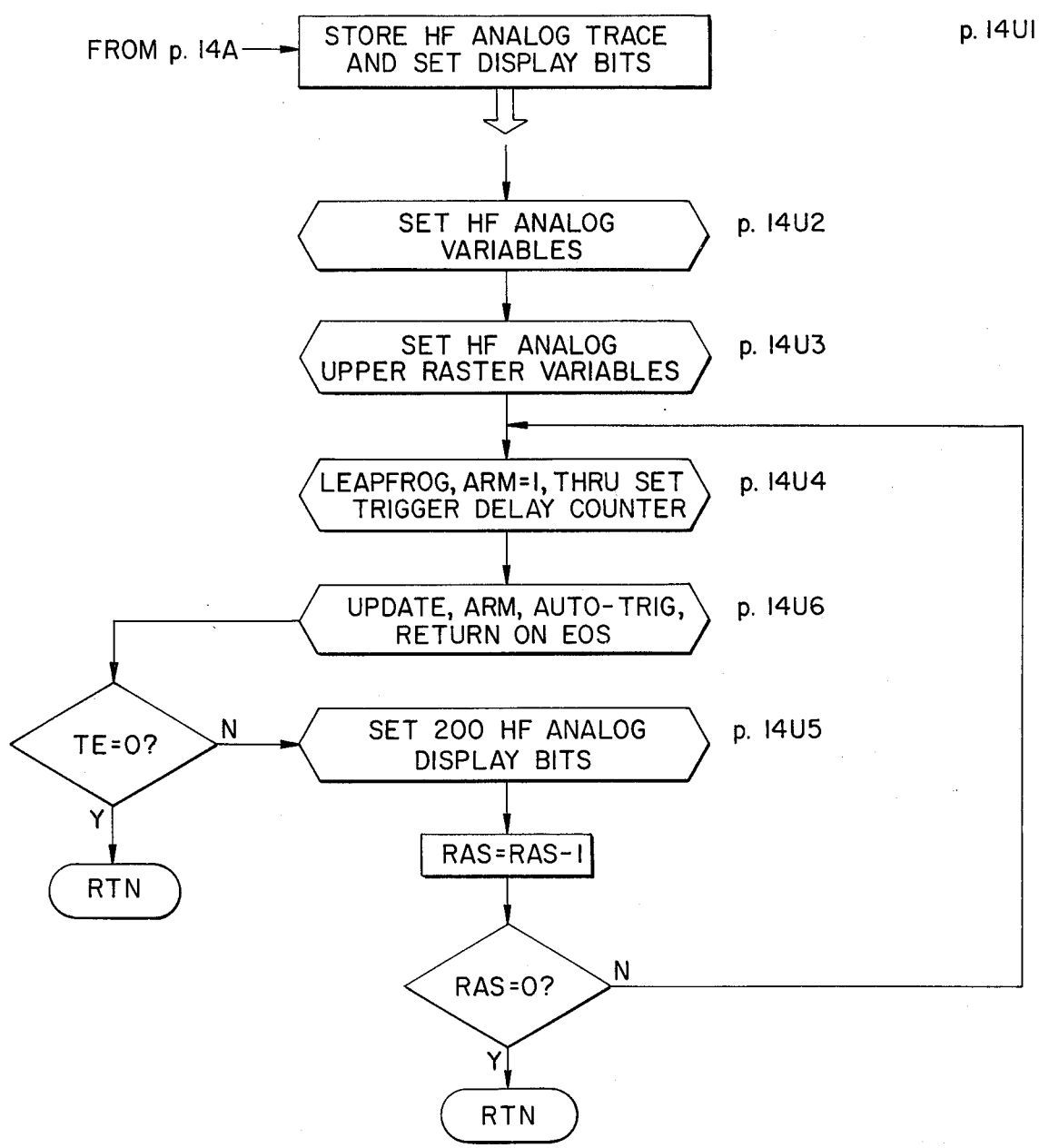
FIG._6.

DIGITIZING A RECURRING ANALOG SIGNAL

BACKGROUND OF THE INVENTION

This invention relates generally to analog-to-digital converters, and particularly to techniques for digitizing a recurring analog signal containing high frequency components.

Various circuit arrangements presently used in sampling oscilloscopes can determine the amplitude of many points on a high frequency analog signal. One disadvantage of these methods is that only one sample is obtained for each repeat of the signal. If a large number of samples is required, the total time involved may be unacceptably long.

Various circuit arrangements, known as analog-to-digital flash converters, have been used to digitize high frequency waveforms in a single occurrence of the signal. One disadvantage of these methods is that a large number of comparators, divider components, and logic circuits are required. If the amplitude of each sample of the analog signal is to be determined to one part in 32, for example, than 32 high speed comparators are needed. The circuit becomes complex and expensive.

Various circuit arrangements known as successive approximation analog-to-digital converters have been used to digitize moderate frequency waveforms. One disadvantage of these methods is that the digitization rate is comparatively slow.

A principal object of this invention is to provide high sampling rate digitization of a repetitive analog signal with reduced complexity and expense and without the above mentioned disadvantages of existing methods.

SUMMARY OF THE INVENTION

Briefly, this and additional objects of the present invention are accomplished by a method of converting a repetitive analog signal into a digital signal wherein each occurrence of the analog signal is compared with one or more distinct reference voltage levels. The analog signal is so compared at distinct intervals throughout its occurrence and one or more digital bits of information is recorded at each comparision as to the value of the analog signal with respect to the reference level or levels. This is repeated for a number of successive occurrences of the analog signal until the reference voltages used have scanned the full voltage range of the analog signal. The digital bits of data so obtained can be used for any purpose, including the reconstruction of the analog signal on an oscilloscope. This technique can be implemented by an electronic circuit having only one or two comparators for comparing the analog signal to the reference voltages. Additional comparators may be used to reduce the total conversion time but at the expense of additional comparators and high speed memory capacity.

Additional objects, advantages and features of the various aspects of the present invention will become apparent from the following description of its preferred embodiments which should be taken in conjunction with the accompanying drawings.

BRIEF DESCRIPTION OF THE DRAWINGS

FIG. 1 is a circuit diagram of a preferred embodiment of the present invention;

FIG. 2 is a timing diagram showing waveforms at various points in the circuit of FIG. 1;

FIG. 3 illustrates data stored in a memory of the circuit of FIG. 1;

FIG. 4 illustrates the processing in a memory of another embodiment of the present invention which utilizes a modified version of the circuit of FIG. 1; and FIGS. 5 and 6 are software flow diagrams for the microprocessor control of the embodiment of FIGS. 1-3.

DESCRIPTION OF THE PREFERRED EMBODIMENTS

Referring initially to FIG. 1, a particular circuit implementation of the preferred embodiment of the present invention will be described. A terminal 11 receives, with respect to some common potential, a repetitive analog signal that is desired to be digitized. An example of such a signal used to explain the operation of the circuit hereinafter is shown in FIG. 2(A). The terminal 11 is connected to the input of a unity gain amplifier 13 whose output is connected to non-inverting inputs of comparators 15, 17 and 19. The comparators 15 and 17 are utilized to compare the voltage reference levels with the analog input signal at the terminal 11 as a first step in the digitization process. The comparator 15 receives a reference voltage "REF 1" through a line 21 connected to its inverting input. Similarly, the comparator 17 has a refernce voltage "REF 2" applied through a line 23 to its inverting input. Output levels A and $\overline{A}$ of the comparator 15 are applied to a dot logic circuit 25. Similarly, output levels C and $\overline{C}$ of the comparator 17 are applied to the dot generator 25.

The operation of this portion of the circuit of FIG. 1 can best be seen by reference to FIG. 2(A). During a first occurrence of the repetitive analog signal 27, it is compared with a reference voltage window 29 that extends between voltage levels V1 and V2. The voltage V1 is one of the reference voltages in the lines 21 and 23 of FIG. 1 and V2 is the reference voltage in the other of those lines. The dot generating circuit 25 receives a clock signal represented in FIG. 2(B) through a clock signal line 31 of FIG. 1. At each clock pulse in the line 31, a "0" or "1" digital bit appears at an output line 33 of the circuit 25 depending upon whether at that clock time the analog signal 27 is within or without the voltage window 29. For this example, a digital bit "1" signifies that the analog signal 27 is within the reference voltage window and the digital bit "0" indicates that it is without the window at that clock time. The circuit 25 has the further logic capability of having an output of a digital "1" at the output line 33 when the analog signal 27 has passed through the window since the last clock pulse, even though it does not exist in the window simultaneously with the current clock pulse. This latter feature avoids any errors that might occur from the analog signal 27 passing through the window between clock pulses, and thus which might normally be undetected.

Referring to FIG. 2(A), a reference voltage window 35 is established during a subsequent occurrence of the analog signal 27 and that occurrence is similarly sampled through the use of the clock pulses to develop at the line 33 a series of digital bits, as discussed before. The window 35 extends between voltage ranges immediately below that of the prior window 29. The window 35 is formed by changing the voltage reference level V1 that existed on one of the lines 21 and 23 during the first occurrence, to a voltage level V3 during the second occurrence. Similarly, on the third occurrence, the voltage level V2 on one of the lines 21 and 23 is changed to a voltage level V4 to form a third window 37 that is immediately below the level 35.

This process of "leap frogging" the reference voltages in the lines 21 and 23 between successive occurrences continues until the full voltage range of interest of the analog signal 27 has been covered. The sampling occurring at each occurrence of the analog signal 27 produces a string of digital bits that are first stored in a high speed memory 39 directly from the line 33. In the time interval between the occurrences of the analog signal 27, in the particular example being described, this string of data is moved from the high speed memory 39 to a random access memory 41, thus emptying the memory 39 to receive another string of digital bits resulting from the comparison process during the next occurrence of the analog signal 27. Each string of samples is so stored in the memory 41 until, after the analog signal 27 has been completely traversed by reference voltage windows, the memory 41 contains all of the bits in a pattern illustrated in FIG. 3. FIG. 3 is a simplified diagram. In the preferred embodiment, there are 200 bits horizontally and 39 bits vertically. By way of explanation, the top row 29' of bits was obtained during the first occurrence illustrated in FIG. 2(A) by comparing the analog signal 27 with the reference window 29. Similarly, the row 35' of bits was obtained during the second occurrence with the use of the reference window 35, and so forth. It will be noted that the pattern of digital "1's" in FIG. 3 follows the analog waveform of the signal 27. This pattern is used by display electronics 43 to drive a cathode ray tube 45 to reconstruct the waveform of the analog signal 27 from the digital data stored in the memory 41. The cathode ray tube 45 is scanned in a raster pattern by vertical and horizontal scanning signals, respectively, in lines 47 and 49. The intensity of the beam is modulated through a line 51 in a manner that the beam is permitted to become bright in response to a digital "1" being read out of the memory 41. Thus, as the information pattern of FIG. 3 is read out of the memory 41 in a line by line manner in synchronization with the raster scanning of the electron beam of the cathode ray tube 45, the analog waveform 27 is reconstructed on the face of the cathode ray tube. This has been done without the need for the usual digital to analog converter.

In a particular example, the analog signal 27 is scanned in the "leap frog" manner described previously with a reference voltage from the top of the signal to its lower voltage extreme in thirty-nine increments, the reference windows do not need to move continuously from one extreme to the other of the analog signal 27 but rather the windows could move in some other pattern. A clock frequency in the line 31, and as illustrated in FIG. 2(B), could be 100 MHz, as an example. If the time duration of each occurrence of the analog signal 27 is ten micro-seconds, then 1000 samples would be taken during each occurrence. The high speed memory 39 may conveniently have a capacity of 1024 bits. Of course, the techniques being described herein may be applied to a wide variety of specific parameters and situations.

The analog signal 27 will normally repeat itself enough times without changing to complete the conversion. But another advantage of this window technique applies to signals varying from one occurrence to another. All various waveforms present will be shown in their true form in proportion to their relative frequency of occurrence. Other existing techniques show only one of multiple waveforms present or some composite waveform that does not represent any of the analog signals present.

The dot generator 25 of FIG. 1 contains logic elements in the form of two flip-flops 53 and 55, inverting OR gates 57, 59, 61 and 63, and an OR gate 65. The outputs A and C of the comparators 15 and 17, respectively, drive the flip-flops 53 and 55. All four output signals from the comparators 15 and 17, and the outputs of the flip-flops 53 and 55, are combined in the inverting OR gates 57–63. The outputs of these OR gates are, in turn, combined in an OR gate 65 whose output in the line 33. The line 33 gives the resulting signal described hereinbefore.

As is typically being done in modern circuit design, a microprocessor board 67 is utilized in place of hard wired electronic components in order to provide flexability and a reduced number of components with a resulting reduction in cost. The microprocessor board 67 contains a microprocessor and associated memory elements containing controlling programs. The microprocessor communicates with other circuit elements through a microprocessor bus 69. One of the functions accomplished by the microprocessor is to transfer a string of data bits from the high speed memory 39 to the random access memory 41. The microprocessor can at the same time do any processing that is necessary of the data, such as expanding or contracting the number of bits in the high speed memory 39 to fit the matrix of FIG. 3 that is desired to be formed in the memory 41. The display electronics 43, accesses the memory 41 to produce the X, Y and Z signals in the lines 47, 49 and 51.

Many other circuits are connected directly to the microprocessor bus 69. Front panel switches 71 are so connected and the programmed microprocessor periodically examines the state of these switches to see if an operator is calling for any particular function of the apparatus to be performed. A system clock oscillator 73 is operated from the bus 69 and also provides the microprocessor board 67 with a clock signal through a line 75. Decoding circuits 77 provide certain controlling signals to other circuit elements, to be described hereinafter. Similarly, encoding circuits 79 convert at least one signal into an appropriate digital code for communication with the microprocessor over the bus 69.

A digital to analog converter 81 is also connected to the bus 69 and provides at an output line 83 analog voltage levels that are responsive to particular digital codes communicated to it by the microprocessor 67 on the bus 69. These voltages bevels are applied to three different sample and hold circuits 85, 87 and 89. Outputs of the two sample and hold circuits 85 and 87 provide the reference voltages simultaneously in the lines 21 and 23 which, are described above, are utilized to establish the voltage windows for digitizing the analog signal 27. The sample and hold circuits are actuated by control lines 91, 93 and 95 from the decoding circuit 77. The combination of the digital to analog converter 81 and the sample and hold circuits permits three reference voltage levels to be controlled by the microprocessor, the two in the lines 21 and 23, and another in a line 97, with the use of a single digital to analog converter. Such converters are expensive so this arrangement has the advantage of reducing the cost of the apparatus. When the microprocessor 67 wants to set a particular voltage on one of the lines 21, 23 or 97, it places a digital code for that voltage on the bus 69 and the digital to analog converter 81 generates that voltage in the line 83. The microprocessor then submits a signal in the bus 69 appropriate to be decoded by the circuit 77 to enable the appropriate sample and hold circuits 85, 87 or 89 so that this voltage in the line 83 will then appear at its output. That is how the reference voltages "REF 1" and "REF 2" are manipulated in the manner described earlier with respect to FIG. 2(A).

Synchronization "trigger" pulses are utilized in order to make the various functions that have been described occur in an orderly fashion. The circuit illustrated in FIG. 1 has a capability of being synchronized to an external trigger signal applied to a terminal 101, or to an internally generated trigger signal developed by the comparator 19 from the analog signal 27. The external trigger is applied through a unity gain amplifier 103 to a noninverting input of a comparator 105. The inverting inputs of both the internal trigger comparator 19 and the external trigger comparator 105 are connected to the line 97 which is the output of the third sample and hold circuit 89. The voltage set in the line 97, under microprocessor control as described previously, determines the threshold voltage for detecting when a trigger signal occurs.

The inverting and non-inverting outputs of the internal trigger comparator 19 and external trigger comparator 105 are applied to a trigger source and slope selecting circuit 107 which is controlled by signals through a line 109 from the decoding circuit 77. The circuit 107 selects either the external trigger or the internal trigger by connection to the appropriate comparator 105 or 19, respectively. It also selects whether an enable signal in the line 111 will be initiated on a positive going or negative going slope of either the external trigger pulse or the analog signal 27, depending upon which is selected as the trigger source. The signal in the line 111 enables a trigger delay counter 113 to increment in response to a clock signal in the line 31. An overflow of the counter 113 is communicated through a line 115 as a "EOS" signal to both the high speed memory 39 and the encoding circuitry 79 for communication through the bus 69 to the microprocessor 67. The purpose of the counter 113 is to set the duration A of the occurrences of the analog signal 27 that is examined, as illustrated in FIG. 2.

To explain the operation of the triggering circuit, an external trigger pulse train is illustrated in FIG. 2(C). This is the signal that is applied to the terminal 101 of FIG. 1. Such a trigger signal is available in many types of circuits along with the analog signal 27. This is particularly true when the techniques of the present invention are utilized to examine analog signals occurring in logic circuits of various types in the course of troubleshooting such circuits. Logic circuits usually will have a synchronizing trigger pulse, such as that shown in FIG. 2(C), which is in synchronism with the occurrences of the analog signal 27. The pulses of FIG. 2(D) represent the "EOS" signal in the line 115 and is set in time a distance C from the trigger pulse through the delay of the counter 113. That delay is set upon command of the microprocessor through its bus 69 which is connected to the counter 113. The microprocessor presets the counter at a certain number so that when it is enabled with the pulse in the line 111 at the occurrence of a trigger pulse at the terminal 101, the counter will have a set number of clock pulses 31 to run before the overflow "EOS" signal in the line 115 is emitted.

The high speed memory 39 is of a type which, when clocked, stores the last 1024 bits of information given it through the line 33. When it is full, new incoming bits of information replace the oldest bits remaining in the memory 39. In order to stop this process in the memory, it responds to the "EOS" signal in the line 115 to freeze the data therein for a time. Once stopped, the memory 39 will receive no further information from the line 33 until those frozen bits of information are transferred from the memory 39 to the random access memory 41, as previously described. This transfer occurs during the interval B between occurrences of the analog signal 27, as shown in FIG. 2(A). If the interval B is not long enough to permit this data transfer to be completed, one or more occurrences of the analog signal will be skipped. This operation of the high speed memory 39 sets the occurrence duration A of FIG. 2(A) to a maximum of the capacity of the memory, herein being described to be 1024 bits. The duration A of the analog signal occurrence being examined can be altered by changing the sampling frequency (clock signal 31) or by changing the number of data bits utilized from the high speed memory 39.

It is preferred to compare each occurrence of the analog signal 27 with only a single window. The duration for converting that signal to a digital one is not prohibitively long if the analog signal is of a high frequency. The advantage is a reduced hardware complexity in cost since only two comparators 15 and 17 are required for this process. Of course, if the speed is desired to be increased, additional comparators, dot generation circuits and high speed memory could be employed to analyze a plurality of windows at each occurrence of the analog signal. The particular trade off between speed and hardware cost depends upon the particular application but still provides advantages over the prior art techniques.

An even simpler hardware scheme may be had by eliminating one of the comparators 15 or 17, and eliminating the dot generator 25. That is, one of the comparators 15 or 17 could be connected directly to the high speed memory 39 through the line 33, according to this alternate embodiment. The bits of information stored in the memory 39 would be of one state, say the digital bit "1", when the analog signal 27 was below the threshold set on the single comparator. Conversely, the bit that would be recorded for a given clock pulse could be a "0" if the analog signal were greater than the threshold at a particular instant.

This alternate technique would provide a plurality of digital words which, in a conventional sense, could be applied to a digital to analog converter and from there directly to a standard cathode ray tube oscilloscope. The way this is done is illustrated in FIG. 4 wherein a first row of numbers 121 represents a maximum standardized value of the analog signal 27. The number forty is utilized in FIG. 4 as a convenient number for when there are thirty-nine different voltage thresholds set on the single comparator and the data is obtained over a corresponding thirty-nine occurrences of the analog signal.

A second row 123 of numbers represents the bits of information inputted to the memory 39 upon the first occurrence of the analog signal. What the microprocessor 67 does when it transfers this data into the memory 41 is to subtract one from the initial value forty for each place that a digital "1" occurs. This results in a third line 125 of numbers resulting from this intermediate step. A fourth line 127 represents data obtained during the second occurrence of the analog signal 27 in the line of numbers 129 of FIG. 4 gives a resulting intermediate set of numbers which is stored in the memory 41. This process continues through all thirty-nine, or other number, of occurrences until a set of numbers 131 representing in digital form the value of the analog signal 27 remain in the memory 41. These digital words can then be displayed through a digital to analog converter in a conventional manner. This alternate technique has the advantage of requiring a memory 41 of much less capacity than in the preferred embodiment described earlier in detail.

The software controlling the microprocessor 67 in the preferred embodiment described earlier with respect to FIGS. 1-3 is shown in FIGS. 5 and 6, with the actual controlling program coding being attached to this application as an Appendix. Since the techniques described herein form only a part of an actual instrument that has been designed to do many other functions as well, the program of the attached Appendix includes instructions in addition to those which are required to carry out the techniques of the present invention. Therefore, the flow chart of FIG. 5, from which the program coding has been made, has been reproduced to include portions which are not necessary to practice the present invention, as well as those portions which are used in practicing the invention. The unnecessary portions of FIG. 5 are overlayed with cross-hatching.

When the circuits are not being utilized to perform a test, the microprocessor is programmed to be in a mode to sequentially interrogate the various front panel switches 71 to see if some function or command is initiated by an operator of the instrument. If a trigger control switch is operated, the microprocessor then goes through the routines illustrated by the software flow charts of FIGS. 5 and 6. The notations and terminology of the flow chart are the same as and keyed to that on the program listings themselves attached hereto as an Appendix. The functions of block 14U1 of FIG. 5 are shown in expanded form in the flow chart of FIG. 6. The functions illustrated in FIG. 6 pertain to the technique of comparing the analog signal 27 to reference voltage windows, as described with respect to the circuit of FIG. 1 and the waveforms of FIG. 2(A).

Although the various aspects of the present invention have been described with respect to its preferred embodiments, it will be understood that the invention is entitled to protection within the full scope of the appended claims.

APPENDIX

© 1978 Gould Inc.

```
00001              NAM     FOA
00002              OPT     REL, CREF, LLEN=80
00003              TTL     DTO EQUATES
00004              IDNT    JAN. 1, 1978

00006              ***************************************************
00007              ***************************************************
00008              **                                               **
00009              ** BIOMATION 1100-D DIGITAL TESTING OSCILLOSCOPE **
00010              **                                               **
00011              ** PROGRAM COMPLETED 1977                        **
00012              **    BY WILLIAM SHOEMAKER (FLOW DIAGRAMS)       **
00013              **    FRED DELVEY, AND                           **
00014              **    ROBERT A. MICHAEL (M6800 CODE)             **
00015              **                                               **
00016              ***************************************************
00017              ***************************************************

00019              XDEF    BATDA, BASS, BADS, BADD, BATT, BAAD
00020              XDEF    PBAADL, PBAADM, BATTMS, BATTLS
00021              XDEF    FEAD0, FEAD8
00022              XDEF    SR1, SR2, SR3, SR4, LR1, LR2, LRMS, ROMEND, ROM0, ST
00023              XDEF    TWRITE, RESET, RUN, STOP
00024              XDEF    SETRW, CLRRW, SETFR, CLRFR
00025              XDEF    TREAD, TSTAT
00026              XDEF    PASS, FAIL, TES, TEC
00027              XDEF    AT, TSLP, TSLN
00028              XDEF    ATS, FAS, TE, FEOS, NEGRES, LFROG, K1
00029              XDEF    TDF, P, M, ASBF, ASBT, NX, FTT
00030              XDEF    XDAC1, XDAC2, XDAC3, XDAC4, XDAC5
00031              XDEF    XDAC6, XDAC7, XDAC8, XDAC9, XDAC11
00032              XDEF    OXDAC
00033              XDEF    UNBL1, UNBL2, UNBL3, UNBL4, UNBL5
00034              XDEF    UNBL6, UNBL7, UNBL8, UNBL9, UNBL11
00035              XDEF    OUNBL
00036              XDEF    BL1, BL2, BL3, BL4, BL5
```

```
00037                    XDEF    BL6, BL7, BL8, BL9, BL11
00038                    XDEF    OBL
00039                    XDEF    BLSP1, BLSP2, BLSP3, BLSP4, BLSP5
00040                    XDEF    BLSP6, BLSP7, BLSP8, BLSP9, BLSP11
00041                    XDEF    OBLSP
00042                    XDEF    BWDD1, BWDD2, BWDD3, BWDD4, BWDD5
00043                    XDEF    BWDD6, BWDD7, BWDD8, BWDD9
00044                    XDEF    OBWDD
00045                    XDEF    BWAD
00046                    XDEF    DW1, DW2, DW3, DW4, DW5
00047                    XDEF    DW6, DW7, DW8, MDW
00048                    XDEF    JL1OFS, JL2OFS, JL3OFS, JL4OFS, JL5OFS
00049                    XDEF    JL6OFS, JL7OFS, JL8OFS, JL9OFS
00050                    XDEF    CONF, FIRG, FTOK, TERR, REW, NCF
00051                    XDEF    READY, WBEMP, IRG, INCCHR, BOT, RBFULL
00052                    XDEF    AUX, GENPLY
00053                    XDEF    CAR, NEWAL, PFF, PCL, REDO
00055           *
00056           * FRONT END ADDRESSES
00057           *
00058           * NOTE:  FEAD1-FEAD7 ARE ADDRESSED AS OFFSETS
00059           *        TO FEAD0, AND FEAD9-FEAD15 ARE ADDRESSED AS
00060           *        OFFSETS TO FEAD8.
00061           *
00062           *    EG:  STA A FEAD0+2 (FEAD2) _ A
00063           *         LDA A FEAD8+4 A _ (FEAD12)
00064           *
00065    6000 A FEAD0   EQU    $6000        FRONT END BASE ADDRESS
00066    6000 A FEAD8   EQU    FEAD0

00068           *
00069           * FRONT PANEL (SWITCHES AND LEDS) ADDRESSES
00070           *
00071    4000 A SR1     EQU    $4000        SWITCH REGISTER 1
00072    4001 A SR2     EQU    $4001        SWITCH REGISTER 2
00073    4002 A SR3     EQU    $4002        SWITCH REGISTER 3
00074    4003 A SR4     EQU    $4003        SWITCH REGISTER 4

00076    4001 A LR1     EQU    $4001        LED REGISTER 1
00077    4002 A LR2     EQU    $4002        LED REGISTER 2

00079           *
00080           * TAPE WRITE ADDRESSES
00081           *
00082    C000 A TWRITE  EQU    $C000        WRITE BUFFER
00083    C001 A RESET   EQU    $C001        RESET
00084    C002 A RUN     EQU    $C002        INITIATE TAPE MOTION
00085    C003 A STOP    EQU    $C003        HALT TAPE
00086    C004 A SETRW   EQU    $C004        SET TO READ FROM TAPE
00087    C005 A CLRRW   EQU    $C005        SET TO WRITE TO TAPE
00088    C006 A SETFR   EQU    $C006        SET FOR FORWARD MOTION
00089    C007 A CLRFR   EQU    $C007        SET FOR REVERSE MOTION

00091           *
00092           * TAPE READ ADDRESSES
00093           *
00094    C001 A TREAD   EQU    $C001        TAPE READ BUFFER
00095    C002 A TSTAT   EQU    $C002        TAPE STATUS REGISTER

00097           *
00098           * BITS IN TSTAT
00099           *
00100    0004 A READY   EQU    4
00101    0008 A WBEMP   EQU    8
00102    0010 A IRG     EQU    16
00103    0020 A INCCHR  EQU    32
00104    0040 A BOT     EQU    64
00105    0080 A RBFULL  EQU    128
```

```
0107            *
0108            * LED BITS - LR1
0109            *
0110   0001  A PASS   EQU   1
0111   0002  A FAIL   EQU   2
0112   0004  A TES    EQU   4       TRIGGER ENABLE SINGLE
0113   0008  A TEC    EQU   8       TRIGGER ENABLE CONTINUOUS
0114         *        EQU   16      NOT USED
0115   0020  A AT     EQU   32      ANALOG TRACE
0116   0040  A TSLP   EQU   64      TRIGGER SLOPE POSITIVE (= K6)
0117   0080  A TSLN   EQU   128     TRIGGER SLOPE NEGATIVE (= 1-K6)

0119            *
0120            * ROM ADDRESS DEFINITIONS FOR DIAGNOSTIC POWER
0121            *    UP ROUTINES.
0122            *
0123   B800  A STLROM EQU  $B800    START OF LAST ROM
0124   00B8  A LRMS   EQU  STLROM/256 MSB OF LAST ROM ADDRESS
0125   8800  A ROM0   EQU  $8800    ADDRESS OF FIRST ROM
0126   C000  A ROMEND EQU  $C000    FIRST ADDRESS AFTER LAST ROM
0128            *
0129            * FLAG BITS - FR1
0130            *
0131   0001  A ATS    EQU   1       ANALOG TRACE, STORED
0132   0002  A FAS    EQU   2       FREQUENCY ALIGN, STORED
0133   0004  A TE     EQU   4       TRIGGER ENABLE
0134         *        EQU   8       NOT USED
0135   0010  A FEOS   EQU   16      END OF SAMPLING
0136   0020  A NEGRES EQU   32      NEGATIVE RESULT (MATH ONLY)
0137   0040  A LFROG  EQU   64      LEAP FROG (ASK BILL!)
0138   0080  A K1     EQU   128
0139            *
0140            * FLAG BITS - FR2
0141            *
0142   0001  A TDF    EQU   1       TIME DELAY FLAG
0143   0002  A P      EQU   2
0144   0004  A M      EQU   4
0145   0008  A AS2F   EQU   8
0146   0010  A AS2T   EQU   16
0147   0020  A NX     EQU   32
0148   0040  A FTT    EQU   64      FIRST TIME THROUGH
0149   0080  A NCF    EQU   128     NO CHANGE FLAG
0150            *
0151            * FLAG BITS - FR3
0152            *
0153   0001  A FIRG   EQU   1       FLAG - INTER RECORD GAP
0154   0002  A FTOK   EQU   2       FIRST TIME OK
0155   0004  A CONF   EQU   4       CONTINUE FLAG
0156         *        EQU   8       NOT USED
0157   0010  A TERR   EQU   16      TAPE ERROR
0158         *        EQU   32      NOT USED
0159   0040  A REW    EQU   64      REWINDING TAPE
0160         *        EQU   128     NOT USED
0161            *
0162            * FLAG BITS - FR4
0163            *
0164   0001  A CAR    EQU   1       AUTOSCOPE - CARRY
0165   0002  A NEWAL  EQU   2       AUTOSCOPE - NEW ALIGN
0166   0004  A PFF    EQU   4       AUTOSCOPE - PASS/FAIL
0167   0008  A POL    EQU   8       AUTOSCOPE - POLARITY
0168   0010  A REDO   EQU   16      AUTOSCOPE - RE-DO
0169   0020  A AUX    EQU   32      XCRIBE - AUX RAM AVAILABLE
```

```
00171                *
00172                * DTO CONSTANTS
00173                *
00174      0200   A  BATDA    EQU    $200      BEG ADDR, TRACE ATTRIBUTES
00175      0280   A  BATT     EQU    $280      TEMP, ANALOG STORAGE
00176      0002   A  BATTMS   EQU    BATT/256
00177      0080   A  BATTLS   EQU    BATT-(BATT/256)*256
00178      0610   A  BAAD     EQU    $610      ANALOG DISPLAY (100*39/8)
00179      0005   A  PBAADM   EQU    (BAAD-25)/256
00180      00F7   A  PBAADL   EQU    (BAAD-25)-((BAAD-25)/256)*256
00181      09E0   A  BADS     EQU    $9E0      DIGITAL STORAGE, TRACES 1-8
00182      0E40   A  BA9S     EQU    $E40      DIGITAL STORAGE, TRACE 9
00183      0EC0   A  BADD     EQU    $EC0      DIGITAL DISPLAY (10*32)

00185                *
00186                * TRACE DISPLAY ATTRIBUTES VARIABLE LOCATIONS
00187                *
00188      0200   A  XDAC1    EQU    BATDA     XDAC MULTIPLIERS
00189      0205   A  XDAC2    EQU    BATDA+5
00190      020A   A  XDAC3    EQU    BATDA+10
00191      020F   A  XDAC4    EQU    BATDA+15
00192      0214   A  XDAC5    EQU    BATDA+20
00193      0219   A  XDAC6    EQU    BATDA+25
00194      021E   A  XDAC7    EQU    BATDA+30
00195      0228   A  XDAC8    EQU    BATDA+40
00196      0223   A  XDAC9    EQU    BATDA+35
00197      022D   A  XDAC11   EQU    BATDA+45

00199      0000   A  OXDAC    EQU    0         XDAC OFFSET 00201      0201   A  UNBL1    EQU    BATDA+1   UNBLANKING TIMES
00202      0206   A  UNBL2    EQU    BATDA+6
00203      020B   A  UNBL3    EQU    BATDA+11
00204      0210   A  UNBL4    EQU    BATDA+16
00205      0215   A  UNBL5    EQU    BATDA+21
00206      021A   A  UNBL6    EQU    BATDA+26
00207      021F   A  UNBL7    EQU    BATDA+31
00208      0229   A  UNBL8    EQU    BATDA+41
00209      0224   A  UNBL9    EQU    BATDA+36
00210      022E   A  UNBL11   EQU    BATDA+46

00212      0001   A  OUNBL    EQU    UNBL1-XDAC1 UNBL OFFSET 00214      0202   A  BL1      EQU    BATDA+2   BLANKING TIMES
00215      0207   A  BL2      EQU    BATDA+7
00216      020C   A  BL3      EQU    BATDA+12
00217      0211   A  BL4      EQU    BATDA+17
00218      0216   A  BL5      EQU    BATDA+22
00219      021B   A  BL6      EQU    BATDA+27
00220      0220   A  BL7      EQU    BATDA+32
00221      022A   A  BL8      EQU    BATDA+42
00222      0225   A  BL9      EQU    BATDA+37
00223      022F   A  BL11     EQU    BATDA+47

00225      0002   A  OBL      EQU    BL1-XDAC1 BL OFFSET
00227      0203   A  BLSP1    EQU    BATDA+3   BIT LOCATIONS AND
00228      0208   A  BLSP2    EQU    BATDA+8   ... START PAGES
00229      020D   A  BLSP3    EQU    BATDA+13
00230      0212   A  BLSP4    EQU    BATDA+18
00231      0217   A  BLSP5    EQU    BATDA+23
00232      021C   A  BLSP6    EQU    BATDA+28
00233      0221   A  BLSP7    EQU    BATDA+33
00234      022B   A  BLSP8    EQU    BATDA+43
00235      0226   A  BLSP9    EQU    BATDA+38
00236      0230   A  BLSP11   EQU    BATDA+48

00238      0003   A  OBLSP    EQU    BLSP1-XDAC1 BLSP OFFSET 00240      0204   A  BWDD1    EQU    BATDA+4   BEGINNING WORDS,
00241      0209   A  BWDD2    EQU    BATDA+9   ... DIGITAL DISPLAY
```

```
00242       020E  A  BWDD3   EQU    BATDA+14
00243       0213  A  BWDD4   EQU    BATDA+19
00244       0218  A  BWDD5   EQU    BATDA+24
00245       021D  A  BWDD6   EQU    BATDA+29
00246       0222  A  BWDD7   EQU    BATDA+34
00247       022C  A  BWDD8   EQU    BATDA+44
00248       0227  A  BWDD9   EQU    BATDA+39

00250       0004  A  OBWDD   EQU    BWDD1-XDAC1 BWDD OFFSET 00252       0231  A  BWAD    EQU    BATDA+49 BEG WORD, ANALOG DISPLAY 00254       0232  A  DW1     EQU    BATDA+50 DISPLAY WORDS
00255       0236  A  DW2     EQU    4+DW1
00256       023A  A  DW3     EQU    2*4+DW1
00257       023E  A  DW4     EQU    3*4+DW1
00258       0242  A  DW5     EQU    4*4+DW1
00259       0246  A  DW6     EQU    5*4+DW1
00260       024A  A  DW7     EQU    6*4+DW1
00261       024E  A  DW8     EQU    7*4+DW1
00262       024E  A  MDW     EQU    DW8
00264             *
00265             * OFFSETS FOR DIGITAL STORED ATTRIBUTES LOCATIONS
00266             *
00267             * FOR EXAMPLE, J(3,5) WOULD BE ADDRESSED AS FOLLOWS.
00268             *
00269             *         LDX    BADS3     POINT TO TRACE 3 DATA
00270             *         LDA A  JL5OFS,X  GET 1ST BYTE OF J(3,5)
00271             *
00272       007D  A  JL1OFS  EQU    125     TRACE DESCRIPTION CHARACTER
00273       007E  A  JL2OFS  EQU    126     RECORD NUMBER (INT8)
00274       007F  A  JL3OFS  EQU    127     DATA THRESHOLD (INT15*10)
00275       0081  A  JL4OFS  EQU    129     DATA SEC./DIV (PV2)
00276       0083  A  JL5OFS  EQU    131     TRIGGER POSITION (INT15*10)
00277       0085  A  JL6OFS  EQU    133     TRIG SLOPE (#K6=>POS, 0=>NEG)
00278       0086  A  JL7OFS  EQU    134     TRIG THRESHOLD (INT15*10)
00279       0088  A  JL8OFS  EQU    136     TRIGGER SOURCE (INT8)
00280       0089  A  JL9OFS  EQU    137     AUTO COMPARE (INT8*10)

00282             * SEE NOTE ON CRC GENERATION ON FLOW PAGE 4H 00284       0085  A  GENPLY  EQU    $85

00286                        END
TOTAL ERRORS 00000
(

0008 ASBF    00029 00145*
   0010 ASBT    00029 00146*
   0020 AT      00027 00115*
   0001 ATS    00028 00121*
   0020 AUX     00052 00169*
   0E40 BA9S    00019 00182*
   0610 BAAD    00019 00178*00179 00180 00180
   0EC0 BADD    00019 00183*
   09E0 BADS    00019 00181*
   0200 BATDA   00019 00174*00188 00189 00190 00191 00192 00193 00194 00195
                      00196 00197 00201 00202 00203 00204 00205 00206 00207 00208
                      00209 00210 00214 00215 00216 00217 00218 00219 00220 00221
                      00222 00223 00227 00228 00229 00230 00231 00232 00233 00234
                      00235 00236 00240 00241 00242 00243 00244 00245 00246 00247
                      00248 00252 00254
   0280 BATT    00019 00175*00176 00177 00177
   0080 BATTLS  00020 00177*
   0002 BATTMS  00020 00176*
   0202 BL1     00036 00214*00225
   022F BL11    00037 00223*
   0207 BL2     00036 00215*
```

```
D   020C  BL3      00036  00216*
D   0211  BL4      00036  00217*
Y   0216  BL5      00036  00218*
D   021B  BL6      00037  00219*
D   0220  BL7      00037  00220*
D   022A  BL8      00037  00221*
D   0225  BL9      00037  00222*
D   0203  BLSP1    00039  00227*00238
D   0230  BLSP11   00040  00236*
D   0208  BLSP2    00039  00228*
D   020D  BLSP3    00039  00229*
D   0212  BLSP4    00039  00230*
D   0217  BLSP5    00039  00231*
D   021C  BLSP6    00040  00232*
D   0221  BLSP7    00040  00233*
D   022B  BLSP8    00040  00234*
D   0226  BLSP9    00040  00235*
D   0040  BOT      00051  00104*
D   0231  BWAD     00045  00252*
D   0204  BWDD1    00042  00240*00250
D   0209  BWDD2    00042  00241*
D   020E  BWDD3    00042  00242*
D   0213  BWDD4    00042  00243*
D   0219  BWDD5    00042  00244*
D   021D  BWDD6    00043  00245*
D   0222  BWDD7    00043  00246*
D   022C  BWDD8    00043  00247*
D   0227  BWDD9    00043  00248*
D   0001  CAR      00053  00164*
D   C007  CLRFR    00024  00089*
D   C005  CLRRW    00024  00087*
D   0004  CONF     00050  00155*
D   0232  DW1      00046  00254*00255  00256  00257  00258  00259  00260  00261
D   0236  DW2      00046  00255*
D   023A  DW3      00046  00256*
D   023E  DW4      00046  00257*
D   0242  DW5      00046  00258*
D   0246  DW6      00047  00259*
D   024A  DW7      00047  00260*
D   024E  DW8      00047  00261*00262
D   0002  FAIL     00026  00111*
D   0002  FAS      00028  00132*
D   6000  FEAD0    00021  00065*00066
D   6000  FEAD8    00021  00066*
D   0010  FEOS     00028  00135*
D   0001  FIRG     00050  00153*
D   0002  FTOK     00050  00154*
D   0040  FTT      00029  00148*
D   0085  GENPLY   00052  00284*
D   0020  INCCHR   00051  00103*
D   0010  IRG      00051  00102*
D   007D  JL10FS   00048  00272*
D   007E  JL20FS   00048  00273*
D   007F  JL30FS   00048  00274*
D   0081  JL40FS   00048  00275*
D   0083  JL50FS   00048  00276*
D   0085  JL60FS   00049  00277*
D   0086  JL70FS   00049  00278*
D   0088  JL80FS   00049  00279*
D   0089  JL90FS   00049  00280*
D   0080  K1       00029  00138*
D   0040  LFROG    00028  00137*
D   4001  LR1      00022  00076*
D   4002  LR2      00022  00077*
D   00B8  LRMS     00022  00124*
D   0004  M        00029  00144*
D   024E  MDW      00047  00262*
D   0080  NCF      00050  00149*
D   0020  NEGRES   00028  00136*
D   0002  NEWAL    00053  00165*
```

```
D  0020 NX     00029 00147*
D  0002 OBL    00038 00225*
D  0003 OBLSP  00041 00238*
D  0004 OBWDD  00044 00250*
D  0001 OUNBL  00035 00212*
D  0000 OXDAC  00032 00199*
D  0002 P      00029 00143*
D  0001 PASS   00026 00110*
D  00F7 PBAADL 00020 00180*
D  0005 PBAADM 00020 00179*
D  0004 PFF    00053 00166*
D  0008 POL    00053 00167*
D  0080 RBFULL 00051 00105*
D  0004 READY  00051 00100*
D  0010 REDO   00053 00168*
D  C001 RESET  00023 00083*
D  2040 REW    00050 00159*
D  8800 ROMO   00022 00125*
D  C000 ROMEND 00022 00126*
D  C002 RUN    00023 00084*
D  C006 SETFR  00024 00088*
D  C004 SETRW  00024 00086*
D  4000 SR1    00022 00071*
D  4001 SR2    00022 00072*
D  4002 SR3    00022 00073*
D  4003 SR4    00022 00074*
D  B800 STLROM 00022 00123*00124
D  C003 STOP   00023 00085*
D  0001 TDF    00029 00142*
D  0004 TE     00028 00133*
D  0008 TEC    00026 00113*
D  0010 TERR   00050 00157*
D  0004 TES    00026 00112*
D  C001 TREAD  00025 00094*
D  0080 TSLN   00027 00117*
D  0040 TSLP   00027 00116*
D  C002 TSTAT  00025 00095*
D  C000 TWRITE 00023 00082*
D  0201 UNBL1  00033 00201*00212
D  022E UNBL11 00034 00210*
D  0206 UNBL2  00033 00202*
D  020B UNBL3  00033 00203*
D  0210 UNBL4  00033 00204*
D  0215 UNBL5  00033 00205*
D  021A UNBL6  00034 00206*
D  021F UNBL7  00034 00207*
D  0229 UNBL8  00034 00208*
D  0224 UNBL9  00034 00209*
D  3008 WBEMP  00051 00101*
D  0200 XDAC1  00030 00188*00212 00225 00238 00250
D  022D XDAC11 00031 00197*
D  0205 XDAC2  00030 00189*
D  020A XDAC3  00030 00190*
D  020F XDAC4  00030 00191*
D  0214 XDAC5  00030 00192*
D  0219 XDAC6  00031 00193*
D  021E XDAC7  00031 00194*
D  0223 XDAC8  00031 00195*
D  0223 XDAC9  00031 00196*

00001                         NAM   FOB
00002                         OPT   REL, CREF, LLEN=80
00003                         TTL   VARIABLES ON BASE PAGE
00004                         IDNT  DEC. 19, 1977

00006              * EXTERNAL DEFINITIONS FOR VARIABLES ON BASE PAGE

00008                         XDEF  ALAD, ALBL, ALFA, BADS1, BADS2, BADS3, BADS4
00009                         XDEF  BADS5, BADS6, BADS7, BADS8, BADS9
00010                         XDEF  AA, A14N, A2, A3, AD, ADB, ADBB
00011                         XDEF  ADS1, ADS2, ADS3, AW
00012                         XDEF  BB, BITL, BITNO, BL, BLR, BLS, BLT, BP, BX
00013                         XDEF  CF, CF1, CF2, CM, CMC, CRC, D, DCOMP
```

```
00014                    XDEF    FALB7, FALB8, FDB, FNTB, FPTB, FSB, FSBRF
00015                    XDEF    FEW01, FEW02, FEW03, FEW11, FEW12, FEW13
00016                    XDEF    FEW2, FEW4, FF, FM4, H
00017                    XDEF    K2, K3, K4, K4S, K5, K5S, K5T, K6, K7, K8
00018                    XDEF    K15, K16
00019                    XDEF    LALB7, LNT3, LPTB, MISAL, MTR1, MTR2, NNTR, NPTR
00020                    XDEF    L1, L2, LD, LI, M1, M2, M3, N, NAD, NRN, PK2, Q, R, SH
00021                    XDEF    TAD, TDC, TAAC, TPR, TSAA, T1, T2, T3, T4, T5
00022                    XDEF    T7BL, VOS1, VOS2, W1, W2, W7, W8
00023                    XDEF    TVAR1, TMPIDX, SCRTCH
00024                    XDEF    PSTK, PSTKTP
00025                    XDEF    LITE1, LITE2, FR1, FR2
00026                    XDEF    TEMP, TEMP2, TEMP3, TEMP4, TEMP5
00027                    XDEF    STAD, FR3, FR4, AFXRF, DIW
00028                    XDEF    X2, X3, XM 00030B 0000                      BSCT
00032                    *
00033                    * VARIABLES LOCATED ON BASE PAGE
00034                    *

00036B 0000   0002   A BADS1   RMB    2      BEGINNING ADDRESS, TRACE 1
00037B 0002   0002   A BADS2   RMB    2      BEGINNING ADDRESS, TRACE 2
00038B 0004   0002   A BADS3   RMB    2      BEGINNING ADDRESS, TRACE 3
00039B 0006   0002   A BADS4   RMB    2      BEGINNING ADDRESS, TRACE 4
00040B 0008   0002   A BADS5   RMB    2      BEGINNING ADDRESS, TRACE 5
00041B 000A   0002   A BADS6   RMB    2      BEGINNING ADDRESS, TRACE 6
00042B 000C   0002   A BADS7   RMB    2      BEGINNING ADDRESS, TRACE 7
00043B 000E   0002   A BADS8   RMB    2      BEGINNING ADDRESS, TRACE 8
00044B 0010   0002   A BADS9   RMB    2      BEGINNING ADDRESS, TRACE 9
00045B 0012   0001   A AA      RMB    1      INT8
00046B 0013   0002   A A14N    RMB    2      INT15
00047B 0015   0001   A A2      RMB    1      INT7
00048B 0016   0001   A A3      RMB    1      INT8 * 2
00049B 0017   0002   A AD      RMB    2      ADDRESS OR INT8
00050B 0019   0002   A ADB     RMB    2      INT15 OR INT8
00051B 001B   0002   A ADBB    RMB    2      INT15
00052B 001D   0002   A ADS1    RMB    2      ADDRESS
00053B 001F   0001   A ADS2    RMB    1      8 BIT ADDRESS
00054B 0020   0001   A ADS3    RMB    1      8 BIT ADDRESS
00055B 0021   0002   A AFXRF   RMB    2      INT15
00056B 0023   0002   A ALAD    RMB    2      ADDRESS
00057B 0025   0002   A ALBL    RMB    2      INT15
00058B 0027   0002   A ALFA    RMB    2      INT15
00059B 0029   0024   A AW      RMB    36     DISPLAY CHARACTERS
00060B 004D   0002   A BB      RMB    2      INT8 OR INT15
00061B 004F   0001   A BITL    RMB    1      INT8
00062B 0050   0002   A BITNO   RMB    2      INT15
00063B 0052   0001   A BL      RMB    1      INT8
00064B 0053   0001   A BLR     RMB    1      INT8
00065B 0054   0001   A BLS     RMB    1      INT8
00066B 0055   0002   A BLT     RMB    2      INT15
00067B 0057   0001   A BP      RMB    1      INT8
00068B 0058   0001   A CF      RMB    1      INT7
00069B 0059   0002   A CF1     RMB    2      INT15
00070B 005B   0001   A CF2     RMB    1      INT7
00071B 005C   0002   A CM      RMB    2      INT15
00072B 005E   0002   A CMC     RMB    2      INT15
00073B 0060   0001   A CRC     RMB    1      CYCLIC REDUNDANCY CHECK CHARACTER
00074B 0061   0001   A D       RMB    1      INT8
00075B 0062   0001   A DCOMP   RMB    1      INT8
00076B 0063   0001   A DIW     RMB    1      INT8
00077B 0064   0002   A FALB7   RMB    2      INT15
00078B 0066   0002   A FALB8   RMB    2      INT15
00079B 0068   0001   A FDB     RMB    1      INT8
00080B 0069   0001   A FEW01   RMB    1      FRONT END WRITE ADDRESS
00081B 006A   0001   A FEW02   RMB    1           "
00082B 006B   0001   A FEW03   RMB    1           "
00083B 006C   0001   A FEW11   RMB    1           "
```

```
00084B 006D      0001    A FEW12   RMB     1               "
00085B 006E      0001    A FEW13   RMB     1               "
00086B 006F      0001    A FEW2    RMB     1               "
00087B 0070      0001    A FEW4    RMB     1               "
00088B 0071      0001    A BX      RMB     1               INT8
00089B 0072      0001    A FF      RMB     1               INT8
00090B 0073      0001    A FM4     RMB     1               INT8
00091B 0074      0002    A FNTB    RMB     2               INT15
00092B 0076      0002    A FPTB    RMB     2               INT15
00093B 0078      0002    A FSB     RMB     2               INT15
00094B 007A      0001    A FSBRF   RMB     1               INT7
00095B 007B      0001    A H       RMB     1               INT8
00096B 007C      0001    A K2      RMB     1               INT8
00097B 007D      0002    A K3      RMB     2               INT15 * 10
00098B 007F      0002    A K4      RMB     2               PV2
00099B 0081      0002    A K4S     RMB     2               PV2
00100B 0083      0002    A K5      RMB     2               INT15 * 10
00101B 0085      0002    A K5S     RMB     2               INT15 * 10
00102B 0087      0002    A K5T     RMB     2               INT15 * 10
00103B 0089      0001    A K6      RMB     1               TRIGGER SLOPE - INT8
00104B 008A      0002    A K7      RMB     2               INT15 * 10
00105B 008C      0001    A K8      RMB     1               INT8
00106B 008D      0002    A K15     RMB     2               PV2
00107B 008F      0002    A K16     RMB     2               INT15
00108B 0091      0001    A L1      RMB     1               INT8
00109B 0092      0001    A L2      RMB     1               "
00110B 0093      0002    A LALB7   RMB     2               INT15
00111B 0095      0001    A LD      RMB     1               INT8
00112B 0096      0001    A LI      RMB     1               INT8
00113B 0097      0002    A LNTB    RMB     2               INT15
00114B 0099      0002    A LPTB    RMB     2               INT15
00115B 009B      0001    A M1      RMB     1               MODE NUMBER
00116B 009C      0001    A M2      RMB     1               "
00117B 009D      0001    A M3      RMB     1               "
00118B 009E      0002    A MISAL   RMB     2               INT15
00119B 00A0      0001    A MTR1    RMB     1               INT8
00120B 00A1      0001    A MTR2    RMB     1               INT8
00121B 00A2      0001    A N       RMB     1               INT8
00122B 00A3      0002    A NAD     RMB     2               ADDRESS
00123B 00A5      0001    A NNTR    RMB     1               INT8
00124B 00A6      0001    A NPTR    RMB     1               INT8
00125B 00A7      0001    A NRN     RMB     1               NEXT RECORD NUMBER (INT8)
00126B 00A8      0001    A PK2     RMB     1               INT8
00127B 00A9      0001    A Q       RMB     1               INT8
00128B 00AA      0001    A R       RMB     1               INT8
00129B 00AB      0001    A SH      RMB     1               INT7
00130B 00AC      0002    A TAD     RMB     2               ADDRESS
00131B 00AE      0002    A TDC     RMB     2               TRIGGER DELAY COUNTDOWN
00132B 00B0      0002    A TAAC    RMB     2               TRIGGER ARM ADDRESS COUNT
00133B 00B2      0002    A TSAA    RMB     2               TRIGGER SOURCE AUTO ADDRESS
00134B 00B4      0001    A T1      RMB     1               INT8
00135B 00B5      0001    A T2      RMB     1               INT8
00136B 00B6      0001    A T3      RMB     1               INT8
00137B 00B7      0001    A T4      RMB     1               INT8
00138B 00B8      0002    A T5      RMB     2               INT15
00139B 00BA      0001    A T7BL    RMB     1               INT8
00140B 00BB      0001    A TPR     RMB     1               INT8
00141B 00BC      0002    A VOS1    RMB     2               VOLTAGE OFFSET (INT15)
00142B 00BE      0002    A VOS2    RMB     2               "
00143B 00C0      0002    A         RMB     2               NOT USED
00144B 00C2      0002    A         RMB     2               "
00145B 00C4      0002    A W1      RMB     2               INT15
00146B 00C6      0002    A W2      RMB     2               "
00147B 00C8      0001    A W7      RMB     1               INT8
00148B 00C9      0001    A W8      RMB     1               INT8
00149B 00CA      0001    A X2      RMB     1               INT8
00150B 00CB      0001    A X3      RMB     1               INT8
00151B 00CC      0001    A XM      RMB     1               INT8 - TRANSCRIBE MODE
00152B 00CD      0003    A TVAR1   RMB     3               TEMP VARIABLE STORAGE
00153B 00D0      0002    A TMPIDX  RMB     2               TEMPORARY INDEX STORAGE
00154B 00D2      000A    A SCRTCH  RMB     10              MATH SCRATCH AREA
```

```
00155B 00DC    0002   A STAD    RMB    2     ADDRESS
00156B 00DE    0012   A PSTK    RMB    18    POLISH MATH STACK
00157          00F0   B PSTKTP  EQU    *
00158B 00F0    0001   A LITE1   RMB    1     LR1 STATUS MEMORY
00159B 00F1    0001   A LITE2   RMB    1     LR2 STATUS MEMORY
00160B 00F2    0001   A FR1     RMB    1     FLAG REGISTER 1
00161B 00F3    0001   A FR2     RMB    1     FLAG REGISTER 2
00162B 00F4    0001   A FR3     RMB    1     FLAG REGISTER 3
00163B 00F5    0001   A FR4     RMB    1     FLAG REGISTER 4
00164B 00F6    0002   A TEMP    RMB    2     TEMP REGISTER STORAGE
00165B 00F8    0002   A TEMP2   RMB    2         "
00166B 00FA    0002   A TEMP3   RMB    2         "
00167B 00FC    0002   A TEMP4   RMB    2         "
00168B 00FE    0001   A TEMP5   RMB    1         "
00169                 *                     NOTE: TEMP5 SHOULD BE "RMB 2"
00170                 *                     HOWEVER, THE MACRO ASSEMBLER
00171                 *                     WILL GIVE A DIAGNOSTIC IF IT
00172                 *                     IS. THE ASSEMBLER CANNOT
00173                 *                     HANDLE AN EXACTLY FULL BASE
00174                 *                     PAGE.
00176                        END
TOTAL ERRORS 00000

DB 0013 A14N     00010 00046*
DB 0015 A2       00010 00047*
DB 0016 A3       00010 00048*
DB 0012 AA       00010 00045*
DB 0017 AD       00010 00049*
DB 0019 ADB      00010 00050*
DB 001B ADBB     00010 00051*
DB 001D ADS1     00011 00052*
DB 001F ADS2     00011 00053*
DB 0020 ADS3     00011 00054*
DB 0021 AFXRF    00027 00055*
DB 0023 ALAD     00008 00056*
DB 0025 ALBL     00008 00057*
DB 0027 ALFA     00008 00058*
DB 0029 AW       00011 00059*
DB 0000 BADS1    00008 00036*
DB 0002 BADS2    00008 00037*
DB 0004 BADS3    00008 00038*
DB 0006 BADS4    00008 00039*
DB 0008 BADS5    00009 00040*
DB 000A BADS6    00009 00041*
DB 000C BADS7    00009 00042*
DB 000E BADS8    00009 00043*
DB 0010 BADS9    00009 00044*
DB 004D BB       00012 00060*
DB 004F BITL     00012 00061*
DB 0050 BITNO    00012 00062*
DB 0052 BL       00012 00063*
DB 0053 BLR      00012 00064*
DB 0054 BLS      00012 00065*
DB 0055 BLT      00012 00066*
DB 0057 BP       00012 00067*
DB 0071 BX       00012 00088*
DB 0058 CF       00013 00068*
DB 0059 CF1      00013 00069*
DB 005B CF2      00013 00070*
DB 005C CM       00013 00071*
DB 005E CMC      00013 00072*
DB 0060 CRC      00013 00073*
DB 0061 D        00013 00074*
DB 0062 DCOMP    00013 00075*
DB 0063 DIW      00027 00076*
DB 0064 FALB7    00014 00077*
DB 0066 FALB8    00014 00078*
DB 0068 FDB      00014 00079*
DB 0069 FEW01    00015 00080*
```

```
DB  006A  FEW02   00015  00081*
DB  006B  FEW03   00015  00082*
DB  006C  FEW11   00015  00083*
DB  006D  FEW12   00015  00084*
DB  006E  FEW13   00015  00085*
DB  006F  FEW2    00016  00086*
DB  0070  FEW4    00016  00087*
DB  0072  FF      00016  00089*
DB  0073  FM4     00016  00090*
DB  0074  FNTB    00014  00091*
DB  0076  FPTB    00014  00092*
DB  00F2  FR1     00025  00160*
DB  00F3  FR2     00025  00161*
DB  00F4  FR3     00027  00162*
DB  00F5  FR4     00027  00163*
DB  0078  FSB     00014  00093*
DB  007A  FSBRF   00014  00094*
DB  007B  H       00016  00095*
DB  008D  K15     00018  00106*
DB  008F  K16     00018  00107*
DB  007C  K2      00017  00096*
DB  007D  K3      00017  00097*
DB  007F  K4      00017  00098*
DB  0081  K4S     00017  00099*
DB  0083  K5      00017  00100*
DB  0085  K5S     00017  00101*
DB  0087  K5T     00017  00102*
DB  0089  K6      00017  00103*
DB  008A  K7      00017  00104*
DB  008C  K8      00017  00105*
DB  0091  L1      00020  00108*
DB  0092  L2      00020  00109*
DB  0093  LALB7   00019  00110*
DB  0095  LD      00020  00111*
DB  0096  LI      00020  00112*
DB  00F0  LITE1   00025  00158*
DB  00F1  LITE2   00025  00159*
DB  0097  LNTB    00019  00113*
DB  0099  LPTB    00019  00114*
DB  009B  M1      00020  00115*
DB  009C  M2      00020  00116*
DB  009D  M3      00020  00117*
DB  009E  MISAL   00019  00118*
DB  00A0  MTR1    00019  00119*
DB  00A1  MTR2    00019  00120*
DB  00A2  N       00020  00121*
DB  00A3  NAD     00020  00122*
DB  00A5  NNTR    00019  00123*
DB  00A6  NPTR    00019  00124*
DB  00A7  NRN     00020  00125*
DB  00A8  PK2     00020  00126*
DB  00DE  PSTK    00024  00156*
DB  00F0  PSTKTP  00024  00157*
DB  00A9  Q       00020  00127*
DB  00AA  R       00020  00128*
DB  00D2  SCRTCH  00023  00154*
DB  00AB  SH      00020  00129*
DB  00DC  STAD    00027  00155*
DB  00B4  T1      00021  00134*
DB  00B5  T2      00021  00135*
DB  00B6  T3      00021  00136*
DB  00B7  T4      00021  00137*
DB  00B8  T5      00021  00138*
DB  00BA  T7BL    00022  00139*
DB  00B0  TAAC    00021  00132*
DB  00AC  TAD     00021  00130*
DB  00AE  TDC     00021  00131*
DB  00F6  TEMP    00026  00164*
DB  00F8  TEMP2   00026  00165*
DB  00FA  TEMP3   00026  00166*
DB  00FC  TEMP4   00026  00167*
```

```
DB 00FE  TEMP5   00026  00168*
DB 00D0  TMPIDX  00023  00153*
DB 00BB  TPR     00021  00140*
DB 00B2  TSAA    00021  00133*
DB 00CD  TVAR1   00023  00152*
DB 00BC  VOS1    00022  00141*
DB 00BE  VOS2    00022  00142*
DB 00C4  W1      00022  00145*
DB 00C6  W2      00022  00146*
DB 00C8  W7      00022  00147*
DB 00C9  W8      00022  00148*
DB 00CA  X2      00023  00149*
DB 00CB  X3      00023  00150*
DB 00CC  XM      00023  00151*

00001                         NAM    F0C
00002                         OPT    REL, CREF, LLEN=80
00003                         TTL    VARIABLES ON PAGE ONE
00004                         IDNT   NOV.  14, 1977

00006                      * EXTERNAL DEFINITIONS FOR VARIABLES ON PAGE ONE

00008                         XDEF   AAD, ADW, BLOC, BPD, BR
00009                         XDEF   CBL, CH, DIM, DW, FDBT
00010                         XDEF   J15, K4T
00011                         XDEF   INC, MAXMIS, NATT, NBTT, NDB, NDW, NSB, NSW
00012                         XDEF   RAS, RATT, RNX, SBZ, SPD, ISPD, SPDT, SW
00013                         XDEF   T6, T7, T8, TBL, TDW, TOTB, TOTMA, TRET
00014                         XDEF   WF1, WF2, WFH, WFL
00015                         XDEF   STACK
00016                         XDEF   NTT, NTR, RMN, NOBY
00017                         XDEF   RCAP, X4, X5
00018                         XDEF   T7AD, T8AD, T8BL, T9AD
00019                         XDEF   ALWD, PERIOD, PER7, PREVB, RSPD, SRSPD 00021D 0000                   DSCT
00023                      *
00024                      * VARIABLES LOCATED ON PAGE ONE
00025                      *
00027D 0000   0002   A AAD    RMB    2    ADDRESS
00028D 0002   0001   A ADW    RMB    1    INT8
00029D 0003   0001   A ALWD   RMB    1    INT8
00030D 0004   0001   A BLOC   RMB    1    INT8
00031D 0005   0001   A BPD    RMB    1    INT8
00032D 0006   0001   A BR     RMB    1    INT8
00033D 0007   0001   A CBL    RMB    1    INT8
00034D 0008   0001   A CH     RMB    1    INT8
00035D 0009   0001   A DW     RMB    1    INT8
00036D 000A   0001   A DIM    RMB    1    INT8
00037D 000B   0010   A FDBT   RMB    16   8 INT15 (ARRAY)
00038D 001B   0010   A J15    RMB    16   8 PV2 (ARRAY)
00039D 002B   0002   A K4T    RMB    2    PV2
00040D 002D   0001   A INC    RMB    1    INT8
00041D 002E   0002   A ISPD   RMB    2    INT15
00042D 0030   0002   A MAXMIS RMB    2    INT15
00043D 0032   0001   A NATT   RMB    1    INT8
00044D 0033   0001   A NBTT   RMB    1    INT8
00045D 0034   0001   A NDB    RMB    1    INT8
00046D 0035   0001   A NDW    RMB    1    INT8
00047D 0036   0001   A NOBY   RMB    1    INT8 (NUMBER OF BYTES)
00048D 0037   0001   A NSB    RMB    1    INT8
00049D 0038   0001   A NSW    RMB    1    INT8
00050D 0039   0001   A NTR    RMB    1    INT8 (NUMBER OF TRYS)
00051D 003A   0002   A NTT    RMB    2    INT16 (NUMBER OF TIMES THROUGH)
00052D 003C   0002   A PER7   RMB    2    INT15
00053D 003E   0002   A PERIOD RMB    2    INT15
```

```
00054D 0040    0001    A PREVD   RMB    1      INT8
00055D 0041    0001    A RAS     RMB    1      INT8
00056D 0042    0002    A RATT    RMB    2      ADDRESS
00057D 0044    0001    A RCAP    RMB    1      INT8
00058D 0045    0001    A RMN     RMB    1      INT8 (RECORD MARK NUMBER)
00059D 0046    0001    A RNX     RMB    1      INT8
00060D 0047    0001    A RSPD    RMB    1      INT8
00061D 0048    0010    A SBZ     RMB    16     8 INT15 (ARRAY)
00062D 0058    0001    A SPD     RMB    1      INT8
00063D 0059    0003    A SPDT    RMB    3      PV1
00064D 005C    0001    A SRSPD   RMB    1      INT8
00065D 005D    0001    A SW      RMB    1      INT8
00066D 005E    0002    A T6      RMB    2      INT15
00067D 0060    0002    A T7      RMB    2      INT15
00068D 0062    0002    A T7AD    RMB    2      ADDRESS
00069D 0064    0002    A T8      RMB    2      INT15
00070D 0066    0002    A T8AD    RMB    2      ADDRESS
00071D 0068    0001    A T8BL    RMB    1      INT8
00072D 0069    0002    A T9AD    RMB    2      ADDRESS
00073D 006B    0005    A TBL     RMB    5      5 INT8 (ARRAY)
00074D 0070    0014    A TDW     RMB    20     5 FOUR BYTE ENTRIES (ARRAY)
00075D 0084    0002    A TOTB    RMB    2      INT15
00076D 0086    0002    A TOTMA   RMB    2      INT15
00077D 0088    0002    A TRET    RMB    2      TEMP RETURN ADDRESS
00078D 008A    0002    A WF1     RMB    2      INT15
00079D 008C    0002    A WF2     RMB    2      INT15
00080D 008E    0002    A WFH     RMB    2      INT15
00081D 0090    0002    A WFL     RMB    2      INT15
00082D 0092    0001    A X4      RMB    1      INT8
00083D 0093    0001    A X5      RMB    1      INT8
00084   01FF   A STACK  EQU    $1FF
00086                               END
TOTAL ERRORS 00000

D 0000 AAD     00008 00027*
D 0002 ADW     00008 00028*
D 0003 ALWD    00019 00029*
D 0004 BLOC    00008 00030*
D 0005 BPD     00008 00031*
D 0006 BR      00008 00032*
D 0007 CBL     00009 00033*
D 0008 CH      00009 00034*
D 000A DIM     00009 00036*
D 0009 DW      00009 00035*
D 000B FDBT    00009 00037*
D 002D INC     00011 00040*
D 002E ISPD    00012 00041*
D 001B J15     00010 00038*
D 002B K4T     00010 00039*
D 0030 MAXMIS  00011 00042*
D 0032 NATT    00011 00043*
D 0033 NBTT    00011 00044*
D 0034 NDB     00011 00045*
D 0035 NDW     00011 00046*
D 0036 NOBY    00016 00047*
D 0037 NSB     00011 00048*
D 0038 NSW     00011 00049*
D 0039 NTR     00016 00050*
D 003A NTT     00016 00051*
D 003C PER7    00019 00052*
D 003E PERIOD  00019 00053*
D 0040 PREVB   00019 00054*
D 0041 RAS     00012 00055*
D 0042 RATT    00012 00056*
D 0044 RCAP    00017 00057*
D 0045 RMN     00016 00058*
D 0046 RNX     00012 00059*
D 0047 RSPD    00019 00060*
D 0048 SBZ     00012 00061*
```

```
 D 0058 SPD       00012 00062*
 D 0059 SPDT      00012 00063*
 D 005C SRSPD     00019 00064*
   01FF STACK     00015 00084*
 D 005D SW        00012 00065*
 D 005E T6        00013 00066*
 D 0060 T7        00013 00067*
 D 0062 T7AD      00018 00068*
 D 0064 T8        00013 00069*
 D 0066 T8AD      00018 00070*
 D 0068 T8BL      00018 00071*
 D 0069 T9AD      00018 00072*
 D 006B TBL       00013 00073*
   0070 TDW       00013 00074*
   0084 TOTB      00013 00075*
 D 0086 TOTMA     00013 00076*
 D 0088 TRET      00013 00077*
 D 008A WF1       00014 00078*
 D 008C WF2       00014 00079*
 D 008E WFH       00014 00080*
   0090 WFL       00014 00081*
   0092 X4        00017 00082*
 D 0093 X5        00017 00083*
00198
00199                        * CLBOT - CLEAR BOTTOM 1/4 OF CRT - DOES THAT AND
00200                        *         INITIALIZES CERTAIN VARIABLES, FLAGS, AND LITES.
00201                        *
00202                        * FLOW PAGE 1D
00203                        *
00204P 0129 CE 0028  A CLBOT LDX     #DW8+40   LOOP TERMINATOR
00205P 012C DF 00    A       STX     TEMP
00206P 012E CE 0000  A       LDX     #DW7      POINT TO DW7
00207P 0131 BD 0000  A       JSR     CBLOCK    CLEAR DW7, DW8, MDW
00208                        *
00209P 0134 86 07    A       LDAA    #7        ACCA _ 7
00210P 0136 C6 FF    A       LDAB    #255
00211P 0138 BD 0000  A CLBLP JSR     PNTATT    INDEX _ #TRACE(ACCA)
00212P 013B E7 00    A       STAB    OBL,X     BL(ACCA) _ 255
00213P 013D 4C               INCA              ACCA _ ACCA+1
00214P 013E 81 0A    A       CMPA    #10
00215P 0140 26 F6 0138       BNE     CLBLP     LOOP TILL ACCA = 10
00216                        *
00217P 0142 DE 00    A       LDX     BADS7
00218P 0144 6F 00    A       CLR     JL1OFS,X  J(7,1) _ 0
00219P 0146 6F 00    A       CLR     JL2OFS,X  J(7,2) _ 0
00220P 0148 DE 00    A       LDX     BADS8
00221P 014A 6F 00    A       CLR     JL1OFS,X  J(8,1) _ 0
00222P 014C 6F 00    A       CLR     JL2OFS,X  J(8,2) _ 0
00223                        *
00224P 014E 7F 0000  A       CLR     M3        M3 _ 0
00225P 0151 86 33    A       LDAA    #51
00226P 0153 97 00    A       STAA    DCOMP     DCOMP = 51
00227                        *
00228P 0155 C6 00    A       LDAB    #PASS+FAIL LITES IN LR1
00229P 0157 7E 0000  A       JMP     CLITE1    CLEAR THEM AND EXIT CLBOT
00230                        *
00231                        * CANLOG - CLEAR ANALOG TRACE IF REQUIRED
00232                        *
00233                        * FLOW PAGE 1E
00234                        *
00235P 015A 96 00    A CANLOG LDAA   FR1
00236P 015C 85 00    A       BITA    #ATS      IS ATS = 1?
00237P 015E 27 13 0173       BEQ     CANLG9    IF NOT...BRANCH
00238P 0160 CE 03D0  A       LDX     #BAAD+976 LOOP TERMINATOR
00239P 0163 DF 00    A       STX     TEMP      SAVE IT
00240P 0165 CE 0000  A       LDX     #BAAD     GET START POINT
00241P 0168 BD 0000  A       JSR     CBLOCK    CLEAR BLOCK
00242                        *
00243P 016B 86 00    A       LDAA    #ATS
00244P 016D BD 0000  A       JSR     CFLG1     ATS _ 0
```

```
00245                     *
00246P 0170 7F 0000   A         CLR     BL11        BL(11) _ 1'S COMPLEMENT OF 255
00247                     *
00248P 0173 39                  CANLG9 RTS          EXIT CANLOG

00134                     *
00135                     * SETAW - SETS CHARACTERS OF A
00136                     *   IN AW THRU AW + 5 (AW, 1 THRU AW, 6).
00137                     *   A MUST BE IN X ON PSTK (ENTRY VALUE
00138                     *   OF A IS SAVED IN TVAR1).  PAGE 3C OF FLOW.
00139                     *
00140                     * FIRST, CALCULATE STRING( INT(A*100) )
00141                     *
00142P 00B2 CE 0000   A   SETAW  LDX    #TVAR1
00143P 00B5 BD 0000   A          JSR    STOVAR       TVAR1 _ A
00144P 00B8 86 02     A          LDAA   #2
00145P 00BA BD 0000   A          JSR    EEXP10       10**2, A ON PSTK
00146P 00BD BD 0000   A          JSR    FLPMLT       A _ 100 * A
00147P 00C0 BD 0000   A          JSR    R10          A _ A + .5 (BASE 10)
00148P 00C3 BD 0000   A          JSR    DTOBDC       GET STRING(A)
00149                     *
00150                     * AW, 1-6 _ STRING(A)
00151                     *
00152P 00C6 CE 0000   A          LDX    #AW
00153P 00C9 32            SETAWL PULA                 GET CHARACTER
00154P 00CA A7 00     A          STAA   X            AW, N _ CHARACTER
00155P 00CC 08                   INX                 N _ N + 1
00156P 00CD 8C 0006   A          CPX    #AW+6        LOOP
00157P 00D0 26 F7 00C9           BNE    SETAWL       ... WHILE N < 7
00158                     *
00159                     * NOW FIX AW FOR PAGE 3C
00160                     *
00161P 00D2 96 02     A          LDAA   AW+2         GET 10'S DIGIT
00162P 00D4 81 0A     A          CMPA   #10          IS IT "0"?
00163P 00D6 26 1E 00F6           BNE    SETAW2       BRANCH IF NOT
00164P 00D8 96 00     A          LDAA   AW
00165P 00DA 97 01     A          STAA   AW+1         MOVE SIGN IF SO
00166P 00DC 7F 0000   A          CLR    AW           ... AND CLEAR OLD SIGN
00167P 00DF 96 03     A          LDAA   AW+3         GET 1'S DIGIT
00168P 00E1 81 0A     A          CMPA   #10          IS IT "0"?
00169P 00E3 26 13 00F8           BNE    SETAW3       BRANCH IF NOT
00170P 00E5 96 04     A          LDAA   AW+4         GET 1/10'S DIGIT
00171P 00E7 81 0A     A          CMPA   #10          IS IT "0"?
00172P 00E9 26 0D 00F8           BNE    SETAW3       BRANCH IF NOT
00173P 00EB 96 05     A          LDAA   AW+5         GET 1/100'S DIGIT
00174P 00ED 81 0A     A          CMPA   #10          IS IT "0"?
00175P 00EF 26 07 00F8           BNE    SETAW3       BRANCH IF NOT
00176P 00F1 7F 0001   A          CLR    AW+1         CLEAR SIGN IF A=0
00177P 00F4 20 02 00F8           BRA    SETAW3
00178P 00F6 97 01     A   SETAW2 STAA   AW+1         MOVE 10'S DIGIT
00179P 00F8 96 03     A   SETAW3 LDAA   AW+3
00180P 00FA 97 02     A          STAA   AW+2         MOVE 1'S DIGIT
00181P 00FC 86 1D     A          LDAA   #29          GET "."
00182P 00FE 97 03     A          STAA   AW+3         AW, 4 _ "."
00183P 0100 39                   RTS                 EXIT SETAW

00105                     *
00106                     * X2MDW - USE X2 TO SET MDW, 12-16
00107                     *
00108                     * FLOW PAGE 6B
00109                     *
00110P 0087 D6 00     A   X2MDW  LDAB   X2           CONVERT X2 TO DTO CHARACTER
00111                     *                          STRING AND PUT IN MDW
00112P 0089 CE 000B   A          LDX    #MDW+11      POINT TO PLACE WITHIN MDW
00113P 008C 20 34 00C2           BRA    X4MDW1       DO THE CONVERSION ... AND EXIT

00115                     *
00116                     * X3MDW - USE X3 TO SET MDW, 15-20
00117                     *
00118                     * FLOW PAGE 6C
00119                     *
```

```
00120P 008E CE 0019  A  X3MDW   LDX     #MDW+25
00121P 0091 DF 00    A          STX     TEMP        TERMINATOR
00122P 0093 CE 0014  A          LDX     #MDW+20
00123P 0096 BD 0000  A          JSR     CBLOCK      MDW,21-25 = "     "
00124P 0099 86 1A    A          LDAA    #26
00125P 009B B7 000E  A          STAA    MDW+14      MDW,15 = "-"
00126P 009E D6 00    A          LDAB    X3          CONVERT X3 TO DTO CHARACTER
00127                *                              STRING AND PUT IN MDW
00128P 00A0 CE 000F  A          LDX     #MDW+15     POINT TO PLACE WITHIN MDW
00129P 00A3 20 1D 00C2          BRA     X4MDW1      DO THE CONVERSION ... AND EXIT

00131                *
00132                * X4MDW - USE X4 & X5 TO SET MDW,23-31
00133                *
00134                * FLOW PAGE 6D
00135                *
00136P 00A5 CE 0024  A  X4MDW   LDX     #MDW+36
00137P 00A8 DF 00    A          STX     TEMP        TERMINATOR
00138P 00AA CE 001F  A          LDX     #MDW+31
00139P 00AD BD 0000  A          JSR     CBLOCK      MDW,32-36 = "     "
00140P 00B0 F6 0000  A          LDAB    X4          CONVERT X4 TO DTO CHARACTER
00141                *                              STRING AND PUT IN MDW
00142P 00B3 CE 0016  A          LDX     #MDW+22     POINT TO PLACE WITHIN MDW
00143P 00B6 8D 0E 00C6          BSR     X4MDW2      DO THE CONVERSION
00144P 00B8 86 1A    A          LDAA    #26         DTO "-"
00145P 00BA A7 03    A          STAA    3,X         MDW,26 = "-"

00147P 00BC F6 0000  A          LDAB    X5          CONVERT X5 TO DTO CHARACTER
00148                *                              STRING AND PUT IN MDW
00149P 00BF CE 001A  A          LDX     #MDW+26     POINT TO PLACE WITHIN MDW
00150                *                              DO THE CONVERSION ... AND EXIT 00152P 00C2 86 18    A  X4MDW1  LDAA    #24         DTO "?"
00153P 00C4 A7 04    A          STAA    4,X         MDW,X+4 = "?"

00155P 00C6 4F          X4MDW2  CLRA                CONVERT ACCA,ACCB INTO DTO
00156                *                              CHARACTER STRING
00157P 00C7 DF 00    A          STX     TEMP4       SAVE INDEX
00158P 00C9 BD 0000  A          JSR     DTOBTD
00159P 00CC 31               INS                    SKIP OVER SIGN
00160P 00CD 31               INS
00161P 00CE 31               INS                    SKIP OVER FIRST TWO DIGITS
00162P 00CF DE 00    A          LDX     TEMP4       RESTORE INDEX

00124                *
00125                * SCNCLR - SCAN CLEAR CONTROL - PAGE 11A
00126                *
00127P 0092 BD 0000  A  SCNCLR  JSR     READSR      A _ SR DATA
00128P 0095 D6 00    A          LDAB    M1
00129P 0097 C1 07    A          CMPB    #7          IS M1 = 7?
00130P 0099 26 4F 00EA          BNE     SCLR3       IF NOT...BRANCH
00131P 009B 81 44    A          CMPA    #$44        IS SWEEP ARM CONTINUOUS PRESSED?
00132P 009D 27 01 00A0          BEQ     SCLR02      IF YES...BRANCH AND CONTINUE
00133P 009F 39                  RTS                 ...ELSE EXIT 00135P 00A0 96 00    A  SCLR02  LDAA    XM
00136P 00A2 81 04    A          CMPA    #4          IS XM = 4?
00137P 00A4 26 09 00AF          BNE     SCLR03      IF NOT...BRANCH
00138P 00A6 86 01    A          LDAA    #1
00139P 00A8 97 00    A          STAA    XM          XM _ 1
00140P 00AA BD 0000  A          JSR     XMDR        IN XCRIBE MODE, DISPLAY "READ"
00141P 00AD 20 25 00D4          BRA     SCLR2

00143P 00AF 81 01    A  SCLR03  CMPA    #1          IS XM = 1?
00144P 00B1 27 05 00B8          BEQ     SCLR05      IF YES...BRANCH
00145P 00B3 7F 0000  A          CLR     M2          M2 _ 0
00146P 00B6 20 1C 00D4          BRA     SCLR2

00148P 00B8 B6 0005  A  SCLR05  LDAA    MDW+5
00149P 00BB 81 0C    A          CMPA    #12         IS MDW,6 = "E"?
00150P 00BD 27 0C 00CB          BEQ     SCLR07      IF YES...BRANCH
```

```
00151P 00BF 86 12       A         LDAA   #18
0  52P 00C1 BD 0000     A         JSR    DOMOVE    MDW, 6-10 _ "ERASE"
00153P 00C4 86 FF       A         LDAA   #255
00154P 00C6 B7 0000     A         STAA   RCAP      RCAP _ 255
00155P 00C9 20 09 00D4            BRA    SCLR2

00157P 00CB 86 15       A SCLR07  LDAA   #21
00158P 00CD BD 0000     A         JSR    DOMOVE    MDW, 6-13 _ "TEST TAPE"
00159P 00D0 86 04       A         LDAA   #4
00160P 00D2 97 00       A         STAA   XM        XM _ 4

00162P 00D4 7E 0000     A SCLR2   JMP    WUNCP     WAIT UNTIL NO CONTROLS
00163                           *                  ARE PRESSED ... AND EXIT 00165P 00D7 C6 00       A SCLR1   LDAB   #TES+TEC
00166P 00D9 BD 0000     A         JSR    CLITE1    TES _ TEC _ 0
00167P 00DC 86 00       A         LDAA   #TE
00168P 00DE BD 0000     A         JSR    CFLG1     TE _ 0
00169P 00E1 86 00       A         LDAA   #AT
00170P 00E3 95 00       A         BITA   LITE1
00171P 00E5 27 3C 0123            BEQ    CLRWL     BRANCH IF AT = 0
00172                           *                  CLEAR WL AND EXIT
00173                           *
00174P 00E7 7E 0000     A         JMP    CANLOG    CLEAR ANALOG TRACE, IF REQUIRED
00175                           *                  ... AND EXIT
00176                           *
00177P 00EA 81 45       A SCLR3   CMPA   #$45      IS CLEAR PRESSED?
0  78P 00EC 27 E9 00D7            BEQ    SCLR1     IF YES...BRANCH
00179P 00EE C6 00       A         LDAB   #TE
00180P 00F0 D5 00       A         BITB   FR1
00181P 00F2 27 24 0118            BEQ    SCLR7     BRANCH IF TE = 0
00182                           *
00183P 00F4 81 43       A         CMPA   #$43      TRIGEN SGL PRESSED?
0  84P 00F6 27 0E 0106            BEQ    SCLR4     BRANCH IF SO
0  85                           *
00186P 00F8 81 44       A         CMPA   #$44      TRIGEN CONT PRESSED?
00187P 00FA 26 14 0110            BNE    SCLR5     BRANCH IF NOT
00188                           *
00189P 00FC C6 00       A         LDAB   #TEC
00190P 00FE BD 0000     A         JSR    SLITE1    TEC _ 1
00191P 0101 C6 00       A         LDAB   #TES
00192P 0103 7E 0000     A         JMP    CLITE1    TES _ 0 AND EXIT
00193                           *
00194P 0106 C6 00       A SCLR4   LDAB   #TEC
00195P 0108 BD 0000     A         JSR    CLITE1    TEC _ 0
00196P 010B C6 00       A         LDAB   #TES
00197P 010D 7E 0000     A         JMP    SLITE1    TES _ 1
00198                                              ... AND EXIT 00200P 0110 81 13       A SCLR5   CMPA   #$13      IS "MODE UP" PRESSED?
00201P 0112 27 C3 00D7            BEQ    SCLR1     IF YES...BRANCH
00202P 0114 81 14       A         CMPA   #$14      IS "MODE DOWN" PRESSED?
00203P 0116 27 BF 00D7            BEQ    SCLR1     IF YES...BRANCH 00205P 0118 D6 00       A SCLR7   LDAB   LITE1
00206P 011A C5 00       A         BITB   #AT       IS AT = 1?
00207P 011C 27 04 0122            BEQ    SCLRXT    IF NOT...EXIT 00209P 011E 81 15       A         CMPA   #$15      IS PROBE ADV/CLEAR PRESSED?
0  10P 0120 27 B5 00D7            BEQ    SCLR1     IF YES...BRANCH 00212P 0122 39            SCLRXT  RTS              EXIT

00214                           *
00215                           * CLRWL - WHEN AT = 0, CLEAR WORKING LINE
00216                           *
00217                           * FLOW PAGE 11B
00218                           *
00219P 0123 96 00       A CLRWL   LDAA   M1
00220P 0125 C6 FF       A         LDAB   #$FF      1'S COMPLEMENT OF 0
00221P 0127 81 05       A         CMPA   #5        CHECK MODE
```

```
00222P 0129 27 10 013B            BEQ     CLRWL0    BRANCH IF MIXED MODE
00223P 012B 2E 18 0145            BGT     CLRWL1    BRANCH IF AUTOSCOPE
00224                      *                        OTHERWISE PRGM OR SCOPE MODE
00225P 012D F7 0000  A            STAB    BL8       BL(8) = 1'S COMPLEMENT OF 0
00226P 0130 7F 0000  A            CLR     DW8       DW(8),1 = DTO BLANK
00227P 0133 DE 00    A            LDX     BADS8     POINT TO TRACE 8 DATA
00228P 0135 86 02    A            LDAA    #2
00229P 0137 A7 00    A            STAA    JL1OFS,X  J(8,1) _ 2
00230P 0139 20 15 0150            BRA     CLRWL2
00231P 013B F7 0000  A  CLRWL0    STAB    BL6       BL(6) = 1'S COMPLEMENT OF 0
00232P 013E 7F 0000  A            CLR     DW6       DW(6),1 = DTO BLANK
00233P 0141 DE 00    A            LDX     BADS6     POINT TO TRACE 6 DATA
00234P 0143 20 0B 0150            BRA     CLRWL2
00235P 0145 F7 0000  A  CLRWL1    STAB    BL7       BL7(7) = 1'S COMPLEMENT OF 0
00236P 0148 F7 0000  A            STAB    BL9       BL(9) = 1'S COMPLEMENT OF 0
00237P 014B 7F 0000  A            CLR     DW7       DW(7),1 = DTO BLANK
00238P 014E DE 00    A            LDX     BADS7     POINT TO TRACE 7 DATA
00239P 0150 6F 00    A  CLRWL2    CLR     JL2OFS,X  J(X,2) = 0
00240P 0152 BD 0000  A            JSR     SPFLED    SET PASS/FAIL LED'S
00241P 0155 96 00    A            LDAA    M1
00242P 0157 81 03    A            CMPA    #3        IS M1 = 3? (IE. PROGRAM?)
00243P 0159 26 05 0160            BNE     CLRWL3    IF NOT...BRANCH
00244P 015B 86 10    A            LDAA    #16       DTO "P"
00245P 015D B7 0000  A            STAA    DW8       DW(8),1 = "P"

00247P 0160 39              CLRWL3 RTS              ...EXIT

00114                      *
00115                      * XMDR - IN XCRIBE MODE, DISPLAY "READ"
00116                      *
00117                      * FLOW PAGE 13B
00118                      *
00119P 0095 86 0D    A  XMDR      LDAA    #13
00120P 0097 BD 0000  A            JSR     MDWM2     MDW _ ALL " "
00121                      *                        MDW,6-9 _ "READ"
00122P 009A 86 01    A            LDAA    #1
00123P 009C 97 00    A            STAA    XM        XM _ 1
00124P 009E 97 00    A            STAA    X2        X2 _ 1
00125P 00A0 BD 0000  A            JSR     X2MDW     USE X2 TO SET MDW,12-16
00126P 00A3 86 16    A            LDAA    #22       PRESET FOR RCAP
00127P 00A5 D6 00    A            LDAB    FR4
00128P 00A7 C5 00    A            BITB    #AUX      IS AUX = 1?
00129P 00A9 27 02 00AD            BEQ     XMDR1     IF NOT...BRANCH
00130P 00AB 86 6C    A            LDAA    #108      RCAP _ 108
00131P 00AD B7 0000  A  XMDR1     STAA    RCAP      SET RCAP
00132P 00B0 39                    RTS

00026                      *
00027                      * SCNTE - SCAN TRIGGER ENABLE - PAGE 14A
00028                      *
00029P 0000 96 00    A  SCNTE     LDAA    M1
00030P 0002 81 06    A            CMPA    #6        IS M1 = 6? (IE. AUTOSCOPE?)
00031P 0004 26 11 0017            BNE     SCNTE0    IF NOT...BRANCH
00032P 0006 DE 00    A            LDX     BADS8     POINT TO TRACE(8)
00033P 0008 EE 00    A            LDX     JL4OFS,X
00034P 000A 9C 00    A            CPX     K4        IS K4 = J(8,4)?
00035P 000C 26 08 0016            BNE     SCNTEA    IF NOT...BRANCH
00036P 000E DE 00    A            LDX     BADS8     POINT TO TRACE(8)
00037P 0010 EE 00    A            LDX     JL5OFS,X
00038P 0012 9C 00    A            CPX     K5        IS K5 = J(8,5)?
00039P 0014 27 01 0017            BEQ     SCNTE0    IF YES...BRANCH
00040P 0016 39              SCNTEA RTS              ...ELSE EXIT 00042P 0017 BD 0000  A  SCNTE0    JSR     READSR    A _ SWITCH STATUS
00043P 001A 81 43    A            CMPA    #$43      TRIG ENABLE SINGLE?
00044P 001C 26 04 0022            BNE     SCNTE1    BRANCH IF NOT
00045                      *
00046P 001E C6 00    A            LDAB    #TES      TRIG EN SINGLE LED CODE
00047P 0020 20 06 0028            BRA     SCNTE2    SET TE AND CONTINUE
00048                      *
00049P 0022 81 44    A  SCNTE1    CMPA    #$44      TRIG EN CONT PRESSED?
00050P 0024 26 F0 0016            BNE     SCNTEA    EXIT IF NOT
```

```
00051P 0026 C6 00     A           LDAB    #TEC        TRIG EN CONT LED CODE
00052                          *
00053P 0028 BD 0000   A  SCNTE2   JSR     SLITE1      TURN ON TRIG EN LITE
00054P 002B 86 00     A           LDAA    #TE
00055P 002D BD 0000   A           JSR     SFLG1       TE _ 1
00056P 0030 C6 00     A           LDAB    #PASS+FAIL
00057P 0032 BD 0000   A           JSR     CLITE1      PASS = 0, FAIL = 0
00058                          *
00059P 0035 BD 00B3   P           JSR     USEK15      SET SCP FREQUENCY
00060P 0038 BD 0000   A  SCNTE9   JSR     STRIG       SET TRIGGER CIRCUITS
00061P 003B BD 01C8   P           JSR     CALFE       CALIBRATE FRONT END
00062                          *
00063P 003E CE 0000   A           LDX     #K15        POINT TO K15
00064P 0041 86 00     A           LDAA    #AT
00065P 0043 95 00     A           BITA    LITE1
00066P 0045 27 1A 0061            BEQ     SCNTE4      BRANCH IF AT=0
00067                          *
00068P 0047 86 00     A           LDAA    #ATS
00069P 0049 BD 0000   A           JSR     SFLG1       ATS _ 1
00070P 004C CE 0000   A           LDX     #K15
00071P 004F 86 02     A           LDAA    #2
00072P 0051 16                    TAB                 2*10**2 (PV2 NOTATION)
00073P 0052 BD 0000   A           JSR     CMPPV2
00074P 0055 2D 05 005C            BLT     SCNTE3      BRANCH IF 200 < K15
00075                          *
00076P 0057 BD 0000   A           JSR     STLFA       STORE TRACE AND EXIT
00077P 005A 20 3F 009B            BRA     SCNTE6
00078                          *
00079P 005C BD 0000   A  SCNTE3   JSR     STHFA       STORE TRACE AND EXIT
00080P 005F 20 3A 009B            BRA     SCNTE6
00081                          *
00082P 0061 96 00     A  SCNTE4   LDAA    K3
00083P 0063 D6 01     A           LDAB    K3+1        NOTE: K3 IS INT15*10
00084P 0065 BD 0000   A           JSR     SABL3X      ACCA,ACCB = K3*8
00085P 0068 36                    PSHA
00086P 0069 37                    PSHB                SAVE K3*8
00087P 006A DB 01     A           ADDB    VOS2+1
00088P 006C 99 00     A           ADCA    VOS2        ACCA,ACCB = K3*8+VOS2
00089P 006E C0 08     A           SUBB    #8
00090P 0070 82 00     A           SBCA    #0          ACCA,ACCB = K3*8+VOS2-8
00091P 0072 BD 0000   A           JSR     FEWUNP      SHIFT AND MASK AS APPROPRIATE
00092P 0075 97 00     A           STAA    FEW12       FEW1,2 _ BITS 11-6 OF K3*8+VOS2-8
00093P 0077 D7 00     A           STAB    FEW02       FEW0,2 _ BITS  5-0 OF K3*8+VOS2-8
00094P 0079 33                    PULB
00095P 007A 32                    PULA                RESTORE K3*8
00096P 007B DB 01     A           ADDB    VOS1+1
00097P 007D 99 00     A           ADCA    VOS1        ACCA,ACCB = K3*8+VOS1
00098P 007F CB 08     A           ADDB    #8
00099P 0081 89 00     A           ADCA    #0          ACCA,ACCB = K3*8+VOS1+8
00100P 0083 BD 0000   A           JSR     FEWUNP      SHIFT AND MASK AS APPROPRIATE
00101P 0086 97 00     A           STAA    FEW11       FEW1,1 _ BITS 11-6 OF K3*8+VOS1+8
00102P 0088 D7 00     A           STAB    FEW01       FEW0,1 _ BITS  5-0 OF K3*8+VOS1+8
00103P 008A 86 05     A           LDAA    #5
00104P 008C C6 02     A           LDAB    #2          5*10**2
00105P 008E BD 0000   A           JSR     CMPPV2
00106P 0091 2D 05 0098            BLT     SCNTE5      BRANCH IF 5*10**2 < K15
00107                          *
00108P 0093 BD 0000   A           JSR     STLFD       STORE TRACE ANC EXIT
00109P 0096 20 03 009B            BRA     SCNTE6
00110                          *
00111P 0098 BD 0000   A  SCNTE5   JSR     STHFD       STORE TRACE AND EXIT 00113P 009B 96 00     A  SCNTE6   LDAA    LITE1
00114P 009D 85 00     A           BITA    #TEC        IS TEC = 0?
00115P 009F 26 97 0038            BNE     SCNTE9      IF NOT...BRANCH
00116P 00A1 C6 00     A           LDAB    #TES
00117P 00A3 BD 0000   A           JSR     CLITE1      TES _ 0
00118P 00A6 86 00     A           LDAA    #TE
00119P 00A8 BD 0000   A           JSR     CFLG1       TE _ 0
00120P 00AB 96 00     A           LDAA    FEW2
00121P 00AD 8A 07     A           ORAA    #$07
```

```
00122P 00AF B7 0002  A           STAA    FEAD0+2    (FEAD2) _ FEW2 OR'D $07
00123                     *
00124P 00B2 39            SCNTEX  RTS                EXIT IF NO TE PRESSED
00126                     *
00127                     * USE K15 - PAGE 14B
00128                     *
00129P 00B3 BD 00D4  P USEK15 JSR     DETK15     DETERMINE K15
00130P 00B6 C6 10    A           LDAB    #$10
00131P 00B8 D0 01    A           SUBB    K15+1      B _ 10 HEX - EXP(K15)
00132P 00BA 96 00    A           LDAA    LITE1
00133P 00BC 85 00    A           BITA    #AT
00134P 00BE 27 02 00C2           BEQ     UK151
00135P 00C0 CB 20    A           ADDB    #$20       IF AT=1 THEN B _ B+20 HEX
00136P 00C2 96 00    A UK151  LDAA    K15
00137P 00C4 4A                   DECA
00138P 00C5 27 09 00D0           BEQ     UK153
00139P 00C7 4A                   DECA
00140P 00C8 27 04 00CE           BEQ     UK152
00141P 00CA CB 07    A           ADDB    #7         IF MSD(K15)=5 THEN B_B+7
00142P 00CC 20 02 00D0           BRA     UK153
00143P 00CE CB 0F    A UK152  ADDB    #15        IF MSD(K15)=2 THEN B_B+15
00144P 00D0 F7 0003  A UK153  STAB    FEAD0+3    (FEAD3) _ B
00145P 00D3 39                   RTS                EXIT USEK15
00147                     *
00148                     * DETK15 - DETERMINE K15
00149                     *
00150                     * FLOW PAGES 14C1 AND 14C2
00151                     *
00152P 00D4 86 03    A DETK15 LDAA    #3
00153P 00D6 D6 01    A           LDAB    K4+1       GET EXP(K4)
00154P 00D8 10                   SBA
00155P 00D9 58                   ASLB               MULTIPLY BY 2
00156P 00DA 10                   SBA                FF = 3-EXP(K4)*3

00158P 00DB D6 00    A           LDAB    K4
00159P 00DD C1 05    A           CMPB    #5         IS NUM(K4) = 5?
00160P 00DF 27 06 00E7           BEQ     DK15A      IF YES...BRANCH
00161P 00E1 4C                   INCA               FF = FF+1
00162P 00E2 C1 02    A           CMPB    #2         IS NUM(K4) = 2?
00163P 00E4 27 01 00E7           BEQ     DK15A      IF YES...BRANCH
00164P 00E6 4C                   INCA               FF = FF+1
00165P 00E7 97 00    A DK15A  STAA    FF         SET FF 00167P 00E9 C6 00    A           LDAB    #AT
00168P 00EB D5 00    A           BITB    LITE1      IS AT = 1?
00169P 00ED 27 10 00FF           BEQ     DK15C      IF NOT...BRANCH
00170P 00EF 81 09    A           CMPA    #9         IS FF < 9?
00171P 00F1 24 0C 00FF           BCC     DK15C      IF NOT...BRANCH
00172P 00F3 81 04    A           CMPA    #4         IS FF < 4?
00173P 00F5 25 02 00F9           BCS     DK15B      IF YES...BRANCH
00174P 00F7 86 04    A           LDAA    #4         FF = 8-4

00176P 00F9 8B 04    A DK15B  ADDA    #4         FF = FF+4
00177P 00FB 97 00    A           STAA    FF
00178P 00FD 20 27 0126           BRA     DK15I 00180P 00FF 96 00    A DK15C  LDAA    K5
00181P 0101 D6 01    A           LDAB    K5+1       NOTE: K5 IS INT15*10
00182P 0103 CE 0190  A           LDX     #400
00183P 0106 BD 0000  A           JSR     CMPIDX     IS K5 > 400?
00184P 0109 2F 05 0110           BLE     DK15E      IF NOT...BRANCH
00185P 010B 7A 0000  A           DEC     FF         FF = FF-1
00186P 010E 20 16 0126           BRA     DK15I 00188P 0110 CE 00C8  A DK15E  LDX     #200
00189P 0113 BD 0000  A           JSR     CMPIDX     IS K5 > 200?
00190P 0116 2E 0E 0126           BGT     DK15I      IF YES...BRANCH
00191P 0118 7C 0000  A           INC     FF         FF = FF+1
00192P 011B CE 0064  A           LDX     #100
00193P 011E BD 0000  A           JSR     CMPIDX     IS K5 > 100?
```

```
00194P 0121 2E 03 0126         BGT    DK15I     IF YES...BRANCH
00195P 0123 7C 0000  A         INC    FF        FF = FF+1

00197P 0126 CE 0100  A DK15I   LDX    #$0100
00198P 0129 DF 00    A         STX    K15       K15 = 1*10**0.
00199P 012B 96 00    A         LDAA   FF
00200P 012D 81 03    A DK15J   CMPA   #3        IS FF > 3?
00201P 012F 23 12 0143         BLS    DK15K     IF NOT...BRANCH
00202P 0131 80 03    A         SUBA   #3
00203P 0133 97 00    A         STAA   FF        FF = FF-3
00204P 0135 7C 0001  A         INC    K15+1     EXP(K15) = EXP(K15)+1
00205P 0138 D6 01    A         LDAB   K15+1
00206P 013A C1 08    A         CMPB   #8        IS EXP(K15) = 8?
00207P 013C 26 EF 012D         BNE    DK15J     IF NOT...BRANCH
00208P 013E CE 0005  A         LDX    #5        CMC = 5
00209P 0141 20 19 015C         BRA    DK15M 00211P 0143 CE 0001  A DK15K   LDX    #1        PRESET FOR CMC
00212P 0146 81 01    A         CMPA   #1        IS FF = 1?
00213P 0148 27 0F 0159         BEQ    DK15L2    IF YES...BRANCH
00214P 014A 81 02    A         CMPA   #2        IS FF = 2?
00215P 014C 27 03 0151         BEQ    DK15L     IF YES...BRANCH
00216P 014E 08                 INX              CMC = 2
00217P 014F 86 05    A         LDAA   #5
00218P 0151 97 00    A DK15L   STAA   K15       SET NUM(K15)
00219P 0153 D6 01    A         LDAB   K15+1
00220P 0155 C1 06    A         CMPB   #6        IS EXP(K15) > 6?
00221P 0157 2E 03 015C         BGT    DK15M     IF YES...BRANCH
00222P 0159 CE 0000  A DK15L2  LDX    #0        CMC = 0

00224P 015C DF 00    A DK15M   STX    CMC       SET CMC
00225P 015E CE 0000  A         LDX    #K4
00226P 0161 BD 0000  A         JSR    ENTPV2    ENTER K4
00227P 0164 CE 0000  A         LDX    #K15
00228P 0167 BD 0000  A         JSR    ENTPV2    ENTER K15
00229P 016A BD 0000  A         JSR    FLPMLT    MULTIPLY
00230P 016D CE 0005  A         LDX    #5
00231P 0170 BD 0000  A         JSR    ENTIDX    ENTER 5
00232P 0173 BD 0000  A         JSR    FLPDIV    DIVIDE
00233P 0176 CE 0000  A         LDX    #FM4
00234P 0179 BD 0000  A         JSR    SINT8     FM4 = K4*K15/5

00236P 017C 86 00    A         LDAA   #AT
00237P 017E 95 00    A         BITA   LITE1     IS AT = 1?
00238P 0180 26 0C 018E         BNE    DK15N     IF YES...BRANCH
00239P 0182 4F                 CLRA
00240P 0183 C6 18    A         LDAB   #24
00241P 0185 D0 01    A         SUBB   CMC+1
00242P 0187 92 00    A         SBCA   CMC
00243P 0189 97 00    A         STAA   CM
00244P 018B D7 01    A         STAB   CM+1      CM = 24-CMC
00245P 018D 39                 RTS              ...EXIT 00247P 018E 7F 0000  A DK15N   CLR    TEMP4
00248P 0191 D6 00    A         LDAB   FM4
00249P 0193 D7 01    A         STAB   TEMP4+1   SET UP FOR LATER COMPUTATION
00250P 0195 96 00    A         LDAA   K5
00251P 0197 D6 01    A         LDAB   K5+1      NOTE: K5 IS INT15*10
00252P 0199 CE 0064  A         LDX    #100
00253P 019C BD 0000  A         JSR    CMPIDX    IS K5 > 100?
00254P 019F 2E 0B 01AC         BGT    DK15O     IF YES...BRANCH 00256P 01A1 4F                 CLRA
00257P 01A2 C6 32    A         LDAB   #50
00258P 01A4 CE 0000  A         LDX    #TEMP4
00259P 01A7 BD 0000  A         JSR    MULT16    COMPUTE 50*FM4
00260P 01AA 20 0C 01B8         BRA    DK15P 00262P 01AC CE 0000  A DK15O   LDX    #TEMP4
```

```
00263P 01AF BD 0000  A            JSR    MULT16    FM4*K5
00264P 01B2 77 0000  A            ASR    SCRTCH
00265P 01B5 76 0001  A            ROR    SCRTCH+1  FM4*K5/2
00267P 01B8 86 04    A DK15P      LDAA   #$04
00268P 01BA 5F                    CLRB             NOTE: $0400 = 1024
00269P 01BB D0 01    A            SUBB   CMC+1
00270P 01BD 92 00    A            SBCA   CMC       ACCA, ACCB = 1022-CMC
00271P 01BF D0 01    A            SUBB   SCRTCH+1
00272P 01C1 92 00    A            SBCA   SCRTCH
00273P 01C3 97 00    A            STAA   CMC
00274P 01C5 D7 01    A            STAB   CMC+1     RESULT IN CMC
00275P 01C7 39                    RTS              ... EXIT
00277                      *
00278                      * CALFE - CALIBRATE FRONT END - PAGE 14H
00279                      *
00280P 01C8 96 00    A CALFE      LDAA   FEW2
00281P 01CA 8B 07    A            ADDA   #7
00282P 01CC B7 0002  A            STAA   FEAD0+2   FEAD2 _ FEW2+7
00283P 01CF CE 0000  A            LDX    #FEAD8
00284P 01D2 DF 00    A            STX    AD        AD _ #FEAD8
00285P 01D4 BD 0000  A            JSR    DIGINO    DIGITIZE INPUT OFFSET
00286P 01D7 DE 00    A            LDX    W1
00287P 01D9 DF 00    A            STX    VOS1      VOS1 _ W1
00288                      *
00289P 01DB CE 0001  A            LDX    #FEAD8+1
00290P 01DE DF 00    A            STX    AD        AD _ #FEAD9
00291P 01E0 BD 0000  A            JSR    DIGINO    DIGITIZE INPUT OFFSET
00292P 01E3 DE 00    A            LDX    W1
00293P 01E5 DF 00    A            STX    VOS2      VOS2 _ W1
00294                      *
00295P 01E7 96 00    A            LDAA   K8
00296P 01E9 81 03    A            CMPA   #3
00297P 01EB 22 0C 01F9            BHI    CALFE2    BRANCH IF K8 > 3
00298P 01ED 27 5C 024B            BEQ    CALFE4    EXIT IF K8 = 3
00299                      *
00300P 01EF CE 0003  A            LDX    #FEAD8+3
00301P 01F2 DF 00    A            STX    AD        AD _ #FEAD11
00302P 01F4 BD 0000  A            JSR    DIGINO    DIGITIZE INPUT OFFSET
00303P 01F7 20 08 0201            BRA    CALFE3
00304                      *
00305P 01F9 CE 0002  A CALFE2     LDX    #FEAD8+2
00306P 01FC DF 00    A            STX    AD        AD _ #FEAD10
00307P 01FE BD 0000  A            JSR    DIGINO    DIGITIZE INPUT OFFSET
00308                      *
00309P 0201 96 00    A CALFE3     LDAA   K7
00310P 0203 D6 01    A            LDAB   K7+1      ACCA, ACCB _ K7*10
00311P 0205 CE 004C  A            LDX    #76
00312P 0208 DF 00    A            STX    TEMP4
00313P 020A CE 0000  A            LDX    #TEMP4
00314P 020D BD 0000  A            JSR    MULT16    RESULT = 760*K7
00315P 0210 CE 000A  A            LDX    #10
00316P 0213 DF 00    A            STX    TEMP4
00317P 0215 CE 0000  A            LDX    #TEMP4
00318P 0218 BD 0000  A            JSR    DIV16     RESULT = 76*K7
00319P 021B 97 00    A            STAA   TEMP4
00320P 021D D7 01    A            STAB   TEMP4+1   SAVE RESULT
00321P 021F D6 01    A            LDAB   SCRTCH+1  GET ABSOLUTE VALUE OF REMAINDER
00322P 0221 C1 04    A            CMPB   #4
00323P 0223 2F 0E 0233            BLE    CLF3B     BRANCH IF NO ROUNDING NEEDED
00324P 0225 4D                    TSTA             WAS QUOTIENT NEGATIVE?
00325P 0226 2B 05 022D            BMI    CLF3A     IF YES...BRANCH
00326P 0228 4F                    CLRA
00327P 0229 C6 01    A            LDAB   #1        SET UP TO ROUND UP
00328P 022B 20 08 0235            BRA    CLF3C 00330P 022D 86 FF    A CLF3A      LDAA   #$FF
00331P 022F C6 FF    A            LDAB   #-1       SET UP FOR NEGATIVE ROUND
00332P 0231 20 02 0235            BRA    CLF3C 00334P 0233 4F              CLF3B CLRA
```

```
00335P 0234 5F                    CLRB              NO ROUNDING 00337P 0235 DB 01     A CLF3C    ADDB    TEMP4+1
00338P 0237 99 00     A          ADCA    TEMP4     ROUND AS NEEDED 00340P 0239 DB 01     A          ADDB    W1+1
00341P 023B 99 00     A          ADCA    W1        ACCA,ACCB _ (80*K7+W1)
00342P 023D BD 0000   A          JSR     FEWUNP    UNPACK BITS FOR FRONT END
00343P 0240 97 00     A          STAA    FEW13     FEW1,3 _ (80*K7+W1) BITS 11-6
00344P 0242 D7 00     A          STAB    FEW03     FEW0,3 _ (80*K7+W1) BITS 5-0
00345P 0244 96 00     A          LDAA    FEW2
00346P 0246 8B 0F     A          ADDA    #$0F
00347P 0248 B7 0002   A          STAA    FEAD0+2   (FEAD2) _ FEW2 + $0F
00348P 024B 39          CALFE4   RTS               EXIT CALFE

00024                           *
00025                           * DIGINO - DIGITIZE INPUT OFFSET - PAGE 14I
00026                           *
00027P 0000 CE 0827   A DIGINO   LDX     #$0827    PRESET FOR W1
00028P 0003 96 00     A          LDAA    K6        IS K6 = 0?
00029P 0005 26 03 000A           BNE    DIO0       IF NOT...BRANCH
00030P 0007 CE 07D8   A          LDX     #$07D8    W1 = $07D8

00032P 000A DF 00     A DIO0     STX     W1        SET W1

00034P 000C 96 00     A DIO1     LDAA    FEW2
00035P 000E B7 0002   A          STAA    FEAD0+2   (FEAD2) _ FEW2
00036P 0011 96 00     A          LDAA    W1
00037P 0013 D6 01     A          LDAB    W1+1
00038P 0015 BD 0000   A          JSR     FEWUNP    UNPACK FOR FRONT END
00039P 0018 B7 0001   A          STAA    FEAD0+1   (FEAD1) _ W1(11-6)
00040P 001B F7 0000   A          STAB    FEAD0     (FEAD0) _ W1(5-0)
00041P 001E CE 0001   A          LDX     #1
00042P 0021 BD 0000   A          JSR     DELAY     DELAY ABOUT 100 MICROSECONDS
00043P 0024 96 00     A          LDAA    FEW2
00044P 0026 8B 07     A          ADDA    #7
00045P 0028 B7 0002   A          STAA    FEAD0+2   (FEAD2) _ FEW2+7
00046P 002B CE 0004   A          LDX     #4
00047P 002E BD 0000   A          JSR     DELAY     DELAY ABOUT 300 MICROSECONDS
00048P 0031 96 00     A          LDAA    AD
00049P 0033 D6 01     A          LDAB    AD+1
00050P 0035 CE 0001   A          LDX     #FEAD8+1  GET ADDR(FEAD9)
00051P 0038 BD 0000   A          JSR     CMPIDX    IS AD > #FEAD9?
00052P 003B 22 03 0040           BHI    DIO1A      IF YES...BRANCH
00053P 003D 7F 0007   A          CLR     FEAD0+7   (FEAD7) _ 0

00055P 0040 DE 00     A DIO1A    LDX     AD
00056P 0042 A6 00     A          LDAA    0,X       GET BYTE POINTED TO BY "AD"
00057P 0044 D6 00     A          LDAB    K6        IS K6 = 0?
00058P 0046 26 14 005C           BNE    DIO2       IF NOT...BRANCH
00059P 0048 85 80     A          BITA    #$80      IS [AD] BIT 7 = 0?
00060P 004A 27 24 0070           BEQ    DIO3       IF YES...BRANCH
00061P 004C DE 00     A          LDX     W1
00062P 004E 08                   INX
00063P 004F DF 00     A          STX     W1        W1 _ W1 + 1
00064P 0051 86 08     A          LDAA    #$08
00065P 0053 C6 26     A          LDAB    #$26
00066P 0055 BD 0000   A          JSR     CMPIDX    IS $0826 < W1?
00067P 0058 24 B2 000C           BCC    DIO1       IF NOT...BRANCH
00068P 005A 20 28 0084           BRA    DIO4

00070P 005C 85 80     A DIO2     BITA    #$80      IS [AD] BIT 7 = 0?
00071P 005E 26 10 0070           BNE    DIO3       IF NOT...BRANCH
00072P 0060 DE 00     A          LDX     W1
00073P 0062 09                   DEX
00074P 0063 DF 00     A          STX     W1        W1 _ W1 - 1
00075P 0065 86 07     A          LDAA    #$07
00076P 0067 C6 D9     A          LDAB    #$D9
00077P 0069 BD 0000   A          JSR     CMPIDX    IS $07D9 > W1?
00078P 006C 23 9E 000C           BLS    DIO1       IF NOT...BRANCH
00079P 006E 20 14 0084           BRA    DIO4

00081P 0070 86 07     A DIO3     LDAA    #$07
```

```
00082P 0072 C6 D8    A          LDAB    #$D8
00083P 0074 DE 00    A          LDX     W1
00084P 0076 BD 0000  A          JSR     CMPIDX   IS $07D8 < W1?
00085P 0079 24 09 0084          BCC     DIO4     IF NOT...BRANCH
00086P 007B 86 08    A          LDAA    #$08
00087P 007D C6 27    A          LDAB    #$27
00088P 007F BD 0000  A          JSR     CMPIDX   IS $0827 > W1?
00089P 0082 22 08 008C          BHI     DIO5     IF YES...BRANCH AND EXIT 00091P 0084 86 01    A DIO4     LDAA    #1
00092P 0086 B7 0000  A          STAA    DIM      DIM _ 1
00093P 0089 7E 0000  A          JMP     DSPDIM   DISPLAY DIM ... AND EXIT 00095P 008C 39          DIO5    RTS              ... EXIT
00097                           *
00098                           * STRIG - SET TRIGGER CIRCUITS, DETERMINE TDC
00099                           *
00100                           * PAGE 14K
00101                           *
00102P 008D 96 00    A STRIG    LDAA    K8
00103P 008F 81 03    A          CMPA    #3
00104P 0091 22 12 00A5          BHI     STRIG2   BRANCH IF K8 > 3
00105P 0093 96 00    A          LDAA    K8
00106P 0095 81 03    A          CMPA    #3
00107P 0097 2D 06 009F          BLT     STRIG1   BRANCH IF K8 < 3
00108P 0099 86 06    A          LDAA    #6
00109P 009B 97 00    A          STAA    FEW4     FEW4 _ 6
00110P 009D 20 10 00AF          BRA     STRIG4
00111                           *
00112P 009F 86 02    A STRIG1   LDAA    #2
00113P 00A1 97 00    A          STAA    FEW4     FEW4 _ 2
00114P 00A3 20 03 00A8          BRA     STRIG3
00115                           *
00116P 00A5 7F 0000  A STRIG2   CLR     FEW4     FEW4 _ 0
00117                           *
00118P 00A8 96 00    A STRIG3   LDAA    K6
00119P 00AA 26 03 00AF          BNE     STRIG4   BRANCH IF K6=1
00120P 00AC 7C 0000  A          INC     FEW4     FEW4 _ FEW4+1
00121                           *
00122P 00AF 96 00    A STRIG4   LDAA    FEW4
00123P 00B1 B7 0004  A          STAA    FEAD0+4  (FEAD4) _ FEW4
00124P 00B4 96 00    A          LDAA    LITE1
00125P 00B6 85 00    A          BITA    #AT
00126P 00B8 26 05 00BF          BNE     STRIG5   BRANCH IF AT=1
00127P 00BA BD 0101  P          JSR     DK16     DETERMINE K16
00128P 00BD 20 33 00F2          BRA     STRIG7

00020                           *
00021                           * UFE - UPDATE FRONT END
00022                           *
00023                           * FLOW PAGE 14Q
00024                           *
00025P 0000 CE 0000  A UFE      LDX     #FEAD0
00026P 0003 96 00    A          LDAA    FEW2
00027P 0005 8B 08    A          ADDA    #8
00028P 0007 97 00    A          STAA    Q        Q = FEW2+8
00029P 0009 A7 02    A          STAA    2,X      (FEAD2) = Q
00030P 000B 96 00    A          LDAA    H
00031P 000D 81 06    A          CMPA    #6
00032P 000F 27 4D 005E          BEQ     UFE60    BRANCH IF H = 6
00033P 0011 81 05    A          CMPA    #5
00034P 0013 27 3F 0054          BEQ     UFE50    BRANCH IF H = 5
00035P 0015 81 04    A          CMPA    #4
00036P 0017 27 2C 0045          BEQ     UFE40    BRANCH IF H = 4
00037P 0019 81 03    A          CMPA    #3
00038P 001B 27 1E 003B          BEQ     UFE30    BRANCH IF H = 3
00039P 001D 81 02    A          CMPA    #2
00040P 001F 27 0A 002B          BEQ     UFE20    BRANCH IF H = 2
00041                           *        ASSUME H = 1
00042P 0021 96 00    A          LDAA    FEW13
00043P 0023 A7 01    A          STAA    1,X      (FEAD1) = FEW1,3
```

```
0044P 0025 96 00     A          LDAA    FEW03
0045P 0027 A7 00     A          STAA    0,X       (FEAD0) = FEW 0,3
0046P 0029 20 3B 0066           BRA     UFE70
0047P 002B 96 00     A  UFE20   LDAA    Q         H = 2
0048P 002D 8B 04     A          ADDA    #4
0049P 002F 97 00     A          STAA    Q         Q = Q+4
0050P 0031 A7 02     A          STAA    2,X       (FEAD2) = Q
0051P 0033 96 00     A          LDAA    N
0052P 0035 81 02     A          CMPA    #2        IS N = 2?
0053P 0037 27 0C 0045           BEQ     UFE40     IF YES...BRANCH
0054P 0039 20 2B 0066           BRA     UFE70
0055P 003B 96 00     A  UFE30   LDAA    FEW11     H = 3
0056P 003D A7 01     A          STAA    1,X       (FEAD1) = FEW 1,1
0057P 003F 96 00     A          LDAA    FEW01
0058P 0041 A7 00     A          STAA    0,X       (FEAD0) = FEW 0,1
0059P 0043 20 21 0066           BRA     UFE70
0060P 0045 96 00     A  UFE40   LDAA    Q         H = 4
0061P 0047 4C                   INCA
0062P 0048 97 00     A          STAA    Q         Q = Q+1
0063P 004A A7 02     A          STAA    2,X       (FEAD2) = Q
0064P 004C 96 00     A          LDAA    N
0065P 004E 81 04     A          CMPA    #4        IS N = 4?
0066P 0050 27 0C 005E           BEQ     UFE60     IF YES...BRANCH
0067P 0052 20 12 0066           BRA     UFE70
0068P 0054 96 00     A  UFE50   LDAA    FEW12     H = 5
0069P 0056 A7 01     A          STAA    1,X       (FEAD1) = FEW 1,2
0070P 0058 96 00     A          LDAA    FEW02
0071P 005A A7 00     A          STAA    0,X       (FEAD0) = FEW 0,2
0072P 005C 20 08 0066           BRA     UFE70
0073P 005E 96 00     A  UFE60   LDAA    Q         H = 6
0074P 0060 8B 02     A          ADDA    #2
0075P 0062 97 00     A          STAA    Q         Q = Q+2
0076P 0064 A7 02     A          STAA    2,X       (FEAD2) = Q
0077P 0066 96 00     A  UFE70   LDAA    H
0078P 0068 81 30     A          CMPA    N         IS H = 4?
0079P 006A 27 03 006F           BEQ     UFE72     IF YES...BRANCH
0080P 006C 4C                   INCA              H = H+1
0081P 006D 20 02 0071           BRA     UFE73
0082P 006F 86 01     A  UFE72   LDAA    #1        H = 1
0083P 0071 97 00     A  UFE73   STAA    H
0084P 0073 39                   RTS               EXIT 00025
00026                     * STHFA - STORE HIGH FREQUENCY ANALOG TRACE AND
00027                     *         SET DISPLAY BITS
00028                     *
00029                     * FLOW PAGE 14U1
00030                     *
00031P 0000 8D 18 001A STHFA    BSR     SHFAV     SET HF ANALOG VARIABLES
00032P 0002 BD 0084  P          JSR     SHFAU     SET HF ANALOG UPPER RASTER
00033                     *                       VARIABLES
00034P 0005 BD 00C2  P STHFA1   JSR     LASTD     LEAPFROG, ARM = 1, THEN SET
00035                     *                         TRIGGER DELAY COUNTER
00036P 0008 BD 0000  A          JSR     UAATRT    UPDATE, ARM, AUTO-TRIGGER,
00037                     *                       RETURN ON EOS
00038P 000B 96 00    A          LDAA    FR1
00039P 000D 85 00    A          BITA    #TE       IS TRIGGER ENABLE RESET?
00040P 000F 27 08 0019          BEQ     STHFA3    IF YES...BRANCH
00041P 0011 BD 0000  A          JSR     SHFAD     SET 200 HF ANALOG DISPLAY BITS
00042P 0014 7A 0000  A          DEC     RAS       RAS = RAS-1
00043P 0017 26 EC 0005          BNE     STHFA1    BRANCH IF RAS <> 0
00044P 0019 39           STHFA3 RTS              ... EXIT
```

```
00046                          *
00047                          * SHFAV - SET HIGH FREQUENCY ANALOG VARIABLES
00048                          *
00049                          * FLOW PAGE 14U2
00050                          *
00051P 001A BD 0000  A SHFAV   JSR    SHFDV      SET HF TRACE VARIABLES
00052P 001D 86 00    A         LDAA   #0
00053P 001F 97 00    A         STAA   BX         BX = 0
00054P 0021 86 06    A         LDAA   #6
00055P 0023 97 00    A         STAA   N          N = 6
00056P 0025 CE 004E  A         LDX    #78
00057P 0028 DF 00    A         STX    TEMP3
00058P 002A CE 0000  A         LDX    #TEMP3
00059P 002D 4F               CLRA
00060P 002E D6 00    A         LDAB   A3         NOTE: A3 IS INT8*2
00061P 0030 BD 0000  A         JSR    MULT16
00062P 0033 DE 00    A         LDX    SCRTCH
00063P 0035 DF 00    A         STX    TEMP3      TEMP3 = 156*A3
00064P 0037 86 50    A         LDAA   #80
00065P 0039 D6 00    A         LDAB   A2
00066P 003B BD 0000  A         JSR    MULT8
00067P 003E DB 01    A         ADDB   TEMP3+1
00068P 0040 99 00    A         ADCA   TEMP3      ACCA,ACCB = 80*A2+156*A3
00069P 0042 97 00    A         STAA   TEMP
00070P 0044 D7 01    A         STAB   TEMP+1     SAVE 80*A2+156*A3
00071P 0046 DB 01    A         ADDB   VOS1+1
00072P 0048 99 00    A         ADCA   VOS1
00073P 004A B7 0000  A         STAA   WFL
00074P 004D F7 0001  A         STAB   WFL+1      WFL = 80*A2+156*A3+VOS1
00075P 0050 D6 00    A         LDAB   A3         NOTE: A3 IS INT8*2
00076P 0052 58                 ASLB
00077P 0053 58                 ASLB
00078P 0054 4F                 CLRA              ACCA,ACCB = 8*A3
00079P 0055 DB 01    A         ADDB   TEMP+1
00080P 0057 99 00    A         ADCA   TEMP
00081P 0059 DB 01    A         ADDB   VOS2+1
00082P 005B 99 00    A         ADCA   VOS2
00083P 005D DB 00    A         ADDB   BX
00084P 005F 89 00    A         ADCA   #0         ADD BX
00085P 0061 B7 0000  A         STAA   WFH
00086P 0064 F7 0001  A         STAB   WFH+1      WFH = 80*A2+164*A3+VOS2+BX
00087P 0067 96 00    A         LDAA   A3         NOTE: A3 IS INT8*2
00088P 0069 48                 ASLA
00089P 006A 48                 ASLA
00090P 006B 48                 ASLA
00091P 006C 9B 00    A         ADDA   BX
00092P 006E B7 0000  A         STAA   INC        INC = 16*A3+BX
00093P 0071 96 01    A         LDAA   K15+1
00094P 0073 81 04    A         CMPA   #4         IS EXP(K15) > 4?
00095P 0075 2F 0C 0083         BLE    SHFAV6     IF NOT...BRANCH
00096P 0077 96 00    A         LDAA   TDC
00097P 0079 D6 01    A         LDAB   TDC+1
00098P 007B D0 01    A         SUBB   CMC+1
00099P 007D 92 00    A         SBCA   CMC
00100P 007F 97 00    A         STAA   TDC
00101P 0081 D7 01    A         STAB   TDC+1      TDC = TDC-CMC
00102P 0083 39         SHFAV6 RTS
00104                          *
00105                          * SHFAU - SET HIGH FREQUENCY ANALOG UPPER RASTER
00106                          *            VARIABLES
00107                          *
00108                          * FLOW PAGE 14U3
00109                          *
00110P 0084 FE 0000  A SHFAU   LDX    WFL
00111P 0087 FF 0000  A         STX    WF1        WF1 = WFL
00112P 008A FE 0000  A         LDX    WFH
00113P 008D FF 0000  A         STX    WF2        WF2 = WFH
00114P 0090 CE 0000  A         LDX    #BAAD
00115P 0093 FF 0000  A         STX    AAD        AAD = #BAAD
00116P 0096 86 00    A         LDAA   #LFROG
```

```
 0117P 0098 BD 0000   A           JSR    CFLG1       LFROG = 0
 0118P 009B 86 27     A           LDAA   #39
 0119P 009D B7 0000   A           STAA   RAS         RAS = 39
 0120P 00A0 B6 0000   A           LDAA   WF1
 0121P 00A2 F6 0001   A           LDAB   WF1+1
 0122P 00A6 BD 0128   P           JSR    LASTD4      OBTAIN APPROPRIATE BITS FROM WF1
 0123P 00A9 97 00     A           STAA   FEW11       FEW 1,1 = WF1 BITS 11-6
 0124P 00AB D7 00     A           STAB   FEW01       FEW 0,1 = WF1 BITS 5-0
 0125P 00AD 7F 0000   A           CLR    ADW         ADW = 0

0127P 00B0 86 07     A           LDAA   #7          PRESET ACCA FOR BL
 0128P 00B2 D6 00     A           LDAB   FM4
 0129P 00B4 27 09 00BF            BEQ    SHFAU2      BRANCH IF FM4 = 0
 0130P 00B6 C1 02     A           CMPB   #2
 0131P 00B8 22 05 00BF            BHI    SHFAU2      BRANCH IF FM4 > 2
 0132P 00BA 27 02 00BE            BEQ    SHFAU1      BRANCH IF FM4 = 2
 0133                          *                     ... ELSE FM4 = 1
 0134P 00BC 80 02     A           SUBA   #2
 0135P 00BE 4A              SHFAU1 DECA 0137P 00BF 97 00     A   SHFAU2  STAA   BL          SET BL
 0138P 00C1 39                    RTS                ... EXIT
 0140                          *
 0141                          * LASTD - LEAPFROG, ARM = 1,
 0142                          *         THEN SET TRIGGER DELAY COUNTER
 0143                          *
 0144                          * FLOW PAGE 14U4
 0145                          *
 0146P 00C2 86 00     A   LASTD   LDAA   #LFROG
 0147P 00C4 BD 0000   A           JSR    CHFLG1      FLIP (OR FLOP) LFROG
 0148P 00C7 C5 00     A           BITB   #LFROG      IS NEW SETTING OF LFROG = 0?
 0149P 00C9 26 0C 00D7            BNE    LASTD1      IF NOT...BRANCH
 0150P 00CB CE 0000   A           LDX    #WF1
 0151P 00CE 8D 4A 011A            BSR    LASTD3      WF1 = WF1-INC
 0152P 00D0 CE 0000   A           LDX    #WF2
 0153P 00D3 8D 5C 0131            BSR    LASTD5      WF2 = WF2+BX
 0154P 00D5 20 0A 00E1            BRA    LASTD2

0156P 00D7 CE 0000   A   LASTD1  LDX    #WF2
 0157P 00DA 8D 3E 011A            BSR    LASTD3      WF2 = WF2-INC
 0158P 00DC CE 0000   A           LDX    #WF1
 0159P 00DF 8D 50 0131            BSR    LASTD5      WF1 = WF1+BX 0161P 00E1 B6 0000   A   LASTD2  LDAA   WF1
 0162P 00E4 F6 0001   A           LDAB   WF1+1       GET WF1
 0163P 00E7 8D 3F 0128            BSR    LASTD4      SHIFT BITS AS NECESSARY
 0164P 00E9 97 00     A           STAA   FEW11       FEW 1,1 = WF1 BITS 11-6
 0165P 00EB D7 00     A           STAB   FEW01       FEW 0,1 = WF1 BITS 5-0
 0166P 00ED B6 0000   A           LDAA   WF2
 0167P 00F0 F6 0001   A           LDAB   WF2+1       GET WF2
 0168P 00F3 8D 33 0128            BSR    LASTD4      SHIFT BITS AS NECESSARY
 0169P 00F5 97 00     A           STAA   FEW12       FEW 1,2 = WF2 BITS 11-6
 0170P 00F7 D7 00     A           STAB   FEW02       FEW 0,2 = WF2 BITS 5-0
 0171P 00F9 96 00     A           LDAA   FEW4
 0172P 00FB 8B 08     A           ADDA   #8
 0173P 00FD B7 0004   A           STAA   FEAD0+4     (FEAD4) = FEW4+8
 0174P 0100 96 01     A           LDAA   TDC+1
 0175P 0102 B7 0005   A           STAA   FEAD0+5     (FEAD5) = TDC BITS 7-0
 0176P 0105 96 00     A           LDAA   TDC
 0177P 0107 B7 0006   A           STAA   FEAD0+6     (FEAD6) = TDC BITS 15-8
 0178P 010A DE 00     A           LDX    T5
 0179P 010C FF 0000   A           STX    T6          T6 = T5
 0180P 010F FE 0000   A           LDX    T7
 0181P 0112 FF 0000   A           STX    T8          T8 = T7
 0182P 0115 DE 00     A           LDX    CMC
 0183P 0117 DF 00     A           STX    CM          CM = CMC
 0184P 0119 39                    RTS 0186P 011A E6 01     A   LASTD3  LDAB   1,X
 0187P 011C F0 0000   A           SUBB   INC
 0188P 011F E7 01     A           STAB   1,X
```

```
00189P 0121 A6 00    A           LDAA   0,X
00190P 0123 82 00    A           SBCA   #0            SUBTRACT INC
00191P 0125 A7 00    A           STAA   0,X
00192P 0127 39                   RTS                  ...RETURN 00194P 0128 58           LASTD4  ASLB
00195P 0129 49                   ROLA
00196P 012A 58                   ASLB
00197P 012B 49                   ROLA
00198P 012C 54                   LSRB
00199P 012D 54                   LSRB
00200P 012E 84 3F    A           ANDA   #%00111111
00201P 0130 39                   RTS 00203P 0131 E6 01    A   LASTD5  LDAB   1,X
00204P 0133 DB 00    A           ADDB   BX
00205P 0135 E7 01    A           STAB   1,X
00206P 0137 A6 00    A           LDAA   0,X
00207P 0139 89 00    A           ADCA   #0            ADD IN BX
00208P 013B A7 00    A           STAA   0,X
00209P 013D 39                   RTS                  ...RETURN

00022                    *
00023                    * SHFAD - SET 100 HIGH FREQUENCY ANALOG DISPLAY BITS
00024                    *
00025                    * FLOW PAGE 14U5
00026                    *
00027P 0000 96 01    A   SHFAD   LDAA   K15+1
00028P 0002 81 04    A           CMPA   #4            IS EXP(K15) > 4?
00029P 0004 2E 08 000E          BGT    SHFAD1        IF YES...BRANCH
00030                    *
00031P 0006 DE 00    A           LDX    CM            SET INDEX
00032P 0008 7F 0007  A   SHFAD0  CLR    FEAD0+7       (FEAD7) _ 0
00033P 000B 09                   DEX                  INDEX _ INDEX-1
00034P 000C 26 FA 0008           BNE    SHFAD0        LOOP TILL INDEX = 0
00035                    *
00036P 000E 7F 0000  A   SHFAD1  CLR    CF2           CF2 = 0
00037P 0011 86 C8    A           LDAA   #200          BP _ 200
00038P 0013 97 00    A           STAA   BP 00040P 0015 96 00    A   SHFAD2  LDAA   CF2
00041P 0017 9B 00    A           ADDA   FM4
00042P 0019 97 00    A           STAA   CF2           CF2 = CF2+FM4
00043P 001B 0C                   CLC
00044P 001C 07                   TPA                  SAVE CARRY 00046P 001D 7F 0007  A   SHFAD3  CLR    FEAD0+7       (FEAD7) _ 0
00047P 0020 06                   TAP                  RESTORE CARRY VALUE
00048P 0021 8D 61 0084           BSR    SHFADX        DECIDE WHETHER TO SET CARRY OR NOT
00049P 0023 07                   TPA                  SAVE CARRY
00050P 0024 D6 00    A           LDAB   CF2
00051P 0026 C0 04    A           SUBB   #4
00052P 0028 D7 00    A           STAB   CF2           CF2 = CF2-4
00053P 002A 2E F1 001D           BGT    SHFAD3        BRANCH IF CF2 > 0
00054P 002C 06                   TAP                  RESTORE CARRY VALUE
00055P 002D 79 0000  A           ROL    ADW
00056                    *
00057P 0030 96 00    A           LDAA   BL
00058P 0032 26 12 0046           BNE    SHFAD4        BRANCH IF BL <> 0
00059P 0034 FE 0000  A           LDX    AAD           IF BL = 0 THEN
00060P 0037 A6 00    A           LDAA   X
00061P 0039 BA 0000  A           ORAA   ADW
00062P 003C A7 00    A           STAA   X             ...(AAD) _ (AAD) OR'D ADW
00063P 003E 08                   INX
00064P 003F FF 0000  A           STX    AAD           ...AAD _ AAD+1
00065P 0042 86 08    A           LDAA   #8
00066P 0044 97 00    A           STAA   BL            ...BL _ 8
00067                    *
00068P 0046 7A 0000  A   SHFAD4  DEC    BL            BL _ BL-1
00069P 0049 7A 0000  A           DEC    BP            BP _ BP-1
00070P 004C 96 00    A           LDAA   FM4
```

```
00071P 004E 81 02       A              CMPA    #2           IS FM4 = 2?
00072P 0050 27 1D 006F                 BEQ     SHFAD5       IF YES...BRANCH
00073P 0052 81 01       A              CMPA    #1           IS FM4 = 1?
00074P 0054 26 28 007E                 BNE     SHFAD7       IF NOT...BRANCH
00075P 0056 C6 03       A              LDAB    #3
00076P 0058 96 00       A              LDAA    BL
00077P 005A 10                         SBA
00078P 005B 97 00       A              STAA    BL           BL = BL-3
00079P 005D 96 00       A              LDAA    BP
00080P 005F 10                         SBA
00081P 0060 97 00       A              STAA    BP           BP = BP-3
00082P 0062 96 00       A              LDAA    CF2
00083P 0064 1B                         ABA
00084P 0065 97 00       A              STAA    CF2          CF2 = CF2+3
00085P 0067 78 0000     A              ASL     ADW
00086P 006A 78 0000     A              ASL     ADW          SHIFT ADW LEFT 2 BITS
00087P 006D 20 0C 007B                 BRA     SHFAD6
00088P 006F 7A 0000     A SHFAD5       DEC     BL           BL _ BL-1
00089P 0072 7A 0000     A              DEC     BP           BP _ BP-1
00090P 0075 7C 0000     A              INC     CF2
00091P 0078 7C 0000     A              INC     CF2          CF2 = CF2+2
00092P 007B 78 0000     A SHFAD6       ASL     ADW          SHIFT ADW 1 BIT LEFT
00093P 007E 96 00       A SHFAD7       LDAA    BP           IS BP = 0?
00094P 0080 26 93 0015                 BNE     SHFAD2       IF NOT...LOOP
00095P 0082 39                         RTS                  EXIT SHFAD 00097P 0083 0C            SHFADA       CLC                  INITIALIZE CARRY TO 0
00098P 0084 F6 0000     A SHFADX       LDAB    FEAD8
00099P 0087 C5 20       A              BITB    #$20
00100P 0089 26 0F 009A                 BNE     SHFADD       BRANCH IF (FEAD8),5 = 1
00101P 008B C5 10       A              BITB    #$10
00102P 008D 27 06 0095                 BEQ     SHFADB       BRANCH IF (FEAD8),4 = 0
00103P 008F C5 08       A              BITB    #8
00104P 0091 26 06 0099                 BNE     SHFADC       BRANCH IF (FEAD8),3 = 1
00105P 0093 20 13 00A8                 BRA     SHFADF       BRANCH IF (FEAD8),3 = 0
00106P 0095 C5 04       A SHFADB       BITB    #4
00107P 0097 27 0F 00A8                 BEQ     SHFADF       BRANCH IF (FEAD8),2 = 0
00108P 0099 39            SHFADC       RTS                  EXIT DECISION SUBROUTINE
00109                     *
00110P 009A C5 10       A SHFADD       BITB    #$10
00111P 009C 27 06 00A4                 BEQ     SHFADE       BRANCH IF (FEAD8),4 = 0
00112P 009E C5 01       A              BITB    #1
00113P 00A0 26 F7 0099                 BNE     SHFADC       BRANCH IF (FEAD8),0 = 1
00114P 00A2 20 04 00A8                 BRA     SHFADF       BRANCH IF (FEAD8),0 = 0
00115P 00A4 C5 02       A SHFADE       BITB    #2
00116P 00A6 26 F1 0099                 BNE     SHFADC       BRANCH IF (FEAD8),1 = 1
00117P 00A8 0D            SHFADF       SEC
00118P 00A9 39                         RTS                  EXIT DECISION SUBROUTINE
00120                     *
00121                     * UAATRT - UPDATE, ARM, AUTO-TRIGGER,
00122                     *          RETURN ON EOS
00123                     *
00124                     * FLOW PAGE 14U6
00125                     *
00126P 00AA BD 0000     A UAATRT       JSR     UFE          UPDATE FRONT END
00127P 00AD FE 0000     A              LDX     T6           IS T6 = 0?
00128P 00B0 26 2A 00DC                 BNE     UATRT3       IF NOT...BRANCH
00129P 00B2 96 00       A              LDAA    FEW4
00130P 00B4 B7 0004     A              STAA    FEAD0+4      (FEAD4) = FEW4
00131P 00B7 D6 00       A              LDAB    K8
00132P 00B9 C1 01       A              CMPB    #1           IS 1 < K8?
00133P 00BB 23 17 00D4                 BLS     UATRT2       IF NOT...BRANCH
00134P 00BD C1 05       A              CMPB    #5           IS K8 < 5?
00135P 00BF 24 13 00D4                 BCC     UATRT2       IF NOT...BRANCH
00136P 00C1 FE 0000     A              LDX     T8           IS T8 = 0?
00137P 00C4 26 0A 00D0                 BNE     UATRT1       IF NOT...BRANCH
00138P 00C6 FF 0000     A              STX     T7           T7 = 0
00139P 00C9 8B 10       A              ADDA    #$10
```

```
00140P 00CB B7 0004   A           STAA   FEAD0+4    (FEAD4) = FEW4+10 HEX
00141P 00CE 20 04 00D4            BRA    UATRT2

00143P 00D0 09            UATRT1  DEX
00144P 00D1 FF 0000   A           STX    T8         T8 = T8-1

00146P 00D4 B6 0005   A   UATRT2  LDAA   FEAD8+5
00147P 00D7 85 80     A           BITA   #%10000000 IS FEAD13 BIT 7 = 0?
00148P 00D9 27 05 00E0            BEQ    UATRT4     IF YES...BRANCH
00149P 00DB 39                    RTS               ...ELSE EXIT 00151P 00DC 09            UATRT3  DEX
00152P 00DD FF 0000   A           STX    T6         T6 = T6-1

00154P 00E0 BD 0000   A   UATRT4  JSR    SCNCLR     SCAN CLEAR CONTROL
00155P 00E3 96 00     A           LDAA   FR1
00156P 00E5 85 00     A           BITA   #TE        IS TE = 0?
00157P 00E7 26 C1 00AA            BNE    UAATRT     IF NOT...BRANCH 00159P 00E9 39                    RTS               ...EXIT
00154                     *
00155                     * SHFDV - SET HIGH FREQUENCY TRACE VARIABLES
00156                     *
00157                     * FLOW PAGE 14W2
00158                     *
00159P 00DD 86 03     A   SHFDV   LDAA   #$03
00160P 00DF C6 E7     A           LDAB   #$E7       ACCA,ACCB = 999
00161P 00E1 CE 0000   A           LDX    #K16
00162P 00E4 BD 0000   A           JSR    COMP16     IS 999 < K16?
00163P 00E7 2D 30 0119            BLT    SHFDV0     IF YES...BRANCH
00164P 00E9 5C                    INCB              ACCA,ACCB = 1000
00165P 00EA D0 01     A           SUBB   K16+1
00166P 00EC 92 00     A           SBCA   K16        ACCA,ACCB = 1000-K16
00167P 00EE 97 00     A           STAA   TEMP3
00168P 00F0 D7 01     A           STAB   TEMP3+1
00169P 00F2 CE 0000   A           LDX    #TEMP3
00170P 00F5 BD 0000   A           JSR    EINT15     ENTER 1000-K16
00171P 00F8 CE 12C0   A           LDX    #4800
00172P 00FB BD 0000   A           JSR    ENTIDX     ENTER 4,800
00173P 00FE BD 0000   A           JSR    FLPMLT     MULTIPLY
00174P 0101 CE 0000   A           LDX    #K15
00175P 0104 BD 0000   A           JSR    ENTPV2     ENTER K15
00176P 0107 BD 0000   A           JSR    FLPDIV     DIVIDE
00177P 010A CE 0000   A           LDX    #TEMP3
00178P 010D BD 0000   A           JSR    SINT15     STORE RESULT
00179P 0110 4F                    CLRA
00180P 0111 C6 1E     A           LDAB   #30        ADD 30 TO RESULT
00181P 0113 DB 01     A           ADDB   TEMP3+1
00182P 0115 99 00     A           ADCA   TEMP3      T5 = INT((1000-K16)*10000/K15)+30
00183P 0117 20 03 011C            BRA    SHFDV1
00184P 0119 4F            SHFDV0  CLRA
00185P 011A C6 1E     A           LDAB   #30        T5 = 30
00186P 011C 97 00     A   SHFDV1  STAA   T5
00187P 011E D7 01     A           STAB   T5+1
00188P 0120 96 00     A           LDAA   K8
00189P 0122 81 03     A           CMPA   #3         IS K8 = 3?
00190P 0124 27 0A 0130            BEQ    SHFDV2     IF YES...BRANCH 00192P 0126 86 07     A           LDAA   #$07
00193P 0128 C6 D0     A           LDAB   #$D0       ACCA,ACCB = 2000
00194P 012A DB 01     A           ADDB   T5+1
00195P 012C 99 00     A           ADCA   T5         T6 = 2000+T5
00196P 012E 20 02 0132            BRA    SHFDV3

00198P 0130 4F            SHFDV2  CLRA
00199P 0131 5F                    CLRB              T7 = 0
00200P 0132 B7 0000   A   SHFDV3  STAA   T7
00201P 0135 F7 0001   A           STAB   T7+1
00202P 0138 86 01     A           LDAA   #1
00203P 013A 97 00     A           STAA   H          H = 1
00204P 013C 39                    RTS
```

```
00217                         *
00218                         * SPFLED - SET PASS/FAIL LEDS
00219                         *
00220                         * FLOW PAGE 15C
00221                         *
00222P 016D C6 00    A SPFLED LDAB  #PASS+FAIL
00223P 016F BD 0000  A        JSR   CLITE1   PASS = 0, FAIL = 0
00224P 0172 D6 00    A        LDAB  M1
00225P 0174 C1 06    A        CMPB  #6       IS M1 = 6? (IE. AUTOSCOPE?)
00226P 0176 26 57 01CF         BNE   SPFLD4   IF NOT...BRANCH AND EXIT
00227P 0178 B6 0000  A        LDAA  DW8
00228P 017B 81 11    A        CMPA  #17      IS DW(8),1 = "R"?
00229P 017D 26 47 01C6         BNE   SPFLD1   IF NOT...BRANCH
00230P 017F B6 0000  A        LDAA  DW7
00231P 0182 81 0B    A        CMPA  #11      IS DW(7),1 = "A"?
00232P 0184 26 44 01CA         BNE   SPFLD2   IF NOT...BRANCH
00233P 0186 96 00    A        LDAA  DCOMP
00234P 0188 81 33    A        CMPA  #51      IS DCOMP = 51?
00235P 018A 27 43 01CF         BEQ   SPFLD4   IF YES...BRANCH
00236P 018C 96 00    A        LDAA  FR4
00237P 018E 85 00    A        BITA  #PFF     IS PFF = 1?
00238P 0190 26 3D 01CF         BNE   SPFLD4   IF YES...BRANCH 00240P 0192 4F               CLRA
00241P 0193 D6 00    A        LDAB  DCOMP
00242P 0195 58               ASLB
00243P 0196 49               ROLA           ACCA,ACCB _ 2*DCOMP 00245P 0197 CE 0000  A        LDX   #MAXMIS
00246P 019A BD 0000  A        JSR   COMP16   IS "WV9" > MAXMIS?
00247P 019D 2F 2B 01CA         BLE   SPFLD2   IF NOT...BRANCH
00248P 019F DE 00    A        LDX   BADS8
00249P 01A1 86 00    A        LDAA  #JL4OFS
00250P 01A3 BD 0000  A        JSR   OFFX     POINT TO J(8,4)
00251P 01A6 BD 0000  A        JSR   ENTPV2   ENTER J(8,4)
00252P 01A9 CE 000E  A        LDX   #J15+14
00253P 01AC BD 0000  A        JSR   ENTPV2   ENTER J15(8)
00254P 01AF BD 0000  A        JSR   FLPMLT   MULTIPLY
00255P 01B2 CE 0003  A        LDX   #3
00256P 01B5 BD 0000  A        JSR   ENTIDX   ENTER 3
00257P 01B8 BD 0000  A        JSR   FLPMLT   "WV9" = J(8,4)*J15(8)*3
00258P 01BB CE 0000  A        LDX   #TOTMA
00259P 01BE BD 0000  A        JSR   EINT15   ENTER TOTMA
00260P 01C1 BD 0000  A        JSR   COMPXY   IS "WV9" > TOTMA?
00261P 01C4 2F 04 01CA         BLE   SPFLD2   IF NOT...BRANCH 00263P 01C6 C6 00    A SPFLD1 LDAB  #PASS    PASS = 1
00264P 01C8 20 02 01CC        BRA   SPFLD3

00266P 01CA C6 00    A SPFLD2 LDAB  #FAIL    FAIL = 1

00268P 01CC 7E 0000  A SPFLD3 JMP   SLITE1   SET LITE ... AND EXIT 00270P 01CF 39              SPFLD4 RTS                ... EXIT

00198                         *
00199                         * SCTSO - SCAN TRIGGER SOURCE CONTROL (K8)
00200                         *
00201                         * FLOW PAGE 22
00202                         *
00203P 0123 BD 0000  A SCTSO  JSR   READSR   READ SWITCH REGISTERS
00204P 0126 D6 00    A        LDAB  K8       ACCB _ K8
00205P 0128 81 37    A        CMPA  #$37     IF TRIGGER SOURCE UP PRESSED
00206P 012A 27 07 0133        BEQ   DOINC    ... THEN BRANCH TO INCREMENT K8
00207P 012C 81 38    A        CMPA  #$38     IF TRIG SOURCE DOWN NOT PRESSED
00208P 012E 26 11 0141        BNE   SCTSOX   ... THEN EXIT
00209P 0130 5A               DECB           ACCB _ ACCB-1
00210P 0131 26 01 0134        BNE   CHKOR    CHECK OVERFLOW IF ACCB <> 0
00211P 0133 5C        DOINC   INCB           ACCB _ ACCB+1
00212P 0134 C1 05    A CHKOR  CMPB  #5
00213P 0136 23 02 013A        BLS   DOSET    IF ACCB > 5
```

```
00214P 0138 C6 05      A           LDAB    #5            ... THEN ACCB _ 5
00215P 013A D7 00      A DOSET     STAB    K8            K8 _ ACCB
00216P 013C BD 0000    A           JSR     SETTS         SET TRIG SOURCE LEDS FROM K8
00217P 013F 20 06 0147             BRA     WUNCP         WAIT UNTIL NO CONTROLS ARE PRESSED
00218                            *                       ... AND EXIT
00219P 0141 39           SCTSOX   RTS                    EXIT

00221                            *
00222                            * CANCP - CLEAR ANALOG, NO CONTROLS PRESSED
00223                            *
00224                            * FLOW PAGE 23
00225                            *
00226P 0142 BD 0000    A CANCP    JSR     CANLOG         CLEAR ANALOG TRACE, IF REQD.
00227P 0145 20 00 0147             BRA     WUNCP         WAIT UNTIL NO CONTROLS ARE PRESSED
00228                            *                       ... AND EXIT

00230                            *
00231                            * WUNCP - WAIT UNTIL NO CONTROLS ARE PRESSED
00232                            *
00233                            * FLOW PAGE 24
00234                            *
00235P 0147 CE 02C5    A WUNCP    LDX     #709
00236P 014A BD 0000    A          JSR     DELAY          WAIT 50 MS (DEBOUNCE)
00237P 014D BD 0000    A WUNCP1   JSR     READSR
00238P 0150 26 FB 014D             BNE     WUNCP1        WAIT UNTIL NO SWITCHES PRESSED
00239P 0152 CE 02C5    A          LDX     #709
00240P 0155 BD 0000    A          JSR     DELAY          WAIT 50 MS
00241P 0158 39                    RTS                    EXIT

00031                            ******************************************************
00032                            ******************************************************
00033                            **                                                  **
00034                            ** UTILITY ROUTINES -- GENERAL SUBROUTINES          **
00035                            **     CALLED BY THE FLOW CHART EXECUTIVES.         **
00036                            **                                                  **
00037                            ******************************************************
00038                            ******************************************************

00040                            *
00041                            * CBLOCK - CLEAR BLOCK - TERMINATOR STORED IN
00042                            *    TEMP, FIRST BYTE TO BE CLEARED IN
00043                            *    THE INDEX.  ONLY REGISTER CHANGED IS
00044                            *    THE INDEX.
00045                            *
00046P 0000 6F 00      A CBLOCK   CLR     X              CLEAR ONE LOCATION IN BLOCK
00047P 0002 08                    INX                    NEXT LOCATION
00048P 0003 9C 00      A          CPX     TEMP           DONE?
00049P 0005 26 F9 0000             BNE     CBLOCK        LOOP IF NOT
00050P 0007 39                    RTS                    EXIT CBLOCK
00051                            *
00052                            * SAVES VALUE FROM A AS NEW M1.  ALSO
00053                            * JOINS SLITE2 TO SET APPROPRIATE MODE
00054                            * LED
00055                            *
00056P 0008 97 00      A SETM1    STAA    M1             SAVE NEW M1 VALUE
00057P 000A 20 02 000E             BRA     ADJM1         ENTER ADJUSTMENT LOOP
00058P 000C 80 0A      A ADJLP    SUBA    #10
00059P 000E 81 0A      A ADJM1    CMPA    #10
00060P 0010 22 FA 000C             BHI     ADJLP         LOOP UNTIL ACCA <= 10
00061P 0012 36                    PSHA                   SAVE FOR LED SET
00062P 0013 C6 07      A          LDAB    #7
00063P 0015 8D 09 0020             BSR     CLITE2        CLEAR MODE LEDS
00064P 0017 33                    PULB                   GET MODE LED PATTERN

00066                            *
00067                            * CLITE1,..., SLITE2 - CLEAR AND SET LITE ROUTINES -
00068                            *    1 MEANS LR1, 2 MEANS LR2.
00069                            *
00070P 0018 DA 00      A SLITE2   ORAB    LITE2          SET LITES IN LR2 STATUS
00071P 001A D7 00      A L2LINK   STAB    LITE2          SAVE NEW PATTERN
00072P 001C F7 0000    A          STAB    LR2            CHANGE LITES
```

```
00073P 001F 39                    RTS            EXIT SLITE2, CLITE2, SETM1
00074                 *
00075P 0020 53        CLITE2 COMB                 INVERT BITS
00076P 0021 D4 00   A        ANDB   LITE2         CLEAR LITES
00077P 0023 20 F5 001A       BRA    L2LINK        SAVE STATUS AND CH LITES
00078                 *
00079                 *
00080P 0025 DA 00   A SLITE1 ORAB   LITE1         SET LITES IN LR1 STAT
00081P 0027 D7 00   A L1LINK STAB   LITE1         SAVE NEW PATTERN
00082P 0029 53               COMB                 INVERT BITS
00083P 002A F7 0000 A        STAB   LR1           CHANGE LITES
00084P 002D 53               COMB                 RESTORE POLARITY
00085P 002E 39               RTS                  EXIT SLITE1, CLITE1
00086                 *
00087P 002F 53        CLITE1 COMB                 INVERT BITS
00088P 0030 D4 00   A        ANDB   LITE1         CLEAR LITES' STATUS
00089P 0032 20 F3 0027       BRA    L1LINK        CHANGE LITES & EXIT
00091                 * SET, CLEAR, AND CHANGE FLAGS ROUTINES - THE
00092                 *   BITS SET IN ACCA ARE SET, CLEARED, OR
00093                 *   INVERTED IN THE SPECIFIED FLAGS REGISTER.
00094                 *   ACCA IS UNCHANGED, ACCB EXITS WITH THE
00095                 *   RESULT OF THE OPERATION.
00096                 *
00097                 *
00098P 0034 16        SFLG1  TAB                  SAVE SET BITS
00099P 0035 DA 00   A        ORAB   FR1           SET BITS FOR FR1
00100P 0037 D7 00   A F1LINK STAB   FR1           RESAVE FR1
00101P 0039 39               RTS                  EXIT SFLG1, CFLG1
00102                 *
00103P 003A 16        CFLG1  TAB                  SAVE CLEARED BITS
00104P 003B 53               COMB                 INVERT FOR BIT MASK
00105P 003C D4 00   A        ANDB   FR1           CLEAR BITS IN FR1
00106P 003E 20 F7 0037       BRA    F1LINK        SAVE FR1 AND EXIT
00107                 *
00108P 0040 16        CHFLG1 TAB                  SAVE INVERTED BITS
00109P 0041 D8 00   A        EORB   FR1           INVERT BITS IN FR1
00110P 0043 20 F2 0037       BRA    F1LINK        RESAVE FR1 AND EXIT
00111                 *
00112P 0045 16        SFLG2  TAB                  SAVE SET BITS
00113P 0046 DA 00   A        ORAB   FR2           SET BITS FOR FR2
00114P 0048 D7 00   A F2LINK STAB   FR2           RESAVE FR2
00115P 004A 39               RTS                  EXIT SFLG2, CFLG2
00116                 *
00117P 004B 16        CFLG2  TAB                  SAVE CLEARED BITS
00118P 004C 53               COMB                 INVERT FOR BIT MASK
00119P 004D D4 00   A        ANDB   FR2           CLEAR BITS IN FR2
00120P 004F 20 F7 0048       BRA    F2LINK        RESAVE FR2 AND EXIT
00121                 *
00122P 0051 16        CHFLG2 TAB                  SAVE INVERTED BITS
00123P 0052 D8 00   A        EORB   FR2           INVERT BITS IN FR2
00124P 0054 20 F2 0048       BRA    F2LINK        RESAVE FR2 AND EXIT
00125                 *
00126P 0056 16        SFLG3  TAB                  SAVE SET BITS
00127P 0057 DA 00   A        ORAB   FR3           SET BITS FOR FR3
00128P 0059 D7 00   A F3LINK STAB   FR3           RESAVE FR3
00129P 005B 39               RTS                  EXIT SFLG3, CFLG3
00130                 *
00131P 005C 16        CFLG3  TAB                  SAVE CLEARED BITS
00132P 005D 53               COMB                 INVERT FOR BIT MASK
00133P 005E D4 00   A        ANDB   FR3           CLEAR BITS IN FR3
00134P 0060 20 F7 0059       BRA    F3LINK        RESAVE FR3 AND EXIT
00135                 *
00136P 0062 16        SFLG4  TAB                  SAVE SET BITS
00137P 0063 DA 00   A        ORAB   FR4           SET FITS FOR FR4
00138P 0065 D7 00   A F4LINK STAB   FR4           RESAVE FR4
00139P 0067 39               RTS                  EXIT SFLG4, CFLG4
00140                 *
00141P 0068 16        CFLG4  TAB                  SAVE CLEARED BITS
00142P 0069 53               COMB                 INVERT FOR BIT MASK
00143P 006A D4 00   A        ANDB   FR4           CLEAR BITS IN FR4
00144P 006C 20 F7 0065       BRA    F4LINK        RESAVE FR4 AND EXIT
```

```
00146                *
00147                * READSR - READ SWITCH REGISTERS - Z SET ON RETURN
00148                *    INDICATES NO VALID DATA. Z CLEAR INDICATES
00149                *    ENCODED SWITCH DATA IN A.  UPPER 4 BITS ARE
00150                *    (1,2,3,4) THE SR NUMBER.  LOWER 4 (1, ..., 8)
00151                *    INDICATE THE BIT WHICH IS SET IN THE SR
00152                *
00153P 006E C6 01    A READSR LDAB  #1         SR1 FIRST
00154P 0070 D7 00    A        STAB  TEMP       SAVE SR NUMBER
00155P 0072 B6 0000  A        LDAA  SR1        GET SR1 DATA
00156P 0075 43                COMA             INVERT IT
00157P 0076 16                TAB              SAVE IT
00158P 0077 26 30 00A9        BNE   CHKSR2     CHECK FOR ERRORS IF DATA
00159                *
00160P 0079 7C 0000  A        INC   TEMP       SR2 IF NO SR1 DATA
00161P 007C B6 0000  A        LDAA  SR2        GET SR2 DATA
00162P 007F 43                COMA             INVERT IT
00163P 0080 16                TAB              SAVE IT
00164P 0081 26 2C 00AF        BNE   CHKSR3     CHECK FOR ERRORS IF DATA
00165                *
00166P 0083 7C 0000  A        INC   TEMP       SR3 IF NO SR2 DATA
00167P 0086 B6 0000  A        LDAA  SR3        GET SR3 DATA
00168P 0089 43                COMA             INVERT
00169P 008A 16                TAB              SAVE IT
00170P 008B 26 28 00B5        BNE   CHKSR4     CHECK FOR ERRORS IF DATA
00171                *
00172P 008D 7C 0000  A        INC   TEMP       SR4 IF NO SR3 DATA
00173P 0090 B6 0000  A        LDAA  SR4        GETSR4 DATA
00174P 0093 43                COMA             INVERT IT
00175P 0094 16                TAB              SAVE IT
00176P 0095 27 24 00BB        BEQ   SRERR      EXIT IF NO SR DATA AT ALL
00177                *
00178P 0097 17         CHKERR TBA              NEED DATA IN BOTH ACCS
00179P 0098 44         CHKER2 LSRA             ROTATE UNTIL 1ST DATA
00180P 0099 24 FD 0098        BCC   CHKER2     ... BIT IS IN CARRY
00181P 009B 26 1E 00BB        BNE   SRERR      ERROR IF ANOTHER BIT IS SET

00183                *
00184                * ENCODE DATA AND EXIT
00185                *
00186P 009D 4C         SRLOOP INCA             NEXT BIT NUMBER
00187P 009E 54                LSRB             THIS BIT?
00188P 009F 24 FC 009D        BCC   SRLOOP     LOOP IF NOT
00189                *
00190P 00A1 D6 00    A        LDAB  TEMP       GET SR NUMBER
00191P 00A3 58                ASLB             ALIGN
00192P 00A4 58                ASLB             ... FOR
00193P 00A5 58                ASLB             ... ENCODE
00194P 00A6 58                ASLB             ... ADDITION
00195P 00A7 1B                ABA              MERGE CODES
00196P 00A8 39                RTS              EXIT READSR WITH DATA
00197                *
00198                * CHKSR ROUTINES - MAKES SURE NO OTHER SR
00199                *    SHOWS ACTIVE BITS. EXITS WITH "NO VALID DATA"
00200                *    FLAG IF OTHER SR'S DO CONTAIN ACTIVE BITS.
00201                *
00202P 00A9 B6 0000  A CHKSR2 LDAA  SR2        GET SR2 DATA
00203P 00AC 43                COMA             ANY BITS SET?
00204P 00AD 26 0C 00BB        BNE   SRERR      ERROR IF SO
00205P 00AF B6 0000  A CHKSR3 LDAA  SR3        GET SR3 DATA
00206P 00B2 43                COMA             ANY BITS SET?
00207P 00B3 26 06 00BB        BNE   SRERR      ERROR IF SO
00208P 00B5 B6 0000  A CHKSR4 LDAA  SR4        GET SR4 DATA
00209P 00B8 43                COMA             ANY BITS SET?
00210P 00B9 27 DC 0097        BEQ   CHKERR     CHECK MULTI-BIT ERR IF NOT
00211                *
00212P 00BB 4F         SRERR  CLRA             SET "NO VALID DATA" FLAG
00213P 00BC 39                RTS              EXIT READSR
```

```
00215                    *
00216                    * GET10 - ENTERS 10 ONTO PSTK
00217                    *
00218P 00BD 86 01      A GET10  LDAA   #1           EXPONENT FOR POWER OF 10
00219P 00BF 7E 0124    P        JMP    EEXP10       ENTER 10**1 AND EXIT
00220                    *
00221                    * XDIV10 - X <- X/10 ON PSTK
00222                    *
00223P 00C2 8D F9 00BD   XDIV10 BSR    GET10        10, X ON PSTK
00224P 00C4 7E 0335    P        JMP    FLPDIV       X <- X/10 AND EXIT

00226                    *
00227                    * R10 - ROUND (BASE 10) - ADDS .5 TO X
00228                    *
00229P 00C7 4F           R10    CLRA                EXPONENT (.5)
00230P 00C8 CE 0FA0    A        LDX    #4000        FRACTION (.5)
00231P 00CB BD 04BD    P        JSR    ENTIMM       ENTER NUMBER
00232P 00CE 7E 033C    P        JMP    FLPADD       BASE 10 ROUND UP
00233                    *
00234                    * DELAY - DELAYS APPROXIMATELY (70X + 24)
00235                    *    MICROSECONDS, WHERE X IS THE CONTENTS OF
00236                    *    THE INDEX REGISTER.  BASED ON AN AVERAGE
00237                    *    SYSTEM CLOCK OF 1 MEGAHERTZ.
00238                    *
00239P 00D1 DF 00      A DELAY  STX    TEMP         SAVE MAJOR LOOP COUNTER
00240P 00D3 CE 0005    A        LDX    #5           GET MINOR LOOP COUNTER
00241                    *
00242P 00D6 09           MINORL DEX                 COUNT IN MINOR LOOP
00243P 00D7 01                  NOP
00244P 00D8 26 FC 00D6          BNE    MINORL       LOOP TILL INDEX = 0
00245                    *
00246P 00DA DE 00      A        LDX    TEMP         GET MAJOR LOOP COUNTER
00247P 00DC 09                  DEX                 COUNT IN MAJOR LOOP
00248P 00DD 26 F2 00D1          BNE    DELAY        LOOP TILL INDEX = 0

00250P 00DF 08                  INX
00251P 00E0 09                  DEX
00252P 00E1 01                  NOP
00253P 00E2 39                  RTS                 EXIT DELAY

00255                    *
00256                    * ETABLE - EXPONENT TABLE - POWERS OF 10 IN PSTK
00257                    * REPRESENTATION FROM 10**-10 TO 10**10.
00258                    *
00259P 00E3    6DF3    A ETABLE FDB    $6DF3        10**-10
00260P 00E5    DE      A        FCB    $DE
00261P 00E6    44B8    A        FDB    $44B8        10**-9
00262P 00E8    E3      A        FCB    $E3
00263P 00E9    55E6    A        FDB    $55E6        10**-8
00264P 00EB    E6      A        FCB    $E6
00265P 00EC    6B60    A        FDB    $6B60        10**-7
00266P 00EE    E9      A        FCB    $E9
00267P 00EF    431C    A        FDB    $431C        10**-6
00268P 00F1    ED      A        FCB    $ED
00269P 00F2    53E3    A        FDB    $53E3        10**-5
00270P 00F4    F0      A        FCB    $F0
00271P 00F5    68DC    A        FDB    $68DC        10**-4
00272P 00F7    F3      A        FCB    $F3
00273P 00F8    4189    A        FDB    $4189        10**-3
00274P 00FA    F7      A        FCB    $F7
00275P 00FB    51EC    A        FDB    $51EC        10**-2
00276P 00FD    FA      A        FCB    $FA
00277P 00FE    6666    A        FDB    $6666        10**-1
00278P 0100    FD      A        FCB    $FD
00279P 0101    4000    A        FDB    $4000        1       (EXACT)
00280P 0103    01      A        FCB    $1
00281P 0104    5000    A        FDB    $5000        10      (EXACT)
00282P 0106    04      A        FCB    $4
00283P 0107    6400    A        FDB    $6400        10**2   (EXACT)
00284P 0109    07      A        FCB    $7
00285P 010A    7D00    A        FDB    $7D00        10**3   (EXACT)
```

```
00286P 010C   0A       A            FCB     $A
00287P 010D   4E20     A            FDB     $4E20      10**4   (EXACT)
00288P 010F   0E       A            FCB     $E
00289P 0110   61A8     A            FDB     $61A8      10**5   (EXACT)
00290P 0112   11       A            FCB     $11
00291P 0113   7A12     A            FDB     $7A12      10**6   (EXACT)
00292P 0115   14       A            FCB     $14
00293P 0116   4C4B     A            FDB     $4C4B      10**7
00294P 0118   18       A            FCB     $18
00295P 0119   5F5E     A            FDB     $5F5E      10**8
00296P 011B   1B       A            FCB     $1B
00297P 011C   7736     A            FDB     $7736      10**9
00298P 011E   1E       A            FCB     $1E
00299P 011F   4A81     A            FDB     $4A81      10**10
00300P 0121   22       A            FCB     $22
00301P 0122   00E3     P  ETBLHI    FDB     ETABLE
00302         0123     P  ETBLLO    EQU     *-1
00304                                *
00305                                * EEXP10 - ENTER EXPONENT OF 10 - ENTERS POWER OF 10
00306                                *   INDICATED BY THE A REGISTER.  ALLOWED RANGE OF
00307                                *   A IS + OR - 10.
00308                                *
00309P 0124   8B 0A    A  EEXP10    ADDA    #10        OFFSET TO POSITIVE REPRESENTATION
00310P 0126   2B 21 0149            BMI     E10ERR     ERROR IF UNDERFLOW
00311P 0128   81 15    A            CMPA    #21        OVERFLOW?
00312P 012A   24 1D 0149            BCC     E10ERR     ERROR IF SO
00313                                *
00314P 012C   16                    TAB
00315P 012D   48                    ASLA
00316P 012E   1B                    ABA                A = 3*A
00317                                *
00318P 012F   BB 0123  P            ADDA    ETBLLO     CALC LSB OF TABLE ADDR
00319P 0132   97 01    A            STAA    TEMP+1     SAVE LSB
00320P 0134   B6 0122  P            LDAA    ETBLHI     GET MSB
00321P 0137   89 00    A            ADCA    #0         PROPAGATE CARRY
00322P 0139   97 00    A            STAA    TEMP       SAVE MSB
00323P 013B   DF 00    A            STX     TEMP2      SAVE INDEX
00324P 013D   DE 00    A            LDX     TEMP       POINT TO POWER OF 10
00325P 013F   A6 02    A            LDAA    2,X        GET EXPONENT
00326P 0141   EE 00    A            LDX     X          GET FRACTION
00327P 0143   BD 04BD  P            JSR     ENTIMM     ENTER PWR ONTO PSTK
00328P 0146   DE 00    A            LDX     TEMP2      RESTORE INDEX
00329P 0148   39                    RTS                EXIT EEXP10
00330                                *
00331P 0149   0B       E10ERR       SEV                SET ERROR FLAG
00332P 014A   39                    RTS                EXIT EEXP10

00334                                *
00335                                * DOMOVE - LOOKS UP BLOCK MOVE PARAMETERS IN
00336                                *   MPTBL AS SPECIFIED BY ACCA.  THEN IT JOINS
00337                                *   MOVBLK TO EXECUTE THE MOVE.
00338                                *
00339P 014B   CE FFFA  A  DOMOVE    LDX     #MPTBL-6   POINT TO PARAMETER TABLE
00340P 014E   C6 06    A  DMVLP1    LDAB    #6         DISTANCE TO NEXT ENTRY
00341P 0150   08          DMVLP2    INX                NEXT BYTE TOWARDS ENTRY
00342P 0151   5A                    DECB               THIS ENTRY?
00343P 0152   26 FC 0150            BNE     DMVLP2     LOOP TILL YES
00344P 0154   4A                    DECA               THIS THE RIGHT ENTRY?
00345P 0155   26 F7 014E            BNE     DMVLP1     LOOP TILL YES
00346P 0157   DF 00    A            STX     TEMP3      SAVE TABLE POINTER
00347P 0159   EE 04    A            LDX     4,X        DESTINATION POINTER
00348P 015B   DF 00    A            STX     TEMP
00349P 015D   DE 00    A            LDX     TEMP3      TABLE POINTER
00350P 015F   EE 02    A            LDX     2,X        TERMINATOR
00351P 0161   DF 00    A            STX     TEMP2
00352P 0163   DE 00    A            LDX     TEMP3      TABLE POINTER
00353P 0165   EE 00    A            LDX     X          INITIATOR
00354                                *
00355                                * MOVBLK - MOVE BLOCK - ENTERS WITH INDEX POINTING
00356                                *   TO FIRST CHARACTER TO BE MOVED, TEMP POINTING
00357                                *   TO FIRST DESTINATION LOCATION, AND TEMP2
00358                                *   THE LOCATION OF THE LAST CHARACTER TO BE
00359                                *   MOVED PLUS ONE, THE TERMINATOR.  EXECUTES
```

```
00360                           *    BLOCK MOVE.
00361                           *
00362P 0167 A6 00       A MOVBLK LDAA    X           GET CHARACTER FOR MOVE
00363P 0169 DF 00       A        STX     TEMP3       SAVE CHARACTER POINTER
00364P 016B DE 00       A        LDX     TEMP        POINT TO DESTINATION
00365P 016D A7 00       A        STAA    X           MOVE CHARACTER
00366P 016F 08                   INX                 NEXT DESTINATION LOCATION
00367P 0170 DF 00       A        STX     TEMP        SAVE DESTINATION POINTER
00368P 0172 DE 00       A        LDX     TEMP3       GET CHARACTER POINTER
00369P 0174 08                   INX                 NEXT CHARACTER
00370P 0175 9C 00       A        CPX     TEMP2       DONE?
00371P 0177 26 EE 0167           BNE     MOVBLK      LOOP TILL YES
00372P 0179 39                   RTS                 EXIT MOVBLK

00374                           *
00375                           * SUB16, COMP16 - BOTH SET 2'S COMPLEMENT FLAGS
00376                           *    ACCORDING TO THE OPERATION: A,B - (X),(X+1).
00377                           *    SUB16 ALSO REPLACES A,B WITH THE RESULT.
00378                           *
00379P 017A E0 01       A SUB16  SUBB    1,X
00380P 017C A2 00       A        SBCA    X           A,B _ A,B - (X),(X+1)
00381P 017E 36                   PSHA
00382P 017F 07                   TPA
00383P 0180 5D                   TSTB
00384P 0181 27 02 0185           BEQ     S16L        IF B <> 0
00385P 0183 84 FB       A        ANDA    #$FB        ... THEN Z BIT _ 0
00386P 0185 06            S16L   TAP
00387P 0186 32                   PULA
00388P 0187 39                   RTS                 EXIT SUB16
00389                           *
00390P 0188 36            COMP16 PSHA                SAVE
00391P 0189 37                   PSHB                ... A,B
00392P 018A 8D EE 017A           BSR     SUB16       A,B - (X),(X+1)
00393P 018C 33                   PULB                RESTORE
00394P 018D 32                   PULA                ... A,B
00395P 018E 39                   RTS                 EXIT COMP16

00397                           *
00398                           * OFFX - OFFSET INDEX - ADDS A TO INDEX AND
00399                           *    REPLACES INDEX WITH RESULT.
00400                           *
00401P 018F 36            OFFX   PSHA                SAVE A
00402P 0190 DF 00       A        STX     TEMP3       SAVE INDEX
00403P 0192 9B 01       A        ADDA    TEMP3+1     CALCULATE LSB
00404P 0194 97 01       A        STAA    TEMP3+1     SAVE LSB
00405P 0196 24 03 019B           BCC     OFFX1       BRANCH IF NO CARRY
00406P 0198 7C 0000     A        INC     TEMP3       PROPAGATE CARRY
00407P 019B DE 00       A OFFX1  LDX     TEMP3       GET NEW INDEX
00408P 019D 32                   PULA                RESTORE A
00409P 019E 39                   RTS                 EXIT OFFX
00410                           *
00411                           * NLV - NEXT LOWER VALUE OF A PV2 VARIABLE
00412                           *    WHICH GOES IN 1, 2, 5 STEPS.
00413                           *
00414P 019F A6 00       A NLV    LDAA    X           GET COEFFICIENT
00415P 01A1 81 01       A        CMPA    #1          IS IT 1?
00416P 01A3 26 06 01AB           BNE     NLV1        BRANCH IF NOT
00417P 01A5 6A 01       A        DEC     1,X         DECREMENT EXPONENT
00418P 01A7 86 05       A        LDAA    #5          NEW COEFFICIENT
00419P 01A9 20 09 01B4           BRA     NLHVXT      EXIT NLV
00420                           *
00421P 01AB 81 02       A NLV1   CMPA    #2          IS IT 2?
00422P 01AD 26 03 01B2           BNE     NLV2        BRANCH IF NOT
00423P 01AF 4A                   DECA                NEW COEFFICIENT
00424P 01B0 20 02 01B4           BRA     NLHVXT      EXIT NLV
00425                           *
00426P 01B2 86 02       A NLV2   LDAA    #2          NEW COEFFICIENT
00427                           *
00428P 01B4 A7 00       A NLHVXT STAA    X           SAVE NEW COEFFICIENT
00429P 01B6 39                   RTS                 EXIT NLV, NHV
00430                           *
00431                           * NHV - NEXT HIGHER VALUE OF A PV2 VARIABLE
```

```
00432                        *       WHICH GOES IN 1, 2, 5 STEPS
00433                        *
00434P  01B7 A6 00       A NHV     LDAA    X           GET COEFFICIENT
00435P  01B9 81 05       A         CMPA    #5          IS IT 5?
00436P  01BB 26 06 01C3            BNE     NHV1        BRANCH IF NOT
00437P  01BD 6C 01       A         INC     1,X         INCREMENT EXPONENT
00438P  01BF 86 01       A         LDAA    #1          NEW COEFFICIENT
00439P  01C1 20 F1 01B4            BRA     NLHVXT      EXIT NHV
00440                        *
00441P  01C3 81 02       A NHV1    CMPA    #2          IS COEFFICIENT 2?
00442P  01C5 26 04 01CB            BNE     NHV2        BRANCH IF NOT
00443P  01C7 86 05       A         LDAA    #5          NEW COEFFICIENT
00444P  01C9 20 E9 01B4            BRA     NLHVXT      EXIT NHV
00445                        *
00446P  01CB 86 02       A NHV2    LDAA    #2          NEW COEFFICIENT
00447                        *
00448P  01CD 20 E5 01B4            BRA     NLHVXT      EXIT NHV

00450                        *
00451                        * FEWUNP - FRONT END WORD UNPACK -
00452                        *
00453                        *       A _ BITS 11-6 OF A,B
00454                        *       B _ BITS 5-0 OF A,B
00455                        *
00456P  01CF 58                  FEWUNP  ASLB              6-0
00457P  01D0 49                          ROLA              14-7
00458P  01D1 58                          ASLB              5-0
00459P  01D2 49                          ROLA              13-6
00460P  01D3 84 3F       A               ANDA    #$3F      11-6
00461P  01D5 54                          LSRB              NORMALIZE
00462P  01D6 54                          LSRB              ... RIGHT
00463P  01D7 39                          RTS               EXIT
00464                        *
00465                        * SABL3X - SHIFT A,B LEFT 3 TIMES
00466                        *
00467P  01D8 58                  SABL3X  ASLB
00468P  01D9 49                          ROLA
00469P  01DA 58                          ASLB
00470P  01DB 49                          ROLA
00471P  01DC 58                          ASLB
00472P  01DD 49                          ROLA
00473P  01DE 39                          RTS               EXIT SABL3X

00475                        *******************************************
00476                        *                                         *
00477                        * END OF DTOU1                            *
00478                        *                                         *
00479                        *******************************************

00481                        *
00482                        * PNTATT - POINT TO ATTRIBUTES - INDEX _ POINTER
00483                        *       TO XDAC(ACCA).  NO OTHER REGISTERS CHANGED.
00484                        *
00485                        * NOTE: AN UNDEFINED TRACE NUMBER IN ACCA CAUSES
00486                        *       THE INDEX TO BE REPLACED WITH $E000, HOPEFULLY
00487                        *       A HARMLESS ADDRESS.
00488                        *
00489                        *
00490P  01DF 81 0A       A PNTATT  CMPA    #10
00491P  01E1 27 1E 0201          BEQ     PATERR
00492P  01E3 81 0C       A         CMPA    #12
00493P  01E5 24 1A 0201          BCC     PATERR      ERROR IF UNDEF TRACE NUMBER
00494                        *
00495P  01E7 36                    PSHA
00496P  01E8 37                    PSHB                SAVE A AND B
00497P  01E9 81 08       A         CMPA    #8
00498P  01EB 25 06 01F3            BCS     DOPNT       A UNCHANGED IF A < 8
00499P  01ED 26 03 01F2            BNE     PNTAT1
00500P  01EF 4C                    INCA                A _ A+1 IF A = 8
00501P  01F0 20 01 01F3            BRA     DOPNT
```

```
00502P 01F2 4A              PNTAT1  DECA               A _ A-1 IF A > 8
00503                        *
00504P 01F3 4A              DOPNT   DECA
00505P 01F4 16                      TAB
00506P 01F5 48                      ASLA
00507P 01F6 48                      ASLA
00508P 01F7 1B                      ABA                A _ (A-1)*5
00509P 01F8 CE 0000   A             LDX     #BATDA
00510P 01FB BD 018F   P             JSR     OFFX       INDEX _ #XDAC1+A
00511P 01FE 33                      PULB
00512P 01FF 32                      PULA               RESTORE A AND B
00513P 0200 39                      RTS                EXIT PNTATT
00514                        *
00515P 0201 CE E000   A     PATERR  LDX     #$E000     POINT TO UNOCCUPIED AREA
00516P 0204 39                      RTS                EXIT PNTATT 00518P 0205      00   A     CRCUA   FCB     0          CRC SPACE

00520                       ***********************************************
00521                        *                                             *
00522                        * END OF DTOU2                                *
00523                        *                                             *
00524                       ***********************************************

00526                       *******************************************************
00527                        *
00528                        * MATHPAK ROUTINES - FIXED AND FLOATING POINT
00529                        *     ADD, SUBTRACT, MULTIPLY, AND DIVIDE, AS
00530                        *     WELL AS COMPARE AND OTHER USEFUL FUNCTIONS.
00531                        *
00532                       *******************************************************

00534                        *
00535                        * MULT16 - 16 BIT MULTIPLY - A, B, SCRTCH, SCRTCH+1 _
00536                        *    A, B * (X), (X+1).  TWOS COMPLEMENT NOTATION.
00537                        *    LOOP VARIABLES ARE:
00538                        *       INDEX - LOOP COUNTER
00539                        *       A, B, SCRTCH, SCRTCH+1 - PRODUCT
00540                        *       SCRTCH+2, SCRTCH+3 - MULTIPLIER (FROM A, B)
00541                        *       SCRTCH+4, SCRTCH+5 - MULTIPLICAND
00542                        *
00543P 0206 8D 33 023B MULT16 BSR    FIXNEG     SET SIGN OF RESULT
00544P 0208 8D 4E 0258        BSR    ABSAB      MAKE A, B POSITIVE
00545P 020A 97 02     A       STAA   SCRTCH+2   SAVE
00546P 020C D7 03     A       STAB   SCRTCH+3   ... MULTIPLIER
00547P 020E A6 00     A       LDAA   X          GET
00548P 0210 E6 01     A       LDAB   1, X       ... MULTIPLICAND
00549P 0212 8D 44 0258        BSR    ABSAB      MAKE IT POSITIVE
00550P 0214 97 04     A       STAA   SCRTCH+4   SAVE
00551P 0216 D7 05     A       STAB   SCRTCH+5   ... MULTIPLICAND
00552P 0218 4F                CLRA              INITIALIZE
00553P 0219 5F                CLRB              ... PROCUCT
00554P 021A CE 0010   A       LDX    #16        INITIALIZE LOOP COUNTER
00555                        *
00556                        * COMPUTATION LOOP
00557                        *
00558P 021D 74 0002   A M16LP LSR    SCRTCH+2   IS MULTIPLIER
00559P 0220 76 0003   A       ROR    SCRTCH+3   ... LSB SET?
00560P 0223 24 04 0229        BCC    MSHIFT     SKIP ADD IF NOT
00561P 0225 DB 05     A       ADDB   SCRTCH+5   ADD MULTIPLICAND
00562P 0227 99 04     A       ADCA   SCRTCH+4   ... TO PRODUCT
00563P 0229 44        MSHIFT  LSRA              SHIFT
00564P 022A 56                RORB
00565P 022B 76 0000   A       ROR    SCRTCH
00566P 022E 76 0001   A       ROR    SCRTCH+1   ... PROCUCT
00567P 0231 09                DEX               DONE?
00568P 0232 26 E9 021D        BNE    M16LP      LOOP IF NOT
00569                        *
00570                        * SET SIGN AND EXIT
00571                        *
```

```
00572P 0234 8D 1B 0251          BSR     TSTNEG    NEGATIVE RESULT?
00573P 0236 27 02 023A          BEQ     M16XIT    EXIT IF NOT
00574P 0238 8D 2B 0265          BSR     NEGAEX    NEGATE PRODUCT
00575P 023A 39         M16XIT   RTS               EXIT MULT16

00577                  *
00578                  * NEGRES FLAG MANIPULATION ROUTINES
00579                  *
00580P 023B 8D 0D 024A FIXNEG   BSR     CLRNEG    CLEAR NEG RESULT FLAG
00581P 023D 36                  PSHA
00582P 023E A8 00    A          EORA    X         GET SIGN OF RESULT
00583P 0240 32                  PULA
00584P 0241 2A 06 0249          BPL     FXNXIT    EXIT IF POSITIVE
00585                  *
00586P 0243 36         SETNEG   PSHA
00587P 0244 86 00    A          LDAA    #NEGRES   POINT TO NEGRES FLAG
00588P 0246 8D 40 0288          BSR     SF1       SET IT
00589P 0248 32                  PULA
00590P 0249 39         FXNXIT   RTS               EXIT SETNEG, FIXNEG
00591                  *
00592P 024A 36         CLRNEG   PSHA              SAVE A
00593P 024B 86 00    A          LDAA    #NEGRES   POINT TO NEGRES
00594P 024D 8D 3F 028E          BSR     CF1       CLEAR IT
00595P 024F 32                  PULA              RESTORE A
00596P 0250 39                  RTS               EXIT CLRNEG
00597                  *
00598P 0251 36         TSTNEG   PSHA
00599P 0252 96 00    A          LDAA    FR1
00600P 0254 85 00    A          BITA    #NEGRES
00601P 0256 32                  PULA
00602P 0257 39         DNAXIT   RTS               EXIT TEST NEGATIVE RESULT
00603                  *
00604                  * ABSOULUTE VALUE AND NEGATION ROUTINES
00605                  *
00606P 0258 4D         ABSAB    TSTA              A, B NEGATIVE?
00607P 0259 2A 06 0261          BPL     AABXIT    EXIT IF NOT
00608P 025B 43         NEGAB    COMA
00609P 025C 53                  COMB
00610P 025D CB 01    A          ADDB    #1
00611P 025F 89 00    A          ADCA    #0        A, B IS NEGATED
00612P 0261 39         AABXIT   RTS               EXIT ABSAB, NEGAB
00613                  *
00614P 0262 4D         ABSAEX   TSTA              IS A, B (EXTENDED) NEGATIVE?
00615P 0263 2A 0F 0274          BPL     AEXIT     EXIT IF NOT
00616P 0265 43         NEGAEX   COMA              PREPARE TO
00617P 0266 53                  COMB              ... NEGATE
00618P 0267 DF 08    A          STX     SCRTCH+8  SAVE INDEX
00619P 0269 CE 0000  A          LDX     #SCRTCH   POINT TO LSB'S
00620P 026C 8D 0B 0279          BSR     NEGX      NEGATE THEM
00621P 026E DE 08    A          LDX     SCRTCH+8  RESTORE INDEX
00622P 0270 C9 00    A          ADCB    #0        PROPAGE
00623P 0272 89 00    A          ADCA    #0        ... CARRY
00624P 0274 39         AEXIT    RTS               EXIT ABSEX, NEGEX
00625                  *
00626P 0275 6D 00    A ABSX     TST     X
00627P 0277 2A 0E 0287          BPL     AXEXIT    EXIT IF (X) POSITIVE
00628P 0279 36         NEGX     PSHA
00629P 027A 37                  PSHB              SAVE A AND B
00630P 027B A6 00    A          LDAA    X
00631P 027D E6 01    A          LDAB    1,X       GET (X),(X+1)
00632P 027F 8D DA 025B          BSR     NEGAB     NEGATE (X),(X+1)
00633P 0281 E7 01    A          STAB    1,X
00634P 0283 A7 00    A          STAA    X         SAVE (X),(X+1)
00635P 0285 33         RESXIT   PULB
00636P 0286 32                  PULA              RESTORE A, B
00637P 0287 39         AXEXIT   RTS               EXIT
00638                  *
00639                  * LOCAL FLAG MANIPULATION ROUTINES
00640                  *
00641P 0288 37         SF1      PSHB              SAVE B
00642P 0289 BD 0034  P          JSR     SFLG1     SET FLAGS
```

```
00643P 028C 33                        PULB               RESTORE  B
00644P 028D 39                        RTS                EXIT
00645                     *
00646P 028E 37            CF1         PSHB
00647P 028F BD 003A  P                JSR     CFLG1      CLEAR FLAGS
00648P 0292 33                        PULB               RESTORE B
00649P 0293 39                        RTS                EXIT

00651                     *
00652                     * DIV16 - 16 BIT DIVIDE:
00653                     *     A,B _ A,B,SCRTCH,SCRTCH+1 / (X),(X+1).
00654                     *     ABSOLUTE VALUE OF REMAINDER IS LEFT IN
00655                     *     SCRTCH,SCRTCH+1.
00656                     *     V SET ON RETURN INDICATES DIVISOR = 0 OR 16
00657                     *     BIT OVERFLOW IN THE QUOTIENT. LOOP VARIABLES
00658                     *     ARE:
00659                     *          INDEX - LOOP COUNTER
00660                     *          A,B,SCRTCH,SCRTCH+1 - DIVIDEND
00661                     *          SCRTCH+2,SCRTCH+3 - DIVISOR
00662                     *          SCRTCH+4,SCRTCH+5 - QUOTIENT
00663                     *
00664P 0294 8D A5 023B DIV16 BSR      FIXNEG     SET RESULT SIGN
00665P 0296 8D CA 0262       BSR      ABSAEX     MAKE DIVIDEND POSITIVE
00666P 0298 36               PSHA
00667P 0299 37               PSHB
00668P 029A A6 00     A      LDAA     X          GET DIVISOR MSB
00669P 029C 27 42 02E0       BEQ      TEST0      TEST FOR ERROR IF 0
00670P 029E E6 01     A      LDAB     1,X        GET DIVISOR LSB
00671P 02A0 8D B6 0258 DSROK BSR      ABSAB      MAKE DIVISOR POSITIVE
00672P 02A2 97 02     A      STAA     SCRTCH+2 SAVE
00673P 02A4 D7 03     A      STAB     SCRTCH+3 ... DIVISOR
00674P 02A6 CE 0011   A      LDX      #17        INITIALIZE LOOP COUNTER
00675P 02A9 33               PULB                RESTORE
00676P 02AA 32               PULA                ... DIVIDEND
00677P 02AB 20 11 02BE       BRA      D16ST      ENTER DIVISION LOOP
00678                     *
00679                     * COMPUTATION LOOP
00680                     *
00681P 02AD D0 03     A D16LP SUBB    SCRTCH+3 SUBTRACT DIVISOR
00682P 02AF 92 02     A       SBCA    SCRTCH+2 ... FROM DIVIDEND
00683P 02B1 2A 05 02B8        BPL     DSHIFT     BRANCH IF NO "BORROW"
00684P 02B3 DB 03     A       ADDB    SCRTCH+3 OTHERWISE RESTORE
00685P 02B5 99 02     A       ADCA    SCRTCH+2 ... DIVIDEND
00686P 02B7 0D                SEC                ... AND SET QBIT = "0"
00687P 02B8 79 0005   A DSHIFT ROL    SCRTCH+5 ADD QBIT
00688P 02BB 79 0004   A        ROL    SCRTCH+4 ... TO QUOTIENT
00689P 02BE 78 0001   A D16ST ASL     SCRTCH+1 SHIFT
00690P 02C1 79 0000   A       ROL     SCRTCH
00691P 02C4 59                ROLB
00692P 02C5 49                ROLA               ... DIVIDEND
00693P 02C6 25 1E 02E6        BCS     D16ERR     EXIT IF 16 BIT OVERFLOW
00694P 02C8 09                DEX                LAST LOOP?
00695P 02C9 26 E2 02AD        BNE     D16LP      LOOP AGAIN IF NOT

00697                     *
00698                     * SET SIGN AND EXIT
00699                     *
00700P 02CB 44                LSRA               CORRECT
00701P 02CC 56                RORB               ... REMAINDER
00702P 02CD 97 00     A       STAA    SCRTCH     SAVE
00703P 02CF D7 01     A       STAB    SCRTCH+1 ... REMAINDER
00704P 02D1 96 04     A       LDAA    SCRTCH+4 GET
00705P 02D3 D6 05     A       LDAB    SCRTCH+5 ... QUOTIENT
00706P 02D5 43                COMA               CORRECT IT
00707P 02D6 53                COMB
00708P 02D7 BD 0251  P        JSR     TSTNEG     NEGATIVE RESULT?
00709P 02DA 27 03 02DF        BEQ     D16XIT     EXIT IF POSITIVE RESULT
00710P 02DC BD 025B  P        JSR     NEGAB      MAKE QUOTIENT NEGATIVE
00711P 02DF 39       D16XIT RTS                  EXIT DIV16
00712                     *
00713                     * TEST FOR 0 DIVISOR AND EXIT IF ERROR
00714                     *
```

```
00715P 02E0 E6 01      A  TEST0  LDAB   1,X         GET DIVISOR LSB
00716P 02E2 26 BC 02A0            BNE    DSROK       REJOIN DIV16 IF NOT ZERO
00717P 02E4 31                    INS                RESTORE
00718P 02E5 31                    INS                ... STACK
00719P 02E6 0B            D16ERR SEV                 SET ERROR FLAG
00720P 02E7 39                    RTS                EXIT DIV16

00722                           *
00723                           * FMLT24 - A,B;TEMP _ A,B;TEMP * (X),(X+1);(X+2).
00724                           *    V SET ON RETURN INDICATES EXPONENT OVERFLOW
00725                           *       OR UNDERFLOW.
00726                           *
00727P 02E8 36            FMLT24 PSHA                SAVE MULTIPLICAND MSB
00728P 02E9 96 00      A          LDAA   TEMP        GET MULTIPLICAND EXP
00729P 02EB AB 02      A          ADDA   2,X         CALC PRODUCT EXPONENT
00730P 02ED 29 0C 02FB            BVS    FMLTER      ERR IF UNDFLO OR OVRFLO
00731P 02EF 4C                    INCA               (CONSEQUENCE
00732P 02F0 29 09 02FB            BVS    FMLTER      ... OF 2 SIGN BITS)
00733P 02F2 97 00      A          STAA   TEMP        SAVE PRODUCT EXPONENT
00734P 02F4 32                    PULA               RESTORE MPCAND MSB
00735P 02F5 BD 0206    P          JSR    MULT16      MULTIPLY FRACTIONS
00736P 02F8 7E 0364    P          JMP    NORM32      NORMALIZE, ROUND, EXIT
00737                           *
00738P 02FB 39            FMLTER RTS                 ERROR EXIT

00740                           *
00741                           * FDIV24 - A,B;TEMP _ A,B;TEMP / (X),(X+1);(X+2).
00742                           *    V SET ON RETURN INDICATES (X),(X+1) = 0
00743                           *       (ZERO DIVISOR), EXPONENT OVERFLOW,
00744                           *       OR EXPONENT UNDERFLOW.
00745                           *    INPUTS ASSUMED TO BE NORMALIZED.
00746                           *
00747P 02FC 7F 0000    A  FDIV24 CLR    SCRTCH      INITIALIZE
00748P 02FF 7F 0001    A          CLR    SCRTCH+1    ... DIVIDEND
00749P 0302 36                    PSHA               SAVE DIVIDEND MSB
00750P 0303 96 00      A          LDAA   TEMP        GET DIVIDEND EXP
00751P 0305 A0 02      A          SUBA   2,X         CALC QUOTIENT EXP
00752P 0307 29 23 032C            BVS    FDIVER      ERR IF UNDFLO OR OVRFLO
00753P 0309 97 00      A          STAA   TEMP        SAVE QUOTIENT EXP
00754P 030B 32                    PULA               RESTORE DIVIDEND MSB
00755                           *
00756                           * THE FOLLOWING IS TO ENSURE 16 BITS OF ACCURACY
00757                           *     IN THE QUOTIENT
00758                           *
00759P 030C BD 05C5    P          JSR    ACMP16      COMPARE A,B WITH (X),(X+1)
00760P 030F 2D 0A 031B            BLT    FD241       OK IF A,B < (X),(X+1)
00761P 0311 47                    ASRA               SHIFT RIGHT
00762P 0312 56                    RORB
00763P 0313 76 0000    A          ROR    SCRTCH      ... DIVIDEND FRACTION
00764P 0316 7C 0000    A          INC    TEMP        COMPENSATE EXPONENT
00765P 0319 29 11 032C            BVS    FDIVER      ERROR IF OVERFLOW
00766                           *
00767P 031B 47            FD241  ASRA               SHIFT TO
00768P 031C 56                    RORB               ... ENSURE A
00769P 031D 76 0000    A          ROR    SCRTCH      ... NORMALIZED RESULT
00770                           *
00771P 0320 BD 0294    P          JSR    DIV16       DIVIDE FRACTIONS
00772P 0323 29 07 032C            BVS    FDIVER      EXIT IF ERROR
00773                           *
00774P 0325 4D                    TSTA               RESULT=0?
00775P 0326 26 03 032B            BNE    FD24XT      EXIT IF NOT
00776P 0328 7F 0000    A          CLR    TEMP        EXP _ 0 IF SO
00777                           *
00778P 032B 39            FD24XT RTS                 EXIT FDIV24
00779                           *
00780P 032C 0B            FDIVER SEV                 SET ERROR FLAG
00781P 032D 39                    RTS                EXIT
00782                           *
00783                           * NOTE THAT THE QUOTIENT FRACTION WILL EITHER
00784                           *    BE NORMALIZED OR EQUAL TO ZERO ON EXIT FROM
00785                           *    DIV16.
00786                           *
```

```
00788                    *
00789                    * FLPMLT - FLOATING POINT MULTIPLY - Y _ Y*X ON
00790                    *     PSTK AND DROP STACK.
00791                    *
00792P 032E 8D 23 0353  FLPMLT BSR    GETXY
00793P 0330 BD 02E8  P         JSR    FMLT24    MULTIPLY
00794P 0333 20 13 0348         BRA    ENDFLP    SAVE RESULT AND EXIT
00795                    *
00796                    * FLPDIV - FLOATING POINT DIVISION - Y _ Y/X ON
00797                    *     PSTK AND DROP STACK.
00798                    *
00799P 0335 8D 1C 0353  FLPDIV BSR    GETXY
00800P 0337 BD 02FC  P         JSR    FDIV24    DIVIDE
00801P 033A 20 0C 0348         BRA    ENDFLP    SAVE RESULT AND EXIT
00802                    *
00803                    * FLPADD - FLOATING POINT ADDITION - Y _ Y+X ON
00804                    *     PSTK AND DROP STACK.
00805                    *
00806P 033C 8D 15 0353  FLPADD BSR    GETXY
00807P 033E BD 03B2  P         JSR    FADD24    ADD
00808P 0341 20 05 0348         BRA    ENDFLP    SAVE RESULT AND EXIT
00809                    *
00810                    * FLPSUB - FLOATING POINT SUBTRACTION - Y _ Y-X
00811                    *     ON PSTK AND DROP STACK.
00812                    *
00813P 0343 8D 0E 0353  FLPSUB BSR    GETXY
00814P 0345 BD 03AF  P         JSR    FSUB24    SUBTRACT
00815                    *
00816                    * ENDFLP - Y _ A,B;TEMP AND DROP STACK.
00817                    *
00818P 0348 97 03     A  ENDFLP STAA   PSTK+3
00819P 034A D7 04     A         STAB   PSTK+4
00820P 034C D6 00     A         LDAB   TEMP
00821P 034E D7 05     A         STAB   PSTK+5    Y _ A,B;TEMP
00822P 0350 7E 04A7   P         JMP    DROP      DROP STACK AND EXIT
00823                    *
00824                    * GETXY - INDEX _ #PSTK (POINTER TO X)
00825                    *     A,B;TEMP _ Y.
00826                    *
00827P 0353 CE 0000   A  GETXY  LDX    #PSTK
00828P 0356 96 05     A         LDAA   PSTK+5
00829P 0358 97 00     A         STAA   TEMP
00830P 035A 96 03     A         LDAA   PSTK+3
00831P 035C D6 04     A         LDAB   PSTK+4
00832P 035E 39                  RTS

00834                    *
00835                    * NORMALIZE AND ROUND ROUTINES - NORMALIZES
00836                    *   A (EXTENDED);TEMP AND ROUNDS TO 16 TWOS
00837                    *     COMPLEMENT BITS.  INPUT IN 2'S COMPLEMENT.
00838                    *
00839P 035F CE 0000   A  NORM16 LDX    #0        CLEAR 16
00840P 0362 DF 00     A         STX    SCRTCH    ... LS BITS
00841P 0364 DE 00     A  NORM32 LDX    SCRTCH
00842P 0366 26 0C 0374         BNE    NRM2
00843P 0368 4D              NRM1  TSTA
00844P 0369 2B 3D 03A8        BMI    NRMNEG    BRANCH IF AEX < 0
00845P 036B 26 07 0374        BNE    NRM2
00846P 036D 5D                 TSTB
00847P 036E 26 04 0374        BNE    NRM2
00848P 0370 7F 0000   A  NRMZRO CLR    TEMP      EXP _ 0 IF FRAC=0
00849P 0373 39              NRMXIT RTS            NO ERROR EXIT
00850                    *
00851P 0374 78 0001   A  NRM2   ASL    SCRTCH+1  SCALE AEX
00852P 0377 79 0000   A         ROL    SCRTCH
00853P 037A 59                  ROLB
00854P 037B 49                  ROLA            ... LEFT
00855P 037C 29 06 0384         BVS    NRM3      CANCEL IF NORMALIZED
00856P 037E 7A 0000   A         DEC    TEMP      COMPENSATE EXPONENT
00857P 0381 28 F1 0374         BVC    NRM2      LOOP UNLESS UNDERFLOW
00858P 0383 39              NRMERR RTS            ERROR EXIT
00859                    *
```

```
00860P 0384 46           NRM3    RORA              RESTORE
00861P 0385 56                   RORB
0  52P 0386 76 0000  A           ROR     SCRTCH    ... AEX
00863P 0389 4D           ROUND   TSTA              AEX < 0 ?
00864P 038A 2B 12 039E           BMI     RNDNEG    ROUND AS NEGATIVE IF SO
00865P 038C 7D 0000  A   NRM4    TST     SCRTCH    NEED TO ROUND?
00866P 038F 2A E2 0373           BPL     NRMXIT    EXIT IF NOT
00867P 0391 CB 01    A           ADDB    #1        ROUND
00868P 0393 89 00    A           ADCA    #0        ... UP
00869P 0395 28 DC 0373           BVC     NRMXIT    EXIT IF NO OVERFLOW
00870P 0397 7C 0000  A           INC     TEMP      COMPENSATE EXPONENT
00871P 039A 28 E8 0384           BVC     NRM3      SCALE RIGHT AND ROUND AGAIN
00872P 039C 20 E5 0383           BRA     NRMERR    ERROR IF EXPONENT OVERFLOW
00873                    *
00874P 039E BD 0265  P   RNDNEG  JSR     NEGAEX    MAKE AEX POSITIVE
00875P 03A1 8D E9 038C           BSR     NRM4      ROUND AEX TO 16 BITS
00876P 03A3 29 DE 0383   NRNEGL  BVS     NRMERR    ERROR IF V SET
00877P 03A5 7E 025B  P           JMP     NEGAB     MAKE A,B NEG AND EXIT
00878                    *
00879P 03A8 BD 0265  P   NRMNEG  JSR     NEGAEX    MAKE AEX POSITIVE
00880P 03AB 8D C7 0374           BSR     NRM2      NORMALIZE
00881P 03AD 20 F4 03A3           BRA     NRNEGL    RE-NEGATE AND EXIT 00883
00884                    * FSUB24 AND FADD24 - FLOATING POINT SUBTRACTION
00885                    *    AND ADDITION ROUTINES.  A,B;TEMP _ A,B;TEMP -
00886                    *    (X),(X+1);(X+2) AND A,B;TEMP _ A,B;TEMP +
00887                    *    (X),(X+1);(X+2), RESPECTIVELY.  V SET ON
00888                    *    RETURN INDICATES EXPONENT OVERFLOW OR
00889                    *    UNDERFLOW.  INPUTS ASSUMED TO BE NORMALIZED.
00890                    *    EITHER MAY CHANGE (X),(X+1);(X+2).
00891                    *
00892P 03AF BD 0279  P   FSUB24  JSR     NEGX      NEGATE FOR SUBTRACTION
00893P 03B2 7F 0000  A   FADD24  CLR     SCRTCH    CLEAR FOR
00894P 03B5 7F 0001  A           CLR     SCRTCH+1  ... ROUNDING PURPOSES
00895P 03B8 97 00    A           STAA    TEMP2     SAVE MSB OF FRACTION
00896P 03BA A6 02    A           LDAA    2,X       GET EXPONENT
00897P 03BC 90 00    A           SUBA    TEMP      EXPONENTS EQUAL?
00898P 03BE 27 17 03D7           BEQ     DOADD     DO ADDITION IF SO
00899P 03C0 2A 04 03C6           BPL     FAS1      ALIGN IF ABS(ABT) < ABS(X)
00900P 03C2 8D 23 03E7           BSR     EXTX1     OTHERWISE EXCHANGE
00901P 03C4 20 EC 03B2           BRA     FADD24    ... AND START AGAIN
00902P 03C6 81 10    A   FAS1    CMPA    #16       IS ABT INSIGNIFICANT?
00903P 03C8 2C 35 03FF           BGE     GETABT    RES = (X),(X+1);(X+2) IF SO
00904                    *
00905                    * ALIGNMENT LOOP
00906                    *
00907P 03CA 77 0000  A   ALILP   ASR     TEMP2     ALIGN A,B;TEMP (ABT)
00908P 03CD 56                   RORB
00909P 03CE 76 0000  A           ROR     SCRTCH    SAVE MSBIT FOR ROUNDING
00910P 03D1 7C 0000  A           INC     TEMP
0  11P 03D4 4A                   DECA
00912P 03D5 26 F3 03CA           BNE     ALILP     ... WITH (X),(X+1);(X+2)
00913                    *
00914P 03D7 96 00    A   DOADD   LDAA    TEMP2     GET FRACTION MSB
00915P 03D9 EB 01    A   DOADD2  ADDB    1,X       ADD LSB'S
00916P 03DB A9 00    A           ADCA    X         ADD MSB'S
00917P 03DD 28 80 035F           BVC     NORM16    NORMALIZE IF NO OVERFLOW
00918P 03DF 7C 0000  A           INC     TEMP      BUMP EXPONENT
00919P 03E2 28 A0 0384           BVC     NRM3      NORMALIZE IF NO OVERFLOW
00920P 03E4 39           FASERR  RTS               FLP ADD OR SUBRACT ERROR 00922
00923                    * EXCATX - EXCHANGE A,B;TEMP WITH (X),(X+1);(X+2).
00924                    *
0  25P 03E5 97 00    A   EXCATX  STAA    TEMP2     SAVE OLD A
00926P 03E7 A6 01    A   EXTX1   LDAA    1,X       GET NEW B
00927P 03E9 E7 01    A           STAB    1,X       SAVE NEW (X+1)
00928P 03EB 16                   TAB               SAVE NEW B
00929P 03EC A6 00    A           LDAA    X         GET NEW A
00930P 03EE 36                   PSHA              PUSH TO STACK
```

```
00931P 03EF A6 02    A        LDAA   2,X         GET NEW TEMP
00932P 03F1 36                PSHA               PUSH TO STACK
00933P 03F2 96 00    A        LDAA   TEMP        GET NEW (X+2)
00934P 03F4 A7 02    A        STAA   2,X         SAVE NEW (X+2)
00935P 03F6 32                PULA               GET OLD (X+2)
00936P 03F7 97 00    A        STAA   TEMP        SAVE NEW TEMP
00937P 03F9 96 00    A        LDAA   TEMP2       GET OLD A
00938P 03FB A7 00    A        STAA   X           SAVE NEW (X)
00939P 03FD 32                PULA               GET NEW A
00940P 03FE 39                RTS                EXIT EXCATX
00941                *
00942                * GETABT - A,B;TEMP _ (X),(X+1),(X+2)
00943                *
00944P 03FF A6 02    A GETABT LDAA   2,X         GET TEMP
00945P 0401 97 00    A        STAA   TEMP        SAVE TEMP
00946P 0403 A6 00    A        LDAA   X           GET A
00947P 0405 E6 01    A        LDAB   1,X         GET B
00948P 0407 39                RTS                EXIT GETABT

00950                *
00951                * CNVBTD CONVERT BINARY TO DECIMAL - PUTS DECIMAL
00952                *   EQUIVALENT OF 1,B ON PROCESSOR STACK.  SIGN
00953                *   FIRST, THEN 5 DIGITS STARTING WITH THE MSD.
00954                *
00955P 0408 8D 2C 0436 CNVBTD BSR   SAVRET       TRET _ RETURN ADDRESS
00956P 040A 8D 39 0445        BSR   GSIGN        GET SIGN; A,B _ ABS(A,B)
00957P 040C 97 00    A        STAA  SCRTCH       SAVE A,B
00958P 040E D7 01    A        STAB  SCRTCH+1     ... FOR DIVISION
00959P 0410 86 05    A        LDAA  #5           LOOP COUNTER _ 5
00960P 0412 97 06    A        STAA  SCRTCH+6
00961P 0414 48                ASLA               DIVISOR _ 10
00962P 0415 97 08    A        STAA  SCRTCH+8
00963P 0417 7F 0007  A        CLR   SCRTCH+7
00964                *
00965P 041A CE 0007  A BTDLP  LDX   #SCRTCH+7    POINT TO DIVISOR
00966P 041D 4F                CLRA               INIT DIVIDEND
00967P 041E 5F                CLRB
00968P 041F BD 0294  P        JSR   DIV16        CALC DECIMAL DIGIT
00969P 0422 97 00    A        STAA  SCRTCH       MSB NEW DIVIDEND
00970P 0424 96 01    A        LDAA  SCRTCH+1     GET DECIMAL DIGIT
00971P 0426 36                PSHA               SAVE ON STACK
00972P 0427 D7 01    A        STAB  SCRTCH+1     SAVE LSB DIVIDEND
00973P 0429 7A 0006  A        DEC   SCRTCH+6     5 DIGITS DONE?
00974P 042C 26 EC 041A        BNE   BTDLP        LOOP TILL YES
00975                *
00976P 042E 96 00    A        LDAA  TEMP         GET SIGN
00977P 0430 36                PSHA               SAVE ON STACK
00978P 0431 FE 0000  A        LDX   TRET         GET RETURN ADDRESS
00979P 0434 6E 00    A        JMP   X            EXIT CNVBTD

00981                *
00982                * SAVRET - SAVES 2ND RETURN ADDRESS ON STACK IN
00983                *    TRET, CORRECTS STACK, AND JUMPS TO 1ST
00984                *    RETURN ADDRESS.
00985                *
00986P 0436 30                SAVRET TSX         POINT TO STACK
00987P 0437 EE 02    A        LDX   2,X          GET 2ND RET ADDR
00988P 0439 FF 0000  A        STX   TRET         ... AND SAVE IT
00989P 043C 30                TSX                POINT TO STACK
00990P 043D EE 00    A        LDX   X            GET 1ST RETURN ADDRESS
00991P 043F 31                INS                CORRECT
00992P 0440 31                INS
00993P 0441 31                INS
00994P 0442 31                INS                ... STACK
00995P 0443 6E 00    A        JMP   X            EXIT SAVRET
00996                *
00997                * GSIGN - TEMP _ SIGN(A,B)
00998                *    A,B _ ABS(A,B)
00999                *
01000P 0445 37                GSIGN  PSHB        SAVE B
01001P 0446 C6 19    A        LDAB  #25         GET "+"
01002P 0448 4D                TSTA
```

```
01003P 0449 2A 01 044C          BPL     GSLINK    BRANCH IF A,B >= 0
01004P 044B 5C                  INCB              GET "-"
01005P 044C D7 00     A GSLINK  STAB    TEMP      TEMP _ SIGN
01006P 044E 33                  PULB
01007P 044F 7E 0258   P         JMP     ABSAB     A,B _ ABS(A,B) AND EXIT

01009                         *
01010                         * DTOBDC - CONVERTS TOP LEVEL OF PSTK TO DECIMAL.
01011                         *     SAME OUTPUT AS DTOBTD.  PSTK UNAFFECTED.
01012                         *
01013P 0452 BD 04F6   P DTOBDC JSR     INTEGR    GET INTEGER INTO A,B.
01014                         *
01015                         * DTOBTD - DTO BINARY TO DECIMAL - LEAVES DECIMAL
01016                         *     EQUIVALENT OF A,B ON PROCESSOR STACK IN DTO
01017                         *     CHARACTER FORM AS 6 BYTES: SIGN,MSD,...,LSD.
01018                         *
01019P 0455 8D DF 0436 DTOBTD BSR     SAVRET
01020P 0457 FE 0000   A         LDX     TRET
01021P 045A DF 00     A         STX     TEMP5     SAVE RETURN ADDRESS
01022P 045C 8D AA 0408          BSR     CNVBTD    CONVERT A,B TO DECIMAL
01023P 045E 30                  TSX               POINT TO STACK
01024P 045F 86 06     A         LDAA    #6
01025P 0461 BD 018F   P         JSR     OFFX      X _ X+6
01026P 0464 DF 00     A         STX     TEMP      SAVE LOOP TERMINATOR
01027P 0466 30                  TSX               POINT TO STACK
01028                         *
01029P 0467 A6 00     A DBDCL   LDAA    X         GET CHARACTER
01030P 0469 26 04 046F          BNE     DBDC1     BRANCH IF NOT "0"
01031P 046B 86 0A     A         LDAA    #10
01032P 046D A7 00     A         STAA    X         CHAR _ DTO "0"
01033P 046F 08                DBDC1 INX           NEXT CHAR
01034P 0470 9C 00     A         CPX     TEMP
01035P 0472 26 F3 0467          BNE     DBDCL     LOOP TILL DONE
01036                         *
01037P 0474 DE 00     A         LDX     TEMP5     GET RETURN ADDRESS
01038P 0476 6E 00     A         JMP     X         EXIT DTOBTD,DTOBDC

01040                         *
01041                         * COMPXY - COMPARE X WITH Y AND RETURN TWOS
01042                         *     COMPLEMEMT FLAGS ACCORDING TO Y-X.
01043                         *     X AND Y ARE ASSUMED TO BE NORMALIZED.
01044                         *     PSTK UNAFFECTED.
01045                         *
01046P 0478 96 03     A COMPXY  LDAA    PSTK+3    ACCA _ MSB(YFRAC)
01047P 047A 16                  TAB
01048P 047B D8 00     A         EORB    PSTK      (SEE IF SIGNS ARE EQUAL)
01049P 047D 2A 09 0488          BPL     SIGNEQ    BRANCH: SIGN(X) = SIGN(Y)
01050P 047F 4D                  TSTA
01051P 0480 2A 03 0485          BPL     YGTX      BRANCH: Y>=0 AND X<0

01053P 0482 86 FF     A YLTX    LDAA    #-1       Z _ V _ 0; N _ 1
01054P 0484 39                  RTS               EXIT: Y < X 01056P 0485 86 01     A YGTX    LDAA    #1        Z _ V _ N _ 0
01057P 0487 39                  RTS               EXIT: Y > X

01059                         *
01060                         * SIGN(Y) = SIGN(X)
01061                         *
01062P 0488 DE 00     A SIGNEQ  LDX     PSTK      INDEX _ XFRAC
01063P 048A 26 04 0490          BNE     XNE0      BRANCH: X<>0
01064P 048C 4D                  TSTA
01065P 048D 26 F6 0485          BNE     YGTX      BRANCH: Y>0 AND X=0
01066P 048F 39                  RTS               EXIT: Y = X = 0

01068                         *
01069                         * X<>0 AND SIGN(Y) = SIGN(X)
01070                         *
01071P 0490 2B 0E 04A0 XNE0     BMI     XYLT0     BRANCH: X<0 AND Y<0
01072P 0492 4D                  TSTA
01073P 0493 27 ED 0482          BEQ     YLTX      BRANCH: Y=0 AND X>0

01075                         *
01076                         * Y>0 AND X>0
```

```
01077                        *
01078P 0495 D6 05    A          LDAB    PSTK+5
01079P 0497 D1 02    A          CMPB    PSTK+2   IF YEXP-XEXP <> 0 THEN
01080P 0499 26 0B 04A6          BNE     CMPXIT   ... EXIT: YEXP-XEXP GIVES RESULT 01082P 049B D6 04    A CFRACS   LDAB    PSTK+4
01083P 049D 7E 04DE  P          JMP     SUBIDX   EXIT: YFRAC-XFRAC GIVES RESULT

01085                        *
01086                        * X<0 AND Y<0
01087                        *
01088P 04A0 D6 02    A XYLT0    LDAB    PSTK+2
01089P 04A2 D1 05    A          CMPB    PSTK+5   IF XEXP-YEXP = 0 THEN
01090P 04A4 27 F5 049B          BEQ     CFRACS   ... BRANCH: YFRAC-XFRAC GIVES RES.

01092P 04A6 39             CMPXIT RTS             EXIT: EXPONENT DIFF. GIVES RESULT

01094                        *
01095                        * DROP - DROPS STACK ONE LEVEL.  X IS LEFT IN TOP
01096                        *    3 LOCATIONS OF SCRTCH (PSTK-3--PSTK-1).
01097                        *
01098P 04A7 36             DROP    PSHA              SAVE A
01099P 04A8 CE FFFD  A             LDX     #PSTK-3   POINT TO PSTK
01100P 04AB A6 03    A DROPLP LDAA    3,X       GET BYTE FROM PSTK
01101P 04AD A7 00    A             STAA    X         DROP DOWN ONE LEVEL
01102P 04AF 08                     INX               NEXT BYTE
01103P 04B0 8C FFFD  A             CPX     #PSTKTP-3 DONE?
01104P 04B3 26 F6 04AB             BNE     DROPLP    LOOP TILL YES
01105P 04B5 32                     PULA              RESTORE A
01106P 04B6 39                     RTS               EXIT DROP
01107                        *
01108                        * ENTER - ENTERS FLOATING POINT VARIABLE POINTED TO
01109                        *    BY THE INDEX ONTO PSTK.
01110                        *
01111P 04B7 A6 02    A ENTER    LDAA    2,X       GET EXPONENT
01112P 04B9 EE 00    A          LDX     X         GET FRACTION
01113P 04BB 20 00 04BD          BRA     ENTIMM    ENTER AND EXIT
01114                        *
01115                        * ENTIMM - ENTER IMMEDIATE - ENTERS FLOATING
01116                        *    POINT VARIABLE IN INDEX;A ONTO PSTK.
01117                        *
01118P 04BD B7 FFFF  A ENTIMM   STAA    PSTK-1    SAVE EXPONENT
01119P 04C0 FF FFFD  A          STX     PSTK-3    SAVE FRACTION
01120P 04C3 CE FFFC  A          LDX     #PSTKTP-4 POINT TO PSTK
01121P 04C6 A6 00    A ENTLP    LDAA    X         GET BYTE FROM STACK
01122P 04C8 A7 03    A          STAA    3,X       MOVE UP ONE LEVEL
01123P 04CA 09                  DEX               NEXT CHARACTER DOWN
01124P 04CB 8C FFFC  A          CPX     #PSTK-4   DONE?
01125P 04CE 26 F6 04C6          BNE     ENTLP     LOOP TILL YES
01126P 04D0 39                  RTS               EXIT ENTIMM

01128                        *
01129                        * BUMP - REENTERS X ONTO PSTK.
01130                        *
01131P 04D1 96 02    A BUMP     LDAA    PSTK+2    GET EXPONENT
01132P 04D3 DE 00    A          LDX     PSTK      GET FRACTION
01133P 04D5 20 E6 04BD          BRA     ENTIMM    ENTER AND EXIT
01134                        *
01135                        * CMPIDX - COMPARE A,B WITH INDEX.  2'S COMPLEMENT
01136                        *    COMPARISON FLAGS SET BY THE OPERATION:
01137                        *    A,B - INDEX.  NO REGISTERS CHANGED.
01138                        *    TEMP3 _ INDEX.
01139                        *
01140P 04D7 36             CMPIDX PSHA
01141P 04D8 37                  PSHB              SAVE A,B
01142P 04D9 8D 03 04DE          BSR     SUBIDX    SUBTRACT TO SET FLAGS
01143P 04DB 33                  PULB
01144P 04DC 32                  PULA              RESTORE A,B
01145P 04DD 39                  RTS               EXIT CMPIDX
01146                        *
01147                        * SUBIDX - A,B _ A,B - INDEX.  2'S COMPLEMENT
01148                        *    COMPARISON FLAGS SET.  TEMP3 _ INDEX.
```

```
01149                        *
01150P 04DE DF 00    A SUBIDX STX    TEMP3     SAVE INDEX
01151P 04E0 CE 0000  A        LDX    #TEMP3    POINT TO "INDEX"
01152P 04E3 BD 017A  P        JSR    SUB16     A,B _ A,B - "INDEX"
01153P 04E6 36                PSHA             RESTORE
01154P 04E7 07                TPA              ... INDEX
01155P 04E8 DE 00    A        LDX    TEMP3     ... WITHOUT
01156P 04EA 06                TAP              ... KILLING
01157P 04EB 32                PULA             ... FLAGS
01158P 04EC 39                RTS              EXIT SUBIDX

01160                        ******************************************
01161                        *                                        *
01162                        * END OF DTOU3                           *
01163                        *                                        *
01164                        ******************************************

01166                        *
01167                        * ENTIDX - ENTER INDEX ONTO PSTK AS A 16 BIT
01168                        *    TWOS COMPLEMENT INTEGER.  TEMP3 _ INDEX.
01169                        *
01170P 04ED DF 00    A ENTIDX STX    TEMP3     SAVE VALUE TO BE ENTERED
01171P 04EF CE 0000  A        LDX    #TEMP3    POINT TO OLD INDEX
01172P 04F2 7E 0534  P        JMP    EINT15    ENTER OLD INDEX AND EXIT 01174P 04F5    00    A CRCUB  FCB    0         CRC SPACE

01176                        *
01177                        * INTEGR - A,B _ INTEGER(X ON PSTK).  ROUNDED
01178                        *    RESULT.  V SET INDICATES 16 BIT 2'S COMP
01179                        *    OVERFLOW.  A,B _ 0 IF EXPONENT(X) < -1.  PSTK
01180                        *    UNAFFECTED.
01181                        *
01182P 04F6 96 02    A INTEGR LDAA   PSTK+2    A _ EXP(X)
01183P 04F8 81 0F    A        CMPA   #15
01184P 04FA 2E 33 052F        BGT    TOOBIG    OVERFLOW IF A > 15
01185P 04FC 81 FF    A        CMPA   #$FF
01186P 04FE 2D 31 0531        BLT    NOINT     UNDERFLOW IF A < -1
01187P 0500 80 0F    A        SUBA   #15
01188P 0502 40                NEGA             A _ 15 - EXP(X)
01189P 0503 97 00    A        STAA   SCRTCH    SHIFT COUNTER
01190P 0505 BD 024A  P        JSR    CLRNEG    NEGRES _ 0
01191P 0508 D6 01    A        LDAB   PSTK+1
01192P 050A 96 00    A        LDAA   PSTK      A,B _ FRAC(X)
01193P 050C 2A 06 0514        BPL    INT0      BRANCH IF A,B > 0
01194                        *
01195P 050E BD 0243  P        JSR    SETNEG    NEGRES _ 1
01196P 0511 BD 025B  P        JSR    NEGAB     A,B _ ABS(A,B)
01197                        *
01198P 0514 7D 0000  A INT0   TST    SCRTCH    DO WE NEED TO ADJUST?
01199P 0517 27 0D 0526        BEQ    INT1      IF NOT...BRANCH
01200                        *
01201P 0519 47                INTLP  ASRA
01202P 051A 56                       RORB               A,B _ A,B/2
01203P 051B 7A 0000  A        DEC    SCRTCH
01204P 051E 26 F9 0519        BNE    INTLP     LOOP 15 - EXP(X) TIMES
01205                        *
01206P 0520 24 04 0526        BCC    INT1
01207P 0522 CB 01    A        ADDB   #1        ROUND UP IF LAST
01208P 0524 89 00    A        ADCA   #0        ... LSBIT = 1
01209P 0526 BD 0251  P INT1   JSR    TSTNEG
01210P 0529 27 03 052E        BEQ    INTXIT    A,B _ -A,B IF
01211P 052B BD 025B  P        JSR    NEGAB     ... NEGRES = 1
01212P 052E 39                INTXIT RTS                EXIT
01213                        *
01214P 052F 0B                TOOBIG SEV                OVERFLOW FLAG
01215P 0530 39                       RTS                EXIT
01216                        *
01217P 0531 4F                NOINT  CLRA
01218P 0532 5F                       CLRB               A,B _ 0 (UNDERFLOW)
01219P 0533 39                       RTS                EXIT
```

```
01221                       *
01222                       * EINT15 - (X),(X+1) ENTERED ONTO PSTK
01223                       *
01224P 0534 A6 00    A EINT15 LDAA    X
01225P 0536 E6 01    A        LDAB    1,X         A,B _ (X),(X+1)
01226P 0538 20 0B 0545        BRA     ENTINT      ENTER AND EXIT
01227                       *
01228                       * EINT8 - (X) ENTERED ONTO PSTK
01229                       *
01230P 053A E6 00    A EINT8  LDAB    X
01231P 053C 4F                CLRA                A,B _ (X) (INT8)
01232P 053D 20 06 0545        BRA     ENTINT      ENTER AND EXIT
01233                       *
01234                       * EINT7 - (X) ENTERED ONTO PSTK
01235                       *
01236P 053F 4F         EINT7  CLRA                MSB _ 0
01237P 0540 E6 00    A        LDAB    X           GET INT7
01238P 0542 2A 01 0545        BPL     ENTINT      ENTER IF POSITIVE
01239P 0544 43                COMA                CORRECT MSB IF NEGATIVE
01240                       *
01241                       * ENTINT - INT15 IN A,B ENTERED ONTO PSTK
01242                       *
01243P 0545 36         ENTINT PSHA                SAVE A
01244P 0546 86 0F    A        LDAA    #15         GET INITIAL EXPONENT
01245P 0548 97 00    A        STAA    TEMP        SAVE IT
01246P 054A 32                PULA                RESTORE A
01247P 054B BD 035F  P        JSR     NORM16      NORMALIZE A,B; TEMP
01248P 054E 97 00    A        STAA    TEMP2
01249P 0550 D7 01    A        STAB    TEMP2+1
01250P 0552 DE 00    A        LDX     TEMP2       INDEX _ A,B
01251P 0554 96 00    A        LDAA    TEMP        A _ EXPONENT
01252P 0556 7E 048D  P        JMP     ENTIMM      ENTER INDEX; A AND EXIT

01254                       *
01255                       * SINT15 - (X),(X+1) _ INTEGER PART OF X ON PSTK
01256                       *
01257P 0559 BD 04F6  P SINT15 JSR     INTEGR      A,B _ INT(X)
01258P 055C A7 00    A        STAA    X
01259P 055E E7 01    A        STAB    1,X         (X),(X+1) _ A,B
01260P 0560 39                RTS                 EXIT SINT15
01261                       *
01262                       * SINT8 AND SINT7 - (X) _ INTEGER(X ON PSTK)
01263                       *
01264             0561 P SINT7 EQU    *
01265P 0561 BD 04F6  P SINT8  JSR     INTEGR      B _ INT(X)
01266P 0564 E7 00    A        STAB    X           (X) _ B
01267P 0566 39                RTS                 EXIT SINT8, SINT7

01269                       *
01270                       * MULT8 A,B _ A * B.  TWOS COMP NOTATION.
01271                       *
01272P 0567 CE 0006  A MULT8  LDX     #SCRTCH+6   FUTURE MULTIPLIER LOCATION
01273P 056A 6F 00    A        CLR     X           MSB OF MULTIPLIER _ 0
01274P 056C A7 01    A        STAA    1,X         MULTIPLIER _ A
01275P 056E 2A 02 0572        BPL     MULT8A
01276P 0570 63 00    A        COM     X           CORRECT MSB IF NEGATIVE
01277                       *
01278P 0572 4F         MULT8A CLRA
01279P 0573 5D                TSTB
01280P 0574 2A 01 0577        BPL     MULT8B
01281P 0576 43                COMA                INITIALIZE MULTIPLICAND
01282                       *
01283P 0577 BD 0206  P MULT8B JSR     MULT16      MULTIPLY
01284P 057A D6 01    A        LDAB    SCRTCH+1
01285P 057C 96 00    A        LDAA    SCRTCH      A,B _ A * B
01286P 057E 39                RTS                 EXIT MULT8

01288
01289                       *
01290                       * EXCH16 - A,B IS EXCHANGED WITH (X),(X+1).  FLAGS
01291                       *     UNAFFECTED.
                            *
```

```
01292P 057F 36        EXCH16 PSHA              (SAVE A)
01293P 0580 07               TPA
01294P 0581 97 00   A        STAA   TEMP       TEMP _ FLAGS
01295P 0583 A6 01   A        LDAA   1,X
0 96P 0585 97 00    A        STAA   TEMP2      TEMP2 _ (X+1)
01297P 0587 A6 00   A        LDAA   X          A _ (X)
01298P 0589 E7 01   A        STAB   1,X        (X+1) _ B
01299P 058B 33               PULB              (GET OLD A)
01300P 058C E7 00   A        STAB   X          (X) _ OLD A
01301P 058E D6 00   A        LDAB   TEMP2      B _ TEMP2
01302P 0590 36               PSHA
01303P 0591 96 00   A        LDAA   TEMP
01304P 0593 06               TAP               FLAGS _ TEMP
01305P 0594 32               PULA
01306P 0595 39               RTS               EXIT EXCH16

01308                 *
01309                 * CMPPV2 2'S COMPLEMENT FLAGS SET BY THE COMPARISON
01310                 *       A;B - (X);(X+1).  (PV2 VARIABLES).  THE SUB-
01311                 *       TRACTION IS NOT ACTUALLY PERFORMED.
01312                 *
01313P 0596 6D 00   A CMPPV2 TST    X
01314P 0598 2B 0A 05A4       BMI    CPV2A      BRANCH IF (X);(X+1) < 0
01315P 059A 4D               TSTA              A;B < (X);(X+1)
01316P 059B 2B 10 05AD       BMI    CMPLT      ... IF A;B < 0
01317P 059D E1 01   A DOCPV2 CMPB   1,X
01318P 059F 26 02 05A3       BNE    CPV2XT     EXIT IF B <> (X+1)
01319P 05A1 A1 00   A        CMPA   X          COMPARE COEFFICIENTS
01320P 05A3 39        CPV2XT RTS               EXIT CMPPV2
01321                 *
01322P 05A4 4D        CPV2A  TSTA              BRANCH IF
01323P 05A5 2B 0B 05B2       BMI    CP2NEG     ... A;B < 0
01324                 *
01325P 05A7 36        CMPGT  PSHA              (GREATER THAN)
01326P 05A8 86 01   A        LDAA   #1         N _ Z _ 0
01327P 05AA 0B               SEV               V _ 1
01328P 05AB 32               PULA
01329P 05AC 39               RTS               EXIT CMPGT
01330                 *
01331P 05AD 36        CMPLT  PSHA              (LESS THAN)
01332P 05AE 86 01   A        LDAA   #1         Z _ N _ V _ 0
01333P 05B0 32               PULA
01334P 05B1 39               RTS               EXIT CMPLT
01335                 *
0 36P 05B2 8D CB 057F CP2NEG BSR    EXCH16     EXCHANGE BECAUSE NEGATIVE
01337P 05B4 8D E7 059D       BSR    DOCPV2     COMPARE
01338P 05B6 20 C7 057F       BRA    EXCH16     EXCHANGE AND EXIT
01339                 *
01340                 * STOVAR - STORE VARIABLE - STORES X FROM PSTK IN
01341                 *       THE LOCATION POINTED TO BY THE INDEX.
01342                 *
01343P 05B8 96 00   A STOVAR LDAA   PSTK       A _ MSB FRACTION
01344P 05BA A7 00   A        STAA   X          (X) _ A
01345P 05BC 96 01   A        LDAA   PSTK+1     A _ LSB FRACTION
01346P 05BE A7 01   A        STAA   1,X        (X+1) _ A
01347P 05C0 96 02   A        LDAA   PSTK+2     A _ EXPONENT
01348P 05C2 A7 02   A        STAA   2,X        (X+2) _ A
01349P 05C4 39               RTS               EXIT STOVAR

01351                 *
01352                 * ACMP16 - ABSOLUTE VALUE 16 BIT COMPARE.
01353                 *       COMPARISON BY ABS(ACCA,ACCB) - ABS((X),(X+1)).
01354                 *       2'S COMPLEMENT FLAGS SET.  TEMP+1 DESTROYED.
01355                 *       ACCA, ACCB, (X), (X+1) UNCHANGED.
01356                 *
01357P 05C5 36        ACMP16 PSHA
01358P 05C6 37               PSHB              SAVE A AND B
01359P 05C7 97 01   A        STAA   TEMP+1
01360P 05C9 A6 00   A        LDAA   X
01361P 05CB 36               PSHA
01362P 05CC A6 01   A        LDAA   1,X
01363P 05CE 36               PSHA              SAVE (X),(X+1)
```

```
01364P 05CF 96 01     A              LDAA    TEMP+1
01365P 05D1 BD 0258   P              JSR     ABSAB
01366P 05D4 BD 0275   P              JSR     ABSX       MAKE POSITIVE
01367P 05D7 BD 0188   P              JSR     COMP16     COMPARE
01368P 05DA 07                       TPA                SAVE FLAGS
01369P 05DB 33                       PULB
01370P 05DC E7 01     A              STAB    1,X
01371P 05DE 33                       PULB
01372P 05DF E7 00     A              STAB    X          RESTORE (X),(X+1)
01373P 05E1 06                       TAP                RESTORE FLAGS
01374P 05E2 33                       PULB
01375P 05E3 32                       PULA               RESTORE ACCA, ACCB
01376P 05E4 39                       RTS                EXIT ACMP16
01377                        *
01378                        * ENTPV2 - ENTERS PV2 VARIABLE POINTED TO BY THE
01379                        *    INDEX ONTO PSTK.  INDEX UNCHANGED.
01380                        *
01381P 05E5 DF 00     A ENTPV2 STX   TMPIDX     SAVE VARIABLE POINTER
01382P 05E7 A6 01     A        LDAA  1,X        GET EXPONENT OF 10
01383P 05E9 BD 0124   P        JSR   EEXP10     ENTER ONTO PSTK
01384P 05EC DE 00     A        LDX   TMPIDX     POINT TO VARIABLE
01385P 05EE BD 053F   P        JSR   EINT7      ENTER COEFFICIENT
01386P 05F1 BD 032E   P        JSR   FLPMLT     MULTIPLY FOR RESULT
01387P 05F4 DE 00     A        LDX   TMPIDX     RESTORE INDEX
01388P 05F6 39                 RTS              EXIT ENTPV2

01390                        ***************************************
01391                        *                                     *
01392                        * END OF DTOU5                        *
01393                        *                                     *
01394                        ***************************************
01396                        *
01397                        * MDWMSG - AW _ MDW; MDW _ " "; EXECUTE BLOCK MOVE
01398                        *    DEFINED BY ACCA ON ENTRY.
01399                        * MDWM2 - SAME BUT WITHOUT AW _ MDW.
01400                        *
01401P 05F7 36               MDWMSG PSHA              SAVE BLOCK MOVE NUMBER
01402P 05F8 86 02     A             LDAA   #2
01403P 05FA BD 014B   P             JSR    DOMOVE     AW _ MDW
01404P 05FD 32                      PULA              RESTORE BLOCK MOVE NUMBER
01405                        *
01406P 05FE CE 0028   A MDWM2       LDX    #MDW+40
01407P 0601 DF 00     A             STX    TEMP
01408P 0603 CE 0004   A             LDX    #MDW+4
01409P 0606 BD 0000   P             JSR    CBLOCK     MDW _ " "
01410P 0609 7E 014B   P             JMP    DOMOVE     EXECUTE BLOCK MOVE AND EXIT

01412                        *
01413                        * TESTM2 - COMPARES M2 WITH M1 AND EXITS TWO LEVELS
01414                        *    OF SUBROUTINE IF NOT EQUAL.  ACCA DESTROYED.
01415                        *
01416P 060C 96 00     A TESTM2 LDAA  M2
01417P 060E 91 00     A        CMPA  M1
01418P 0610 27 02 0614         BEQ   TM2XIT    IF M2 <> M1
01419P 0612 31                 INS             ... THEN BUMP STACK
01420P 0613 31                 INS             ... BEFORE RETURN
01421P 0614 39        TM2XIT   RTS             EXIT TESTM2

01423                        *
01424                        * M2P10 - M2 _ M2 + 10.  ACCA DESTROYED.
01425                        *
```

```
01426P 0615 96 00      A M2P10    LDAA    M2
01427P 0617 8B 0A      A          ADDA    #10
01428P 0619 97 00      A          STAA    M2
01429P 061B 39                    RTS

01431                             END
TOTAL ERRORS 00000
```

```
 P 0261 AABXIT 00607 00612*
DP 0258 ABSAB  00024 00544 00549 00606*00671 01007 01365
 P 0262 ABSAEX 00614*00665
 P 0275 ABSX   00626*01366
 P 05C5 ACMP16 00759 01357*
 P 000C ADJLP  00058*00060
 P 000E ADJM1  00057 00059*
 P 0274 AEXIT  00615 00624*
 P 03CA ALILP  00907*00912
 P 0287 AXEXIT 00627 00637*
 R      BATDA  00011*00509
 P 041A BTDLP  00965*00974
DP 04D1 BUMP   00013 01131*
DP 0000 CBLOCK 00015 00046*00049 01409
 P 028E CF1    00594 00646*
DP 003A CFLG1  00015 00103*00647
DP 004B CFLG2  00021 00117*
DP 005C CFLG3  00025 00131*
DP 0068 CFLG4  00027 00141*
 P 049B CFRACS 01082*01090
DP 0040 CHFLG1 00023 00108*
 P 0051 CHFLG2 00122*
 P 0098 CHKER2 00179*00180
 P 0097 CHKERR 00178*00210
 P 00A9 CHKSR2 00158 00202*
 P 00AF CHKSR3 00164 00205*
 P 00B5 CHKSR4 00170 00208*
DP 002F CLITE1 00015 00087*
DP 0020 CLITE2 00015 00063 00075*
 P 024A CLRNEG 00580 00592*01190
 P 05A7 CMPGT  01325*
DP 04D7 CMPIDX 00021 01140*
 P 05AD CMPLT  01316 01331*
DP 0596 CMPPV2 00016 01313*
 P 04A6 CMPXIT 01080 01092*
 P 0408 CNVBTD 00955*01022
DP 0188 COMP16 00021 00390*01367
DP 0478 COMPXY 00025 01046*
 P 05B2 CP2NEG 01323 01336*
 P 05A4 CPV2A  01314 01322*
 P 05A3 CPV2XT 01318 01320*
DP 0205 CRCUA  00013 00518*
DP 04F5 CRCUB  00013 01174*
 P 02E6 D16ERR 00693 00719*
 P 02AD D16LP  00681*00695
 P 02BE D16ST  00677 00689*
 P 02DF D16XIT 00709 00711*
 P 046F DBDC1  01030 01033*
 P 0467 DBDCL  01029*01035
 P 00D1 DELAY  00022 00239*00248
DP 0294 DIV16  00022 00664*00771 00968
 P 014E DMVLP1 00340*00345
 P 0150 DMVLP2 00341*00343
 P 0257 DNAXIT 00602*
 P 03D7 DOADD  00898 00914*
 P 03D9 DOADD2 00915*
 P 059D DOCPV2 01317*01337
DP 014B DOMOVE 00016 00339*01403 01410
 P 01F3 DOPNT  00498 00501 00504*
DP 04A7 DROP   00025 00822 01098*
 P 04AB DROPLP 01100*01104
```

```
 P 02B8 DSHIFT 00683 00687*
 P 02A0 DSROK  00671*00716
DP 0452 DTOBDC 00016 01013*
DP 0455 DTOBTD 00020 01019*
 P 0149 E10ERR 00310 00312 00331*
DP 0124 EEXP10 00017 00219 00309*01383
DP 0534 EINT15 00017 01172 01224*
DP 053F EINT7  00020 01236*01385
DP 053A EINT8  00020 01230*
 P 0348 ENDFLP 00794 00801 00808 00818*
DP 04B7 ENTER  00017 01111*
DP 04ED ENTIDX 00014 01170*
DP 04BD ENTIMM 00017 00231 00327 01113 01118*01133 01252
DP 0545 ENTINT 00014 01226 01232 01238 01243*
 P 04C6 ENTLP  01121*01125
DP 05E5 ENTPV2 00023 01381*
 P 00E3 ETABLE 00259*00301
 P 0122 ETBLHI 00301*00320
 P 0123 ETBLLO 00302*00318
 P 03E5 EXCATX 00925*
   057F EXCH16 01292*01336 01338
 P 03E7 EXTX1  00900 00926*
 P 0037 F1LINK 00100*00106 00110
 P 0048 F2LINK 00114*00120 00124
 P 0059 F3LINK 00128*00134
 P 0065 F4LINK 00138*00144
 P 03B2 FADD24 00807 00893*00901
 P 03C6 FAS1   00899 00902*
 P 03E4 FASERR 00920*
 P 031B FD241  00760 00767*
 P 032B FD24XT 00775 00778*
 P 02FC FDIV24 00747*00800
 P 032C FDIVER 00752 00765 00772 00780*
DP 01CF FEWUNP 00022 00456*
 P 023B FIXNEG 00543 00580*00664
DP 033C FLPADD 00018 00232 00806*
DP 0335 FLPDIV 00024 00224 00799*
DP 032E FLPMLT 00018 00792*01386
DP 0343 FLPSUB 00018 00813*
 P 02E8 FMLT24 00727*00793
 P 02FB FMLTER 00730 00732 00738*
RB      FR1    00006*00099 00100 00105 00109 00599
RB      FR2    00006*00113 00114 00119 00123
RB      FR3    00006*00127 00128 00133
RB      FR4    00006*00137 00138 00143
 P 03AF FSUB24 00814 00892*
   0249 FXNXIT 00584 00590*
 P 00BD GET10  00218*00223
 P 02FF GETABT 00903 00944*
 P 0353 GETXY  00792 00799 00806 00813 00827*
 P 0445 GSIGN  00956 01000*
 P 044C GSLINK 01003 01005*
   0514 INT0   01193 01198*
   0526 INT1   01199 01206 01209*
 P 04F6 INTEGR 01013 01182*01257 01265
 P 0519 INTLP  01201*01204
 P 052E INTXIT 01210 01212*
 P 0027 L1LINK 00081*00089
 P 001A L2LINK 00071*00077
RB      LITE1  00006*00080 00081 00089
RB      LITE2  00006*00070 00071 00076
R       LR1    00010*00083
R       LR2    00010*00072
RB      M1     00007*00056 01417
 P 021D M16LP  00558*00568
 P 023A M16XIT 00573 00575*
RB      M2     00007*01416 01426 01428
DP 0615 M2P10  00026 01426*
R       MDW    00010*01406 01408
DP 05FE MDWM2  00026 01406*
DP 05F7 MDWMSG 00026 01401*
```

```
 P  00D6  MINORL  00242*00244
DP  0167  MOVBLK  00018 00362*00371
R         MPTBL   00011*00339
 P  0229  MSHIFT  00560 00563*
DP  0206  MULT16  00022 00543*00735 01283
DP  0567  MULT8   00022 01272*
 P  0572  MULT8A  01275 01278*
    3577  MULT8B  01280 01283*
 P  025B  NEGAB   00608*00632 00710 00877 01196 01211
 P  0265  NEGAEX  00574 00616*00874 00879
R         NEGRES  00010*00587 00593 00600
 P  0279  NEGX    00620 00628*00892
DP  01B7  NHV     00025 00434*
 P  01C3  NHV1    00436 00441*
 P  01CB  NHV2    00442 00446*
 P  01B4  NLHVXT  00419 00424 00428*00439 00444 00448
DP  019F  NLV     00025 00414*
 P  01AB  NLV1    00416 00421*
 P  01B2  NLV2    00422 00426*
 P  0521  NOINT   01186 01217*
 P  035F  NORM16  00839*00917 01247
 P  0364  NORM32  00736 00841*
 P  0368  NRM1    00843*
 P  0374  NRM2    00842 00845 00847 00851*00857 00880
 P  0384  NRM3    00855 00860*00871 00919
 P  038C  NRM4    00865*00875
 P  0383  NRMERR  00858*00872 00876
 P  03A8  NRMNEG  00844 00879*
 P  0373  NRMXIT  00849*00866 00869
 P  0370  NRMZRO  00848*
 P  03A3  NRNEGL  00876*00881
DP  018F  OFFX    00015 00401*00510 01025
 P  019B  OFFX1   00405 00407*
    0201  PATERR  00491 00493 00515*
 P  01F2  PNTAT1  00499 00502*
DP  01DF  PNTATT  00016 00490*
RB        PSTK    00007*00818 00819 00821 00827 00828 00830 00831 01046 01048
                  01062 01078 01079 01082 01088 01089 01099 01118 01119 01124
                  01131 01132 01182 01191 01192 01343 01345 01347
RP        PSTKTP  00007*01103 01120
    00C7  R10     00019 00229*
DP  006E  READSR  00020 00153*
 P  0285  RESXIT  00635*
 P  039E  RNDNEG  00864 00874*
 P  0389  ROUND   00863*
 P  0185  S16L    00384 00386*
DP  01D8  SABL3X  00023 00467*
 P  0436  SAVRET  00955 00986*01019
RB        SCRTCH  00007*00545 00546 00550 00551 00558 00559 00561 00562 00565
                  00566 00618 00619 00621 00672 00673 00681 00682 00684 00685
                  00687 00688 00689 00690 00702 00703 00704 00705 00747 00748
                  00763 00769 00840 00841 00851 00852 00862 00865 00893 00894
                  00909 00957 00958 00960 00962 00963 00965 00969 00970 00972
                  00973 01189 01198 01203 01272 01284 01285
DP  0008  SETM1   00016 00056*
 P  0243  SETNEG  00586*01195
 P  0288  SF1     00588 00641*
DP  0034  SFLG1   00021 00098*00642
DP  0045  SFLG2   00023 00112*
DP  0056  SFLG3   00025 00126*
DP  0062  SFLG4   00027 00136*
 P  0488  SIGNEQ  01049 01062*
DP  0559  SINT15  00024 01257*
DP  0561  SINT7   00014 01264*
DP  0561  SINT8   00014 01265*
DP  0025  SLITE1  00019 00080*
DP  0018  SLITE2  00019 00070*
R         SR1     00010*00155
R         SR2     00010*00161 00202
R         SR3     00010*00167 00205
R         SR4     00010*00173 00208
```

| | | | | | | | | | |
|---|---|---|---|---|---|---|---|---|---|
| P | 00BB | SRERR | 00176 | 00181 | 00204 | 00207 | 00212* | | |
| P | 009D | SRLOOP | 00186*00188 | | | | | | |
| DP | 05B8 | STOVAR | 00019 | 01343* | | | | | |
| DP | 017A | SUB16 | 00023 | 00379*00392 | 01152 | | | | |
| DP | 04DE | SUBIDX | 00024 | 01083 | 01142 | 01150* | | | |
| RB | | TEMP | 00008*00048 | 00154 | 00160 | 00166 | 00172 | 00190 | 00239 | 00246 | 00319 |
| | | | 00322 | 00324 | 00348 | 00364 | 00367 | 00728 | 00733 | 00750 | 00753 | 00764 |
| | | | 00776 | 00820 | 00829 | 00848 | 00856 | 00870 | 00897 | 00910 | 00918 | 00933 |
| | | | 00936 | 00945 | 00976 | 01005 | 01026 | 01034 | 01245 | 01251 | 01294 | 01303 |
| | | | 01359 | 01364 | 01407 | | | | | | |
| RB | | TEMP2 | 00008*00323 | 00328 | 00351 | 00370 | 00895 | 00907 | 00914 | 00925 | 00937 |
| | | | 01248 | 01249 | 01250 | 01296 | 01301 | | | | |
| RB | | TEMP3 | 00008*00346 | 00349 | 00352 | 00363 | 00368 | 00402 | 00403 | 00404 | 00406 |
| | | | 00407 | 01150 | 01151 | 01155 | 01170 | 01171 | | | |
| RB | | TEMP5 | 00008*01021 | 01037 | | | | | | |
| P | 02E0 | TEST0 | 00669 | 00715* | | | | | | |
| DP | 060C | TESTM2 | 00026 | 01416* | | | | | | |
| P | 0614 | TM2XIT | 01418 | 01421* | | | | | | |
| RB | | TMPIDX | 00008*01381 | 01384 | 01387 | | | | | |
| P | 052F | TOOBIG | 01184 | 01214* | | | | | | |
| R | | TRET | 00011*00978 | 00988 | 01020 | | | | | |
| P | 0251 | TSTNEG | 00572 | 00598*00708 | 01209 | | | | | |
| DP | 00C2 | XDIV10 | 00019 | 00223* | | | | | | |
| P | 0490 | XNE0 | 01063 | 01071* | | | | | | |
| P | 04A0 | XYLT0 | 01071 | 01088* | | | | | | |
| P | 0485 | YGTX | 01051 | 01056*01065 | | | | | | |
| | 0482 | YLTX | 01053*01073 | | | | | | | |

I claim:

1. A method of digitizing a repetitive analog signal, comprising the steps of:
    (a) establishing a first reference voltage level and selecting a first occurrence of said analog signal,
    (b) comparing the signal level of said occurrence of said analog signal with said reference voltage level,
    (c) developing at each of a plurality of instants during said occurrence of the analog signal a separate digital bit whose state is a function of the relative magnitudes of the reference voltage and the analog signal at each such instant,
    (d) storing said digital bits, and
    (e) repeating the steps (b) through (d) on each of a plurality of subsequent occurrences of the analog signal with a different reference voltage level during each occurrence, whereby all reference voltage levels of interest within the voltage range of the analog signal are covered.

2. The method of claim 1 wherein step (e) includes the additional step of responding to a trigger signal to halt the generation of said digital bits, whereby the storage thereof also stops.

3. The method according to claim 1 wherein step (d) includes storing the bits in a high speed memory, and wherein the method that comprises the additional step of (f) processing the bits of a high speed memory between occurrences of the analog signal and storing the processed bits of the analog signal occurrence just completed in another memory, whereby said high speed memory can be used for storing the digital bits representative of another analog signal occurrence.

4. The method according to claim 3 which comprises the additional step of (g) displaying the processed digital bits within said another memory to show the waveform of the analog signal at a time after a sufficient number of the occurrences of the analog signal have been digitized.

5. A method of digitizing a repetitive analog signal, comprising the steps of:
    (a) establishing a first reference voltage window having an extent that is a small fraction of the voltage extent of interest of said analog signal, and selecting a first occurrence of said analog signal,
    (b) comparing the voltage level of said occurrence of said analog signal with said reference voltage window,
    (c) developing for each of a plurality of time intervals during said occurrence a separate digital bit whose state depends upon whether the analog signal is within the window at any time during the time interval,
    (d) storing said bits in a memory, and
    (e) repeating steps (b) through (d) on a plurality of subsequent occurrences of the analog signal with different and distinct reference voltage windows until the analog signal range has been scanned.

6. The method according to claim 5 which comprises the additional step of (f) displaying a waveform of the analog signal by modulating the intensity of a raster scan display device with the value of the bits stored in memory.

7. A system for digitizing an analog signal that has a plurality of successive occurrences which are substantially identical, comprising:
    means for establishing a reference voltage which steps through a succession of levels covering a range of the analog signal and remains at each level for at least the duration of an analog signal occurrence,
    means for comparing each such reference voltage level with a distinct occurrence of the analog signal,
    means receiving the results of said comparing means for developing a plurality of digital bits at a plurality of instants of time during each such signal occurrence, each of said bits reflecting whether the analog signal is above or below said reference at the instant of time at which the bit is generated, and
    means receiving said bits for storing them in a digital memory, whereby a digital representation of said analog signal exists and may be utilized.

8. The system according to claim 7 wherein said memory means includes:
- a high speed memory which receives all bits for one occurrence as the bits are generated by said bit developing means,
- a random access memory having a capacity much greater than said high speed memory, and
- means for moving bits from said high speed memory to said random access memory between said distinct occurrences of the analog signal which are sampled, said random access memory holding all of the digital bits developed from a given analog signal.

9. The system according to claim 8 wherein said bit moving means includes means for loading said random access memory in a manner that the bits can be read out sequentially to form a visual display on a raster scan device.

10. The system according to claim 8 which additionally comprises:
- a raster scan display device, and
- means responsive to the digital bits stored within said random access memory for driving said raster scan display device in a manner to display an analog representation of said analog signal.

11. The system according to claim 7 wherein said reference voltage establishing means includes a programmed microprocessor.

12. A system for digitizing an analog signal that has a plurality of successively occurring cycles which are substantially identical, comprising:
- means for establishing two reference voltages separated by a window voltage which are stepped through a succession of levels covering a range of the analog signal and remain at each level for at least the duration of an analog signal occurrence,
- means for comparing each such reference voltage window with a distinct occurrence of the analog signal, and
- means receiving the results of said comparison means for developing a digital bit for each of a plurality of time intervals during each distinct occurrence, each of said bits reflecting whether the analog signal is within the reference voltage window at any time during the time interval.

13. The system according to claim 12 which additionally comprises:
- a high speed memory connected to receive digital bits for one occurrence as they are generated by said digital bit developing means,
- a random access memory, and
- means for moving said bits from said high speed memory to said random access memory at a time between said distinct occurrences of said analog signal.

* * * * *